United States Patent
Aldhaher et al.

(10) Patent No.: US 10,644,613 B2
(45) Date of Patent: May 5, 2020

(54) INVERTER FOR INDUCTIVE POWER TRANSFER

(71) Applicant: Drayson Technologies (Europe) Limited, Oxfordshire (GB)

(72) Inventors: Samer Aldhaher, Greater London (GB); Manuel Pinuela Rangel, Greater London (GB); Paul David Mitcheson, Greater London (GB); David Christopher Yates, Greater London (GB)

(73) Assignee: DRAYSON TECHNOLOGIES (EUROPE) LIMITED, London (GB)

( * ) Notice: Subject to any disclaimer, the term of this patent is extended or adjusted under 35 U.S.C. 154(b) by 333 days.

(21) Appl. No.: 15/548,172

(22) PCT Filed: Feb. 2, 2016

(86) PCT No.: PCT/EP2016/052154
§ 371 (c)(1),
(2) Date: Aug. 2, 2017

(87) PCT Pub. No.: WO2016/124577
PCT Pub. Date: Aug. 11, 2016

(65) Prior Publication Data
US 2018/0034383 A1  Feb. 1, 2018

(30) Foreign Application Priority Data

Feb. 2, 2015 (GB) .................................. 1501733.8

(51) Int. Cl.
*H02M 7/537* (2006.01)
*H02J 50/12* (2016.01)
(Continued)

(52) U.S. Cl.
CPC ............. *H02M 7/537* (2013.01); *H02J 50/12* (2016.02); *H03F 3/2171* (2013.01);
(Continued)

(58) Field of Classification Search
CPC .......... H02M 7/537–5395; H03F 3/217–2178; H02J 7/025; H02J 5/005; H02J 17/00; H04B 5/0037; B60L 53/12–126
See application file for complete search history.

(56) References Cited

U.S. PATENT DOCUMENTS

| | | | |
|---|---|---|---|
| 2007/0171680 A1* | 7/2007 | Perreault | H02M 1/34 363/16 |
| 2007/0252441 A1* | 11/2007 | Yamauchi | H02J 5/005 307/104 |

(Continued)

FOREIGN PATENT DOCUMENTS

| | | |
|---|---|---|
| GB | 2505278 A | 2/2014 |
| WO | 2007/082090 A2 | 7/2007 |
| WO | 2013014521 A | 1/2013 |

OTHER PUBLICATIONS

J. Choi, W. Liang, L. Raymond, J. Rivas, "A high-frequency resonant converter based on the class phi2 inverter for wireless power transfer", May 21, 2014, IEEE, 2014 IEEE 79th vehicular technology conference. (Year: 2014).*

(Continued)

*Primary Examiner* — Rexford N Barnie
*Assistant Examiner* — David A Shiao
(74) *Attorney, Agent, or Firm* — Tarolli, Sundheim, Covell & Tummino LLP

(57) ABSTRACT

An inverter for inductive power transfer is disclosed. The inverter comprises a first inductor and a switching element in series between power supply terminals, the switching element being operable to be switched at a first frequency; a first capacitance in parallel with the switching element (Continued)

between the first inductor and a power supply terminal; a first tank circuit in parallel with the first capacitance, the first tank circuit comprising a second inductor and a second capacitance, wherein the second capacitance is arranged in series with the second inductor; a second tank circuit in parallel with the first capacitance; and a third capacitance in series with the first inductor between the first tank circuit and the second tank circuit, wherein the second tank circuit comprises a transmitter coil and a fourth capacitance, the fourth capacitance being arranged in parallel or series with the transmitter coil; wherein the fourth capacitance is selected such that the resonant frequency of the second tank circuit is not equal to the first frequency, and wherein the second inductor and the second capacitance are selected such that the resonant frequency of the first tank circuit is an integer multiple, greater than one, of the first frequency.

20 Claims, 68 Drawing Sheets

(51) Int. Cl.
    *H03F 3/217* (2006.01)
    *H02M 7/48* (2007.01)
    *H02M 3/335* (2006.01)
    *H02M 1/00* (2006.01)

(52) U.S. Cl.
    CPC .......... *H03F 3/2176* (2013.01); *H02M 3/335* (2013.01); *H02M 2001/0058* (2013.01); *H02M 2007/4815* (2013.01); *H03F 2200/171* (2013.01); *H03F 2200/267* (2013.01); *H03F 2200/391* (2013.01); *H03F 2203/21157* (2013.01); *Y02B 70/1433* (2013.01); *Y02B 70/1441* (2013.01); *Y02B 70/1491* (2013.01)

(56) References Cited

U.S. PATENT DOCUMENTS

| | | | | |
|---|---|---|---|---|
| 2010/0184371 | A1* | 7/2010 | Cook | H02J 50/10 455/41.1 |
| 2013/0043951 | A1* | 2/2013 | Irish | H03F 1/523 330/285 |
| 2014/0175868 | A1 | 6/2014 | Sakakibara | |
| 2014/0225439 | A1* | 8/2014 | Mao | H02M 3/3376 307/31 |
| 2014/0368056 | A1* | 12/2014 | Hosotani | H02J 5/005 307/104 |
| 2015/0015081 | A1* | 1/2015 | Usami | H04B 5/0037 307/104 |
| 2015/0054349 | A1* | 2/2015 | Ishikuro | H02J 50/80 307/104 |
| 2015/0061579 | A1* | 3/2015 | Katsunaga | H03H 7/40 320/108 |
| 2015/0069855 | A1* | 3/2015 | De Rooij | H03F 1/565 307/104 |
| 2016/0056639 | A1* | 2/2016 | Mao | H02J 50/80 307/104 |
| 2016/0094046 | A1* | 3/2016 | Kato | H02J 50/12 307/104 |
| 2016/0164346 | A1* | 6/2016 | Zhang | H02J 50/12 307/104 |

OTHER PUBLICATIONS

T. Sowlati, C.A.T. Salama, J. Sitch, G. Rabjohn, D. Smith, "Low voltage, high efficiency GaAs class E power amplifiers for wireless transmitters", Oct. 1995, IEEE, IEEE Journal of solid-state circuits, vol. 30, Issue 10. (Year: 1995).*

M.K. Uddin, G. Ramasamy, S. Mekhilef, K. Ramar, Y. Lau, "A review on high frequency resonant inverter technologies for wireless power transfer using magnetic resonance coupling", Oct. 14, 2014, IEEE, 2014 IEEE conference on energy conversion. (Year: 2014).*

Z. Kaczmarczyk, "High-efficiency class E, EF2, and E/F3 inverters", Oct. 2, 2006, IEEE, IEEE transactions on industrial electronics, vol. 53, Issue 5. (Year: 2006).*

GB Search Report dated Sep. 20, 2015 for corresponding Application No. GB1501733.8.

International Search Report dated Apr. 18, 2016 for corresponding Application No. PCT/EP2016/052154.

European Communication for corresponding European Application Serial No. 16 702 430.6, dated May 23, 2018, pp. 1-6.

* cited by examiner

S401: Provide an inverter comprising a first inductor and a switching element in series between power supply terminals, the switching element being operable to be switched at a first frequency; a first capacitance in parallel with the switching element between the first inductor and a power supply terminal; a first tank circuit in parallel with the first capacitance, the first tank circuit comprising a second inductor and a second capacitance, wherein the second capacitance is arranged in series with the second inductor; a second tank circuit in parallel with the first capacitance; and a third capacitance in series with the first inductor between the first tank circuit and the second tank circuit, wherein the second tank circuit comprises a transmitter coil and a fourth capacitance, the fourth capacitance being arranged in parallel or series with the transmitter coil; wherein the fourth capacitance is selected such that the resonant frequency of the second tank circuit is not equal to the first frequency; and wherein the second inductor and the second capacitance are selected such that the resonant frequency of the first tank circuit is double the first frequency; and wherein the ratio of the first capacitance to the second capacitance is greater than or equal to 0.7 and less than or equal to 1.

S402: Switch the switching element at the first frequency with a duty cycle greater than or equal to 0.35 and less than or equal to 0.40.

FIG. 4

S501: Provide an inverter comprising a first inductor and a switching element in series between power supply terminals, the switching element being operable to be switched at a first frequency; a first capacitance in parallel with the switching element between the first inductor and a power supply terminal; a first tank circuit in parallel with the first capacitance, the first tank circuit comprising a second inductor and a second capacitance, wherein the second capacitance is arranged in series with the second inductor; a second tank circuit in parallel with the first capacitance; and a third capacitance in series with the first inductor between the first tank circuit and the second tank circuit, wherein the second tank circuit comprises a transmitter coil and a fourth capacitance, the fourth capacitance being arranged in parallel or series with the transmitter coil; wherein the fourth capacitance is selected such that the resonant frequency of the second tank circuit is not equal to the first frequency; and wherein the second inductor and the second capacitance are selected such that the resonant frequency of the first tank circuit is double the first frequency; and wherein the ratio of the first capacitance to the second capacitance is greater than 1 and less than 5.

S502: Switching the switching element at the first frequency with a duty cycle greater than or equal to 0.35 and less than or equal to 0.40.

FIG. 5

S601: Provide an inverter comprising a first inductor and a switching element in series between power supply terminals, the switching element being operable to be switched at a first frequency; a first capacitance in parallel with the switching element between the first inductor and a power supply terminal; a first tank circuit in parallel with the first capacitance, the first tank circuit comprising a second inductor and a second capacitance, wherein the second capacitance is arranged in series with the second inductor; a second tank circuit in parallel with the first capacitance; and a third capacitance in series with the first inductor between the first tank circuit and the second tank circuit, wherein the second tank circuit comprises a transmitter coil and a fourth capacitance, the fourth capacitance being arranged in parallel or series with the transmitter coil; wherein the fourth capacitance is selected such that the resonant frequency of the second tank circuit is not equal to the first frequency; and wherein the second inductor and the second capacitance are selected such that the resonant frequency of the first tank circuit is double the first frequency; and wherein the ratio of the first capacitance to the second capacitance is greater than or equal to 20.

S602: Switch the switching element at the first frequency with a duty cycle greater than or equal to 0.35 and less than or equal to 0.40.

FIG. 6

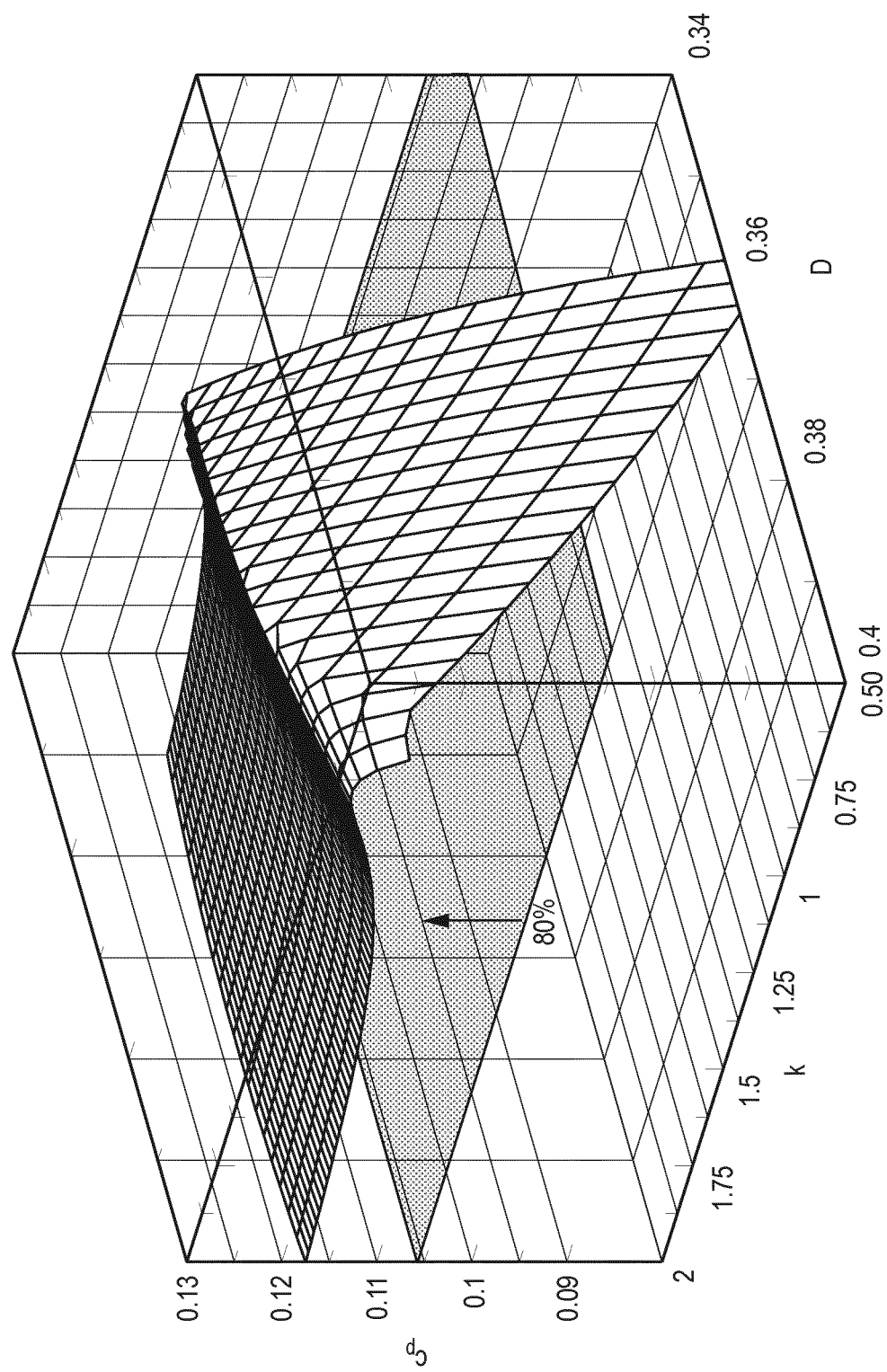

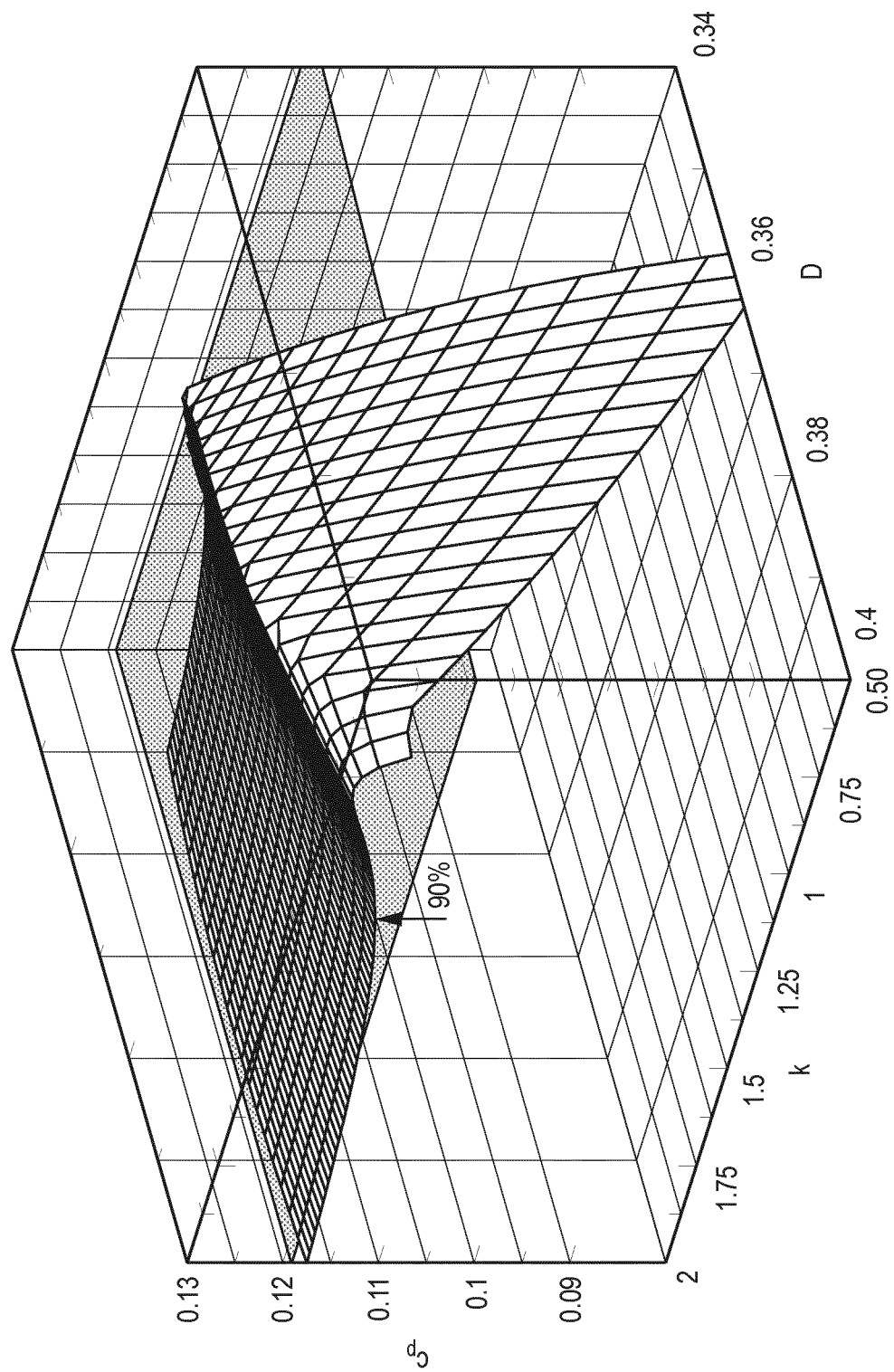

INVERTER FOR INDUCTIVE POWER TRANSFER

TECHNICAL FIELD

The present invention relates generally to the field of inductive power transfer and more specifically to an inverter for use in inductive power transfer applications.

BACKGROUND

Inductive Power Transfer is a well-known type of power transfer permitting the transmission of electrical power from a power source to a consuming power device without using conductors. In general terms, it comprises the use of time-varying electromagnetic fields typically transmitted across an air gap to the consuming device. The power is transferred through induction which relies on a magnetic field generated in a transmitter (or primary coil) by an electric current to induce a current in a receiver (or secondary coil). This is the action employed in, for example, a transformer where the primary coil and secondary coil are not connected.

However, the primary and secondary coils of a transformer are in very close proximity with a high coupling factor. For other applications, to maintain a high power of transmission, there is a need for more efficient, powerful and/or multi-megahertz switching resonant inverters.

SUMMARY

According to the present invention there is provided an inverter for inductive power transfer, the inverter comprising: a first inductor and a switching element in series between power supply terminals, the switching element being operable to be switched at a first frequency; a first capacitance in parallel with the switching element between the first inductor and a power supply terminal; a first tank circuit in parallel with the first capacitance, the first tank circuit comprising a second inductor and a second capacitance, wherein the second capacitance is arranged in series with the second inductor; a second tank circuit in parallel with the first capacitance; and a third capacitance in series with the first inductor between the first tank circuit and the second tank circuit, wherein the second tank circuit comprises a transmitter coil and a fourth capacitance, the fourth capacitance being arranged in parallel or series with the transmitter coil; wherein the fourth capacitance is selected such that the resonant frequency of the second tank circuit is not equal to the first frequency, and wherein the second inductor and the second capacitance are selected such that the resonant frequency of the first tank circuit is an integer multiple, greater than one, of the first frequency.

The present invention also provides an inductive power transfer transmitter comprising an inverter as described above and a controller operable to switch the switching element of the inverter at the first frequency.

Moreover, the present invention provides an inductive power transfer system comprising an inductive power transfer transmitter as defined above and an inductive power transfer receiver comprising a receiver coil spaced apart from the transmitter coil of the inductive power transfer transmitter.

The present invention also provides a method for inductive power transfer, comprising: providing an inverter comprising a first inductor and a switching element in series between power supply terminals, the switching element being operable to be switched at a first frequency; a first capacitance in parallel with the switching element between the first inductor and a power supply terminal; a first tank circuit in parallel with the first capacitance, the first tank circuit comprising a second inductor and a second capacitance, wherein the second capacitance is arranged in series with the second inductor; a second tank circuit in parallel with the first capacitance; and a third capacitance in series with the first inductor between the first tank circuit and the second tank circuit, wherein the second tank circuit comprises a transmitter coil and a fourth capacitance, the fourth capacitance being arranged in parallel or series with the transmitter coil; wherein the fourth capacitance is selected such that the resonant frequency of the second tank circuit is not equal to the first frequency; and wherein the second inductor and the second capacitance are selected such that the resonant frequency of the first tank circuit is double the first frequency; and wherein the ratio of the first capacitance to the second capacitance is greater than or equal to 0.7 and less than or equal to 1; and switching the switching element at the first frequency with a duty cycle greater than or equal to 0.35 and less than or equal to 0.40.

The present invention also provides a method for inductive power transfer, comprising: providing an inverter comprising a first inductor and a switching element in series between power supply terminals, the switching element being operable to be switched at a first frequency; a first capacitance in parallel with the switching element between the first inductor and a power supply terminal; a first tank circuit in parallel with the first capacitance, the first tank circuit comprising a second inductor and a second capacitance, wherein the second capacitance is arranged in series with the second inductor; a second tank circuit in parallel with the first capacitance; and a third capacitance in series with the first inductor between the first tank circuit and the second tank circuit, wherein the second tank circuit comprises a transmitter coil and a fourth capacitance, the fourth capacitance being arranged in parallel or series with the transmitter coil; wherein the fourth capacitance is selected such that the resonant frequency of the second tank circuit is not equal to the first frequency; and wherein the second inductor and the second capacitance are selected such that the resonant frequency of the first tank circuit is double the first frequency; and wherein the ratio of the first capacitance to the second capacitance is greater than 1 and less than 5; and switching the switching element at the first frequency with a duty cycle greater than 0.35 and less than 0.40.

The present invention also provides a method for inductive power transfer, comprising: providing an inverter comprising a first inductor and a switching element in series between power supply terminals, the switching element being operable to be switched at a first frequency; a first capacitance in parallel with the switching element between the first inductor and a power supply terminal; a first tank circuit in parallel with the first capacitance, the first tank circuit comprising a second inductor and a second capacitance, wherein the second capacitance is arranged in series with the second inductor; a second tank circuit in parallel with the first capacitance; and a third capacitance in series with the first inductor between the first tank circuit and the second tank circuit, wherein the second tank circuit comprises a transmitter coil and a fourth capacitance, the fourth capacitance being arranged in parallel or series with the transmitter coil; wherein the fourth capacitance is selected such that the resonant frequency of the second tank circuit is not equal to the first frequency; and wherein the second inductor and the second capacitance are selected such that the resonant frequency of the first tank circuit is double the first frequency; and wherein the ratio of the first capacitance to the second capacitance is greater than or equal to 20; switching the switching element at the first frequency with a duty cycle greater than or equal to 0.35 and less than or equal to 0.40.

LIST OF FIGURES

Embodiments of the present invention will now be described, by way of example only, with reference to the accompanying drawings, in which like reference numbers are used for like elements, and in which:

FIG. 1 schematically illustrates an inductive power transfer transmitter comprising a controller and an inverter according to an embodiment of the present invention;

FIG. 4 depicts a first method of operating an inverter;

FIG. 5 depicts a second method of operating an inverter;

FIG. 6 depicts a third method of operating an inverter;

FIGS. 18a-18d depict the variation of output power capability for q1=2;

Figure 29:
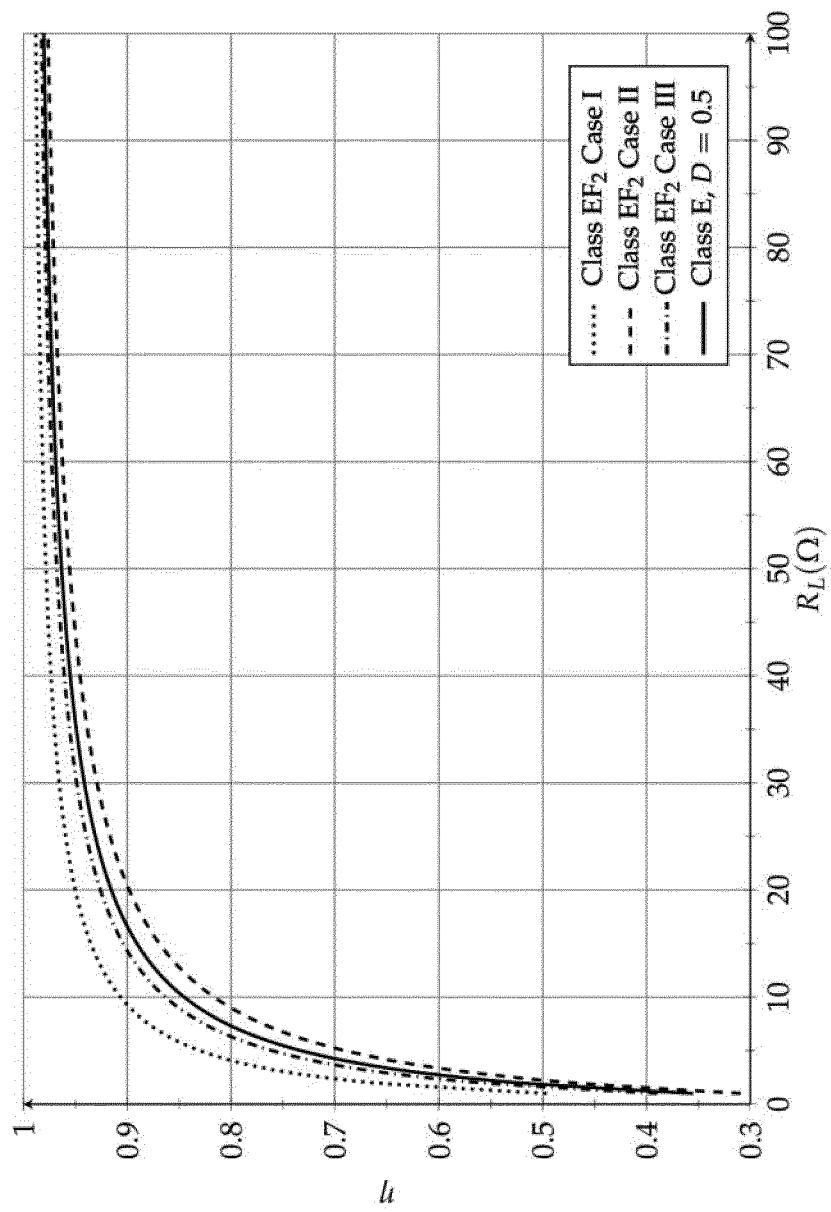
Figure 30A:
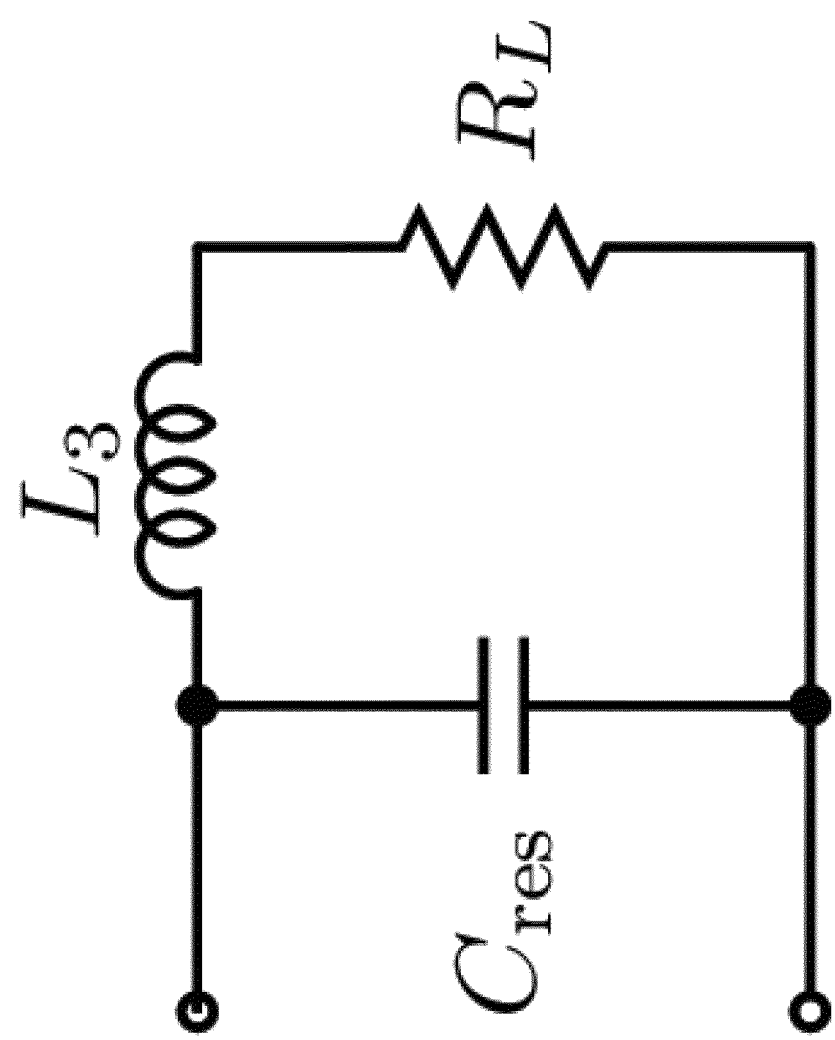
Figure 30B:
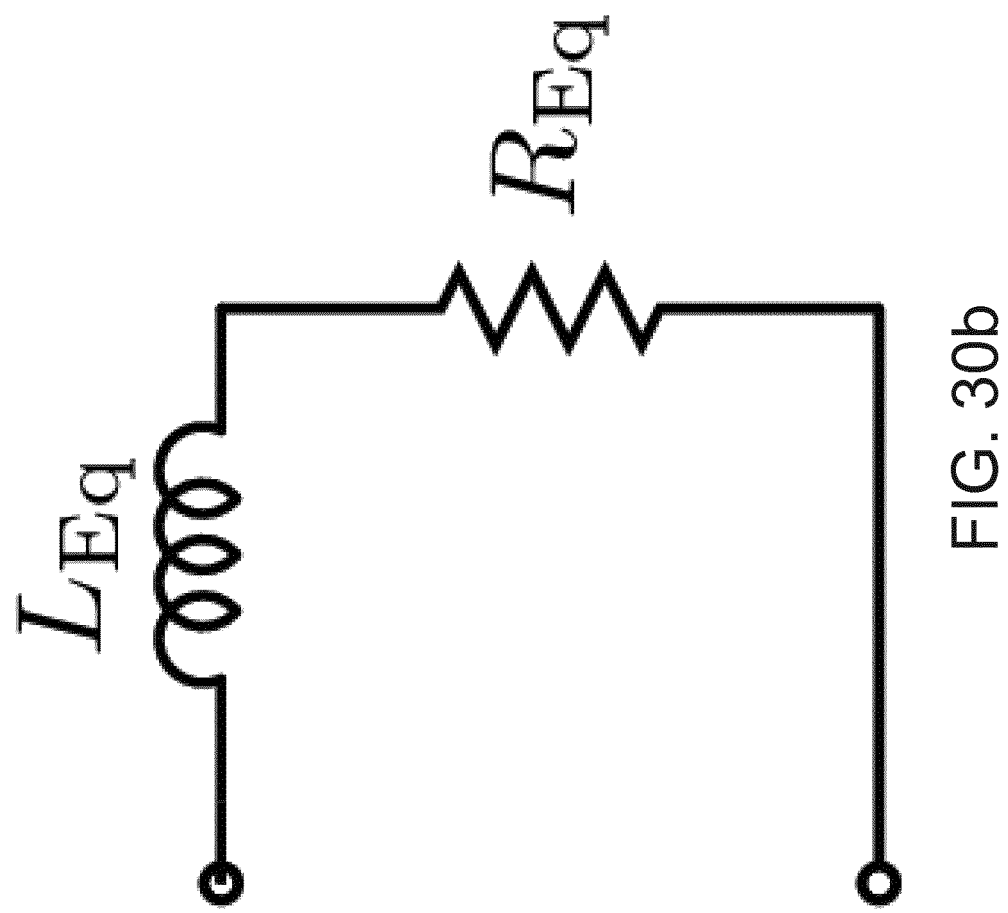
Figure 31:
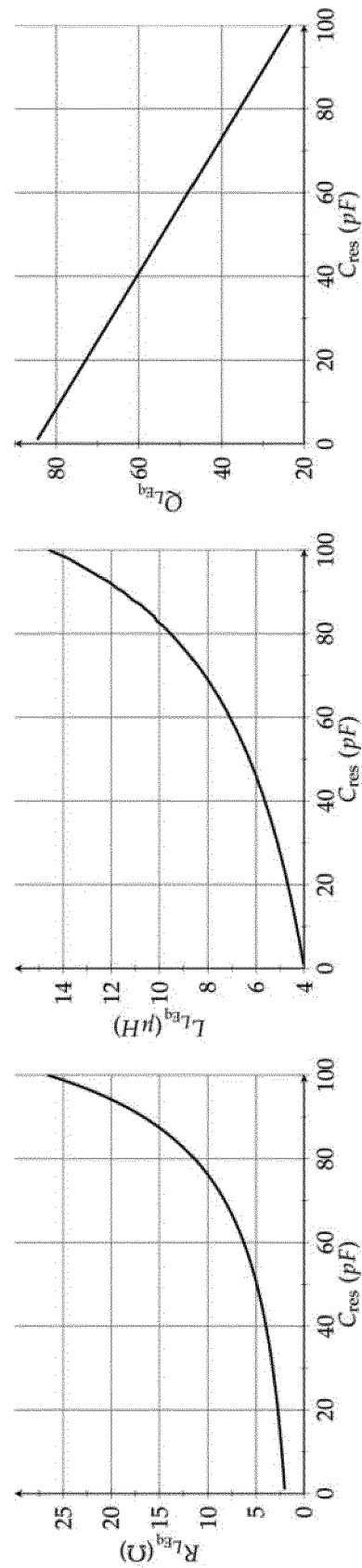
Figure 34A:
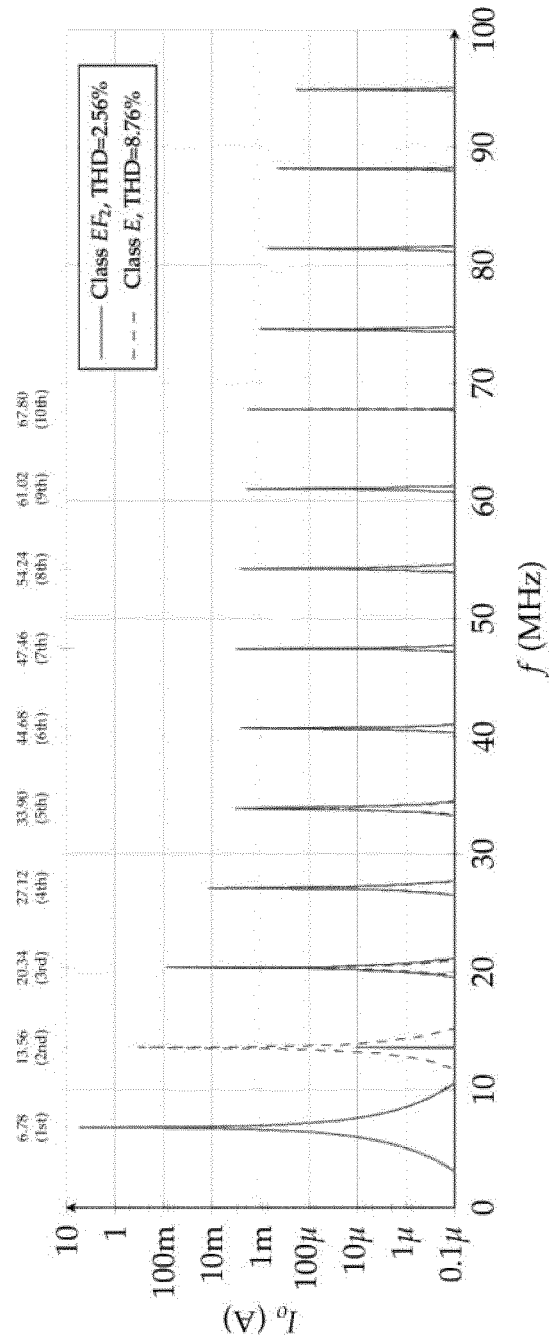
Figure 34B:
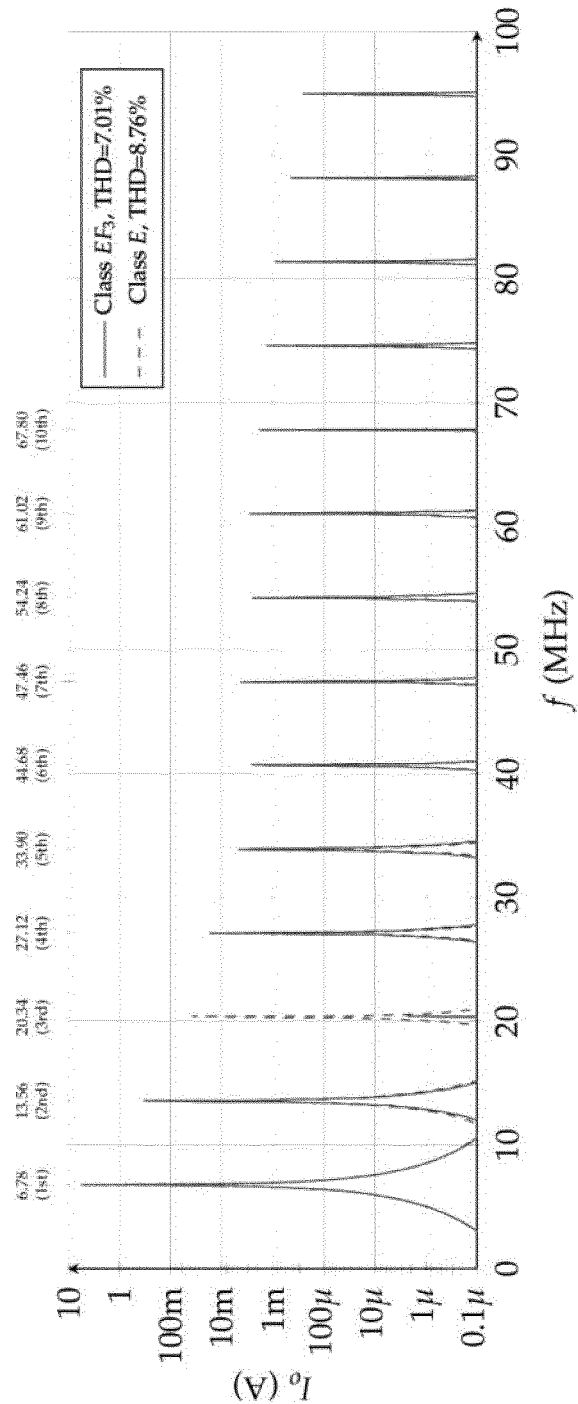
Figure 34C:
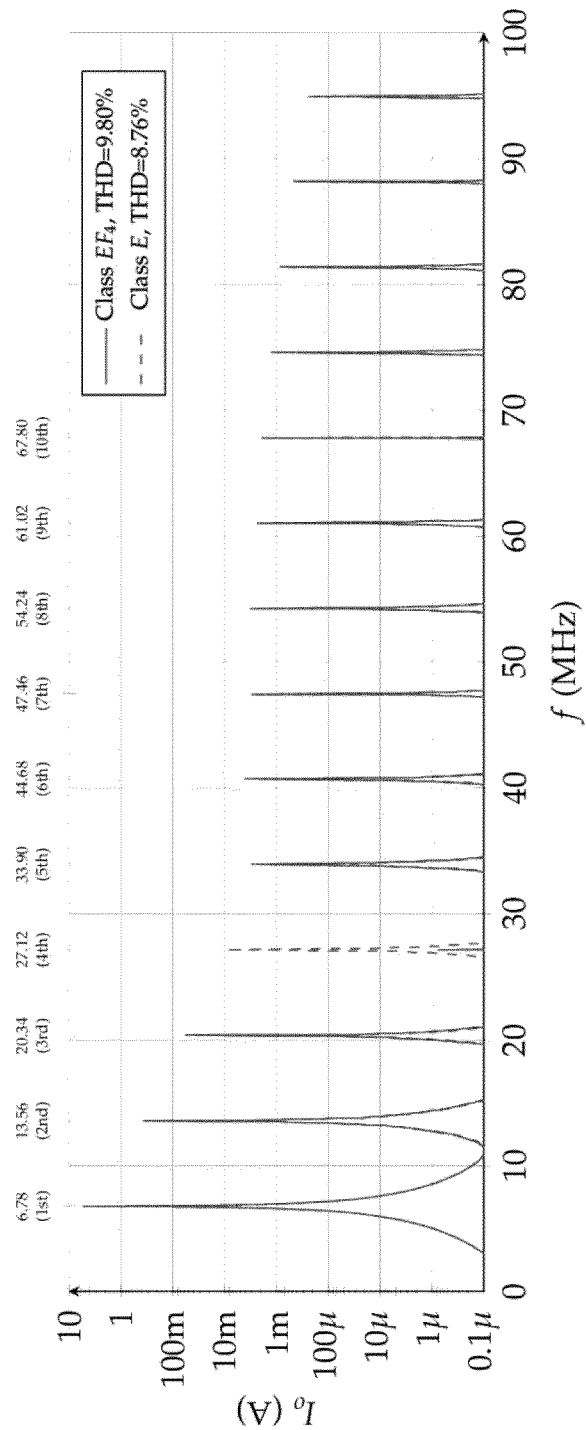
Figure 35:
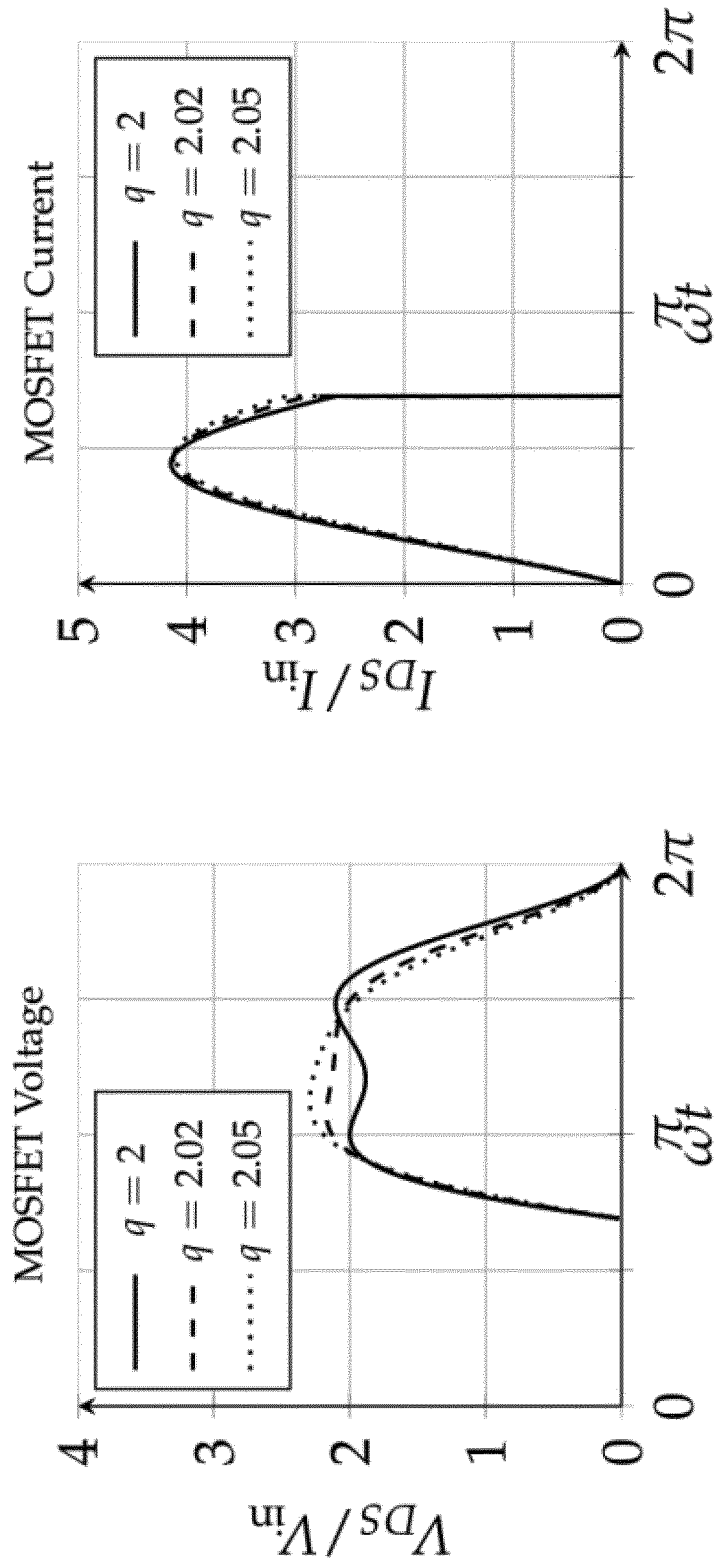
Figure 36:
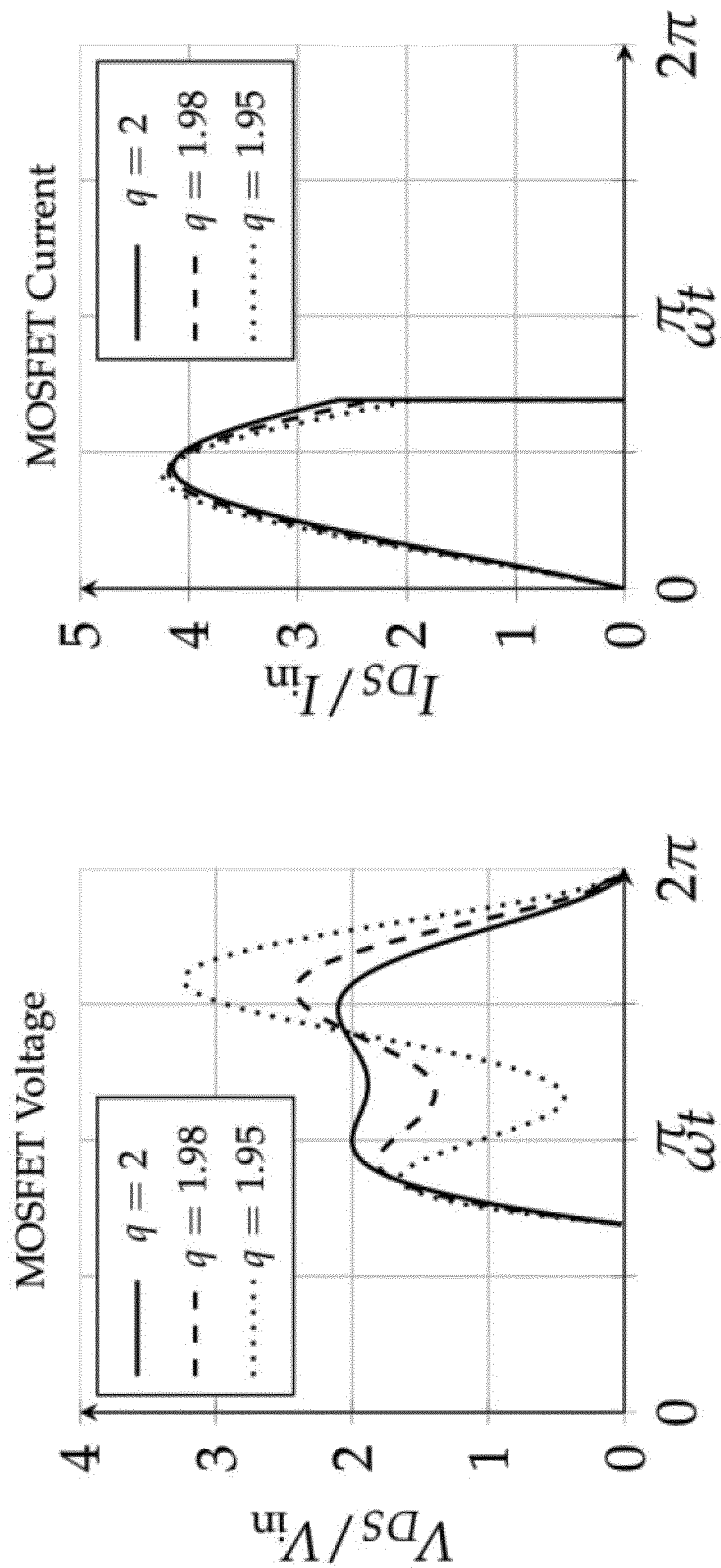

FIG. 29 compares the efficiencies of all special cases as the load resistance varies;

FIGS. 30a and 30b depicts the setup of a semi-resonance mode;

FIG. 31 depicts how the equivalent resistance and the equivalent inductance change according to $C_{res}$ in a hypothetical inductive power transfer system;

FIGS. 32a-32d depict the MOSFET's drain voltage and output current waveforms for each of the special cases and a Class E inverter;

FIGS. 33a-33d depict the output current for a Class E, Class $EF_2$, Class $E/F_3$ and Class $EF_4$ inverter;

FIGS. 34a-34c depict the harmonic content of the output current for the Class E, Class $EF_2$, Class $E/F_3$ and Class $EF_4$ inverter;

FIG. 35 depicts voltage and current waveforms for the tuning of the first tank circuit being slightly greater than twice the first frequency $f_s$;

FIG. 36 depicts voltage and current waveforms for the tuning of the first tank circuit being slightly less than twice the first frequency $f_s$.

DETAILED DESCRIPTION OF EMBODIMENTS

At present, inductive power transfer inverters are based on either a Class D or Class E type of inverter. The Class D type inverters consist of two switching elements and deliver a limited output power at minimum voltage and with low current stresses across the switching elements. Class E type inverters consist of a single switching element and deliver a higher output power, but with higher voltage and higher current stresses across the switching element.

Inverters that can deliver a high output power capability are severely limited by the high voltage and current stresses that are present across the switching elements. Previously, this has meant employing higher-specified, and therefore more expensive, components. The present inventors have addressed this problem by devising a new inverter.

Figure 1:
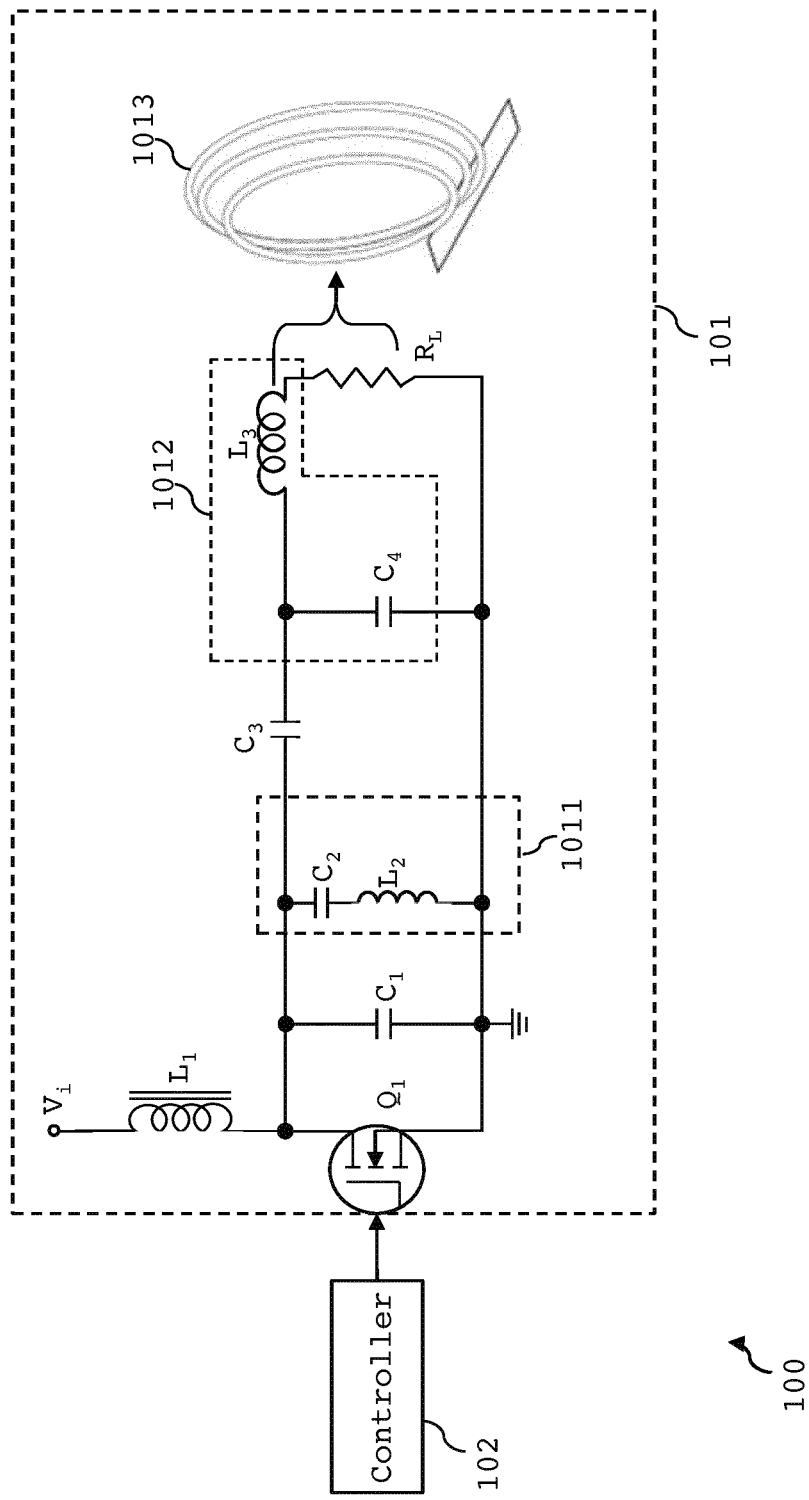

On embodiment of the new inverter is depicted in FIG. 1, which schematically shows an inverter 101 connected to a controller 102 to form an inductive power transfer transmitter 100. The inverter 101 comprises a switching element $Q_1$, which, in this embodiment, is a transistor, although other types of switching element can be employed instead. The inverter 101 has features which decrease the voltage stress across the switching element $Q_1$ without significantly increasing the current stress. This has the benefit of allowing the use of a smaller switching element $Q_1$ which maintains the same power level as previous inverters but reduces power losses due to a decreased on-state resistance. Alternatively, the new inverter 101 permits higher output power capabilities using the same switching element $Q_1$ as in previous inverters.

The inverter 101 depicted in FIG. 1 is for inductive power transfer and comprises a first inductor $L_1$ and the switching element $Q_1$ in series between the power supply terminals to which a power supply (not shown) is connected. The switching element $Q_1$ is operable to be switched by the controller at a first frequency $f_s$, which may be a predefined frequency (this frequency being interchangeably referred to herein as a first frequency or a switching frequency). In this embodiment, the controller 102 is operable to switch the switching element $Q_1$ at a first frequency $f_s$ greater than 6 MHz.

In this embodiment, the switching element $Q_1$ is a MOSFET, although other types of transistor can be employed instead.

In this embodiment, the inverter 101 also comprises a first capacitance $C_1$ in parallel with the switching element $Q_1$ between the first inductor $L_1$ and a power supply terminal. However, as will be explained below, the capacitance $C_1$ may be a capacitance of the switching element $Q_1$ and so a separate capacitor $C_1$ need not be provided.

A first tank circuit 1011 is arranged in parallel with the first capacitance $C_1$, the first tank circuit 1011 comprising a second inductor $L_2$ and a second capacitance $C_2$, wherein the second capacitance $C_2$ is arranged in series with the second inductor $L_2$. The second inductor $L_2$ and the second capacitance $C_2$ are selected such that the resonant frequency of the first tank circuit 1011 is an integer multiple, greater than one, of the first frequency $f_s$.

The inverter 101 is therefore a hybrid inverter which can be referred to as a Class $EF_n$ or Class $E/F_n$ inverter. The subscript n refers to the ratio of the resonant frequency of the first tank circuit 1011 to the first frequency $f_s$ of the inverter 101 and is an integer multiple greater than or equal to 2. The $EF_n$ term is used if n is an even integer and the $E/F_n$ term is used if n is an odd integer.

As will be explained in more detail below, the resonant frequency of the first tank circuit 1011 need not be precisely an integer multiple (greater than one) of the first frequency $f_s$ to achieve the advantages described herein, but instead can be equal to the integer multiple ±0.05. Accordingly, when any of the terms "integer multiple", "twice", "double", "triple", "three times", etc. or the like are used herein to refer to the relationship between the resonant frequency of the first tank circuit 1011 and the first frequency $f_s$, these terms should be understood to encompass the ±0.05 tolerance.

The inverter 101 also comprises a second tank circuit 1012 in parallel with the first capacitance $C_1$.

The inverter 101 further comprises a third capacitance $C_3$ in series with the first inductor $L_1$ between the first tank circuit 1011 and the second tank circuit 1012.

The second tank circuit 1012 comprises a transmitter coil 1013, which is modelled as a third inductance $L_3$ and a resistance $R_L$ in the circuit shown in FIG. 1, and a fourth capacitance $C_4$. The fourth capacitance $C_4$ is arranged in parallel or series with the transmitter coil 1013. The third inductance $L_3$ and resistance $R_L$ represent the inductance of the transmitter coil and its reflected resistance respectively.

The fourth capacitance $C_4$ is selected such that the resonant frequency of the second tank circuit is not equal to the first frequency $f_s$. As a result, the inverter 101 operates in a semi-resonant mode. For example, the fourth capacitance $C_4$ can be arranged in parallel with the transmitter coil 1013 and the fourth capacitance $C_4$ can be selected such that the resonant frequency of the second tank circuit 1012 is greater than the first frequency $f_s$. In this case, the fourth capacitance $C_4$ can be selected so that the ratio of the first frequency $f_s$ to the resonant frequency of the second tank circuit 1012 may be set to greater than or equal to 0.5 and less than 1. Alternatively, the fourth capacitance $C_4$ can be arranged in series with the transmitter coil 1013, and the fourth capacitance $C_4$ can be selected such that the resonant frequency of the second tank circuit 1012 is less than the first frequency $f_s$. In this case, the fourth capacitance $C_4$ can be selected so that the ratio of the first frequency $f_s$ to the resonant frequency of the second tank circuit 1012 is greater than 1 and less than or equal to 1.5.

The overall effect of the inverter 101 is to reduce the peak voltage across the switching element $Q_1$ whilst increasing the output power capability delivered to a receiver and hence to a load. For example, the inventors have found that, by using a first tank circuit 1011 with a resonant frequency equal to the second harmonic frequency of the switching signal from the drain of the switching element $Q_1$ to ground, the peak voltage across the switching element $Q_1$ is reduced from 3.5-4 times the input voltage, as in a conventional Class E inverter, to twice the input voltage. The first tank circuit 1011 effectively: (1) removes the second harmonic of the voltage developed across the switching element $Q_1$ when the switching element $Q_1$ is off by storing its energy and (2) releases the stored energy back to the circuit when the switching element $Q_1$ is on.

Figure 2:
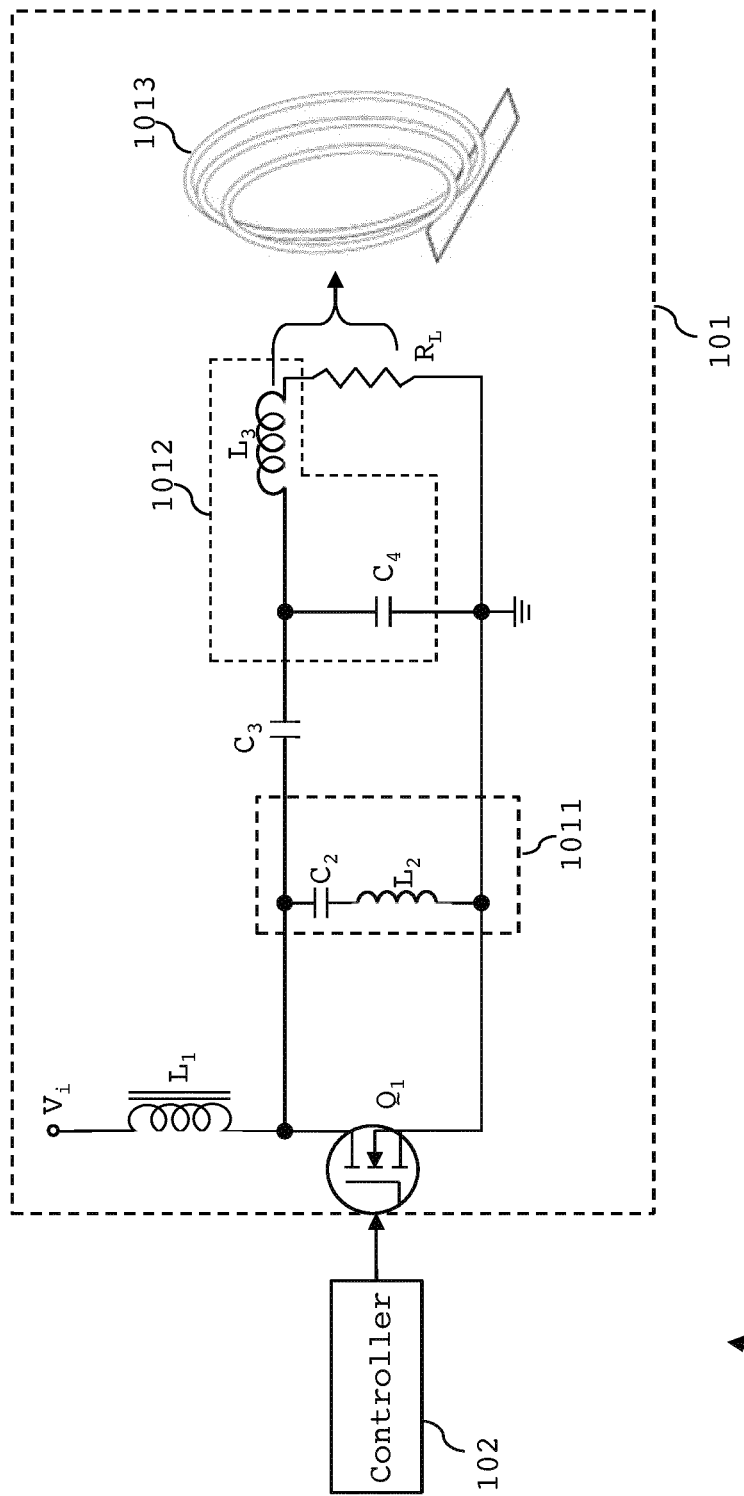
FIG. 2 depicts a modification to the inverter disclosed in FIG. 1 with the removal of the first capacitance.

The inverter 101 depicted in FIG. 1 can be modified in a number of ways. For example, as depicted in FIG. 2, the inverter 101 could be modified to remove the separate capacitance $C_1$ and instead rely on the non-linear output capacitance of the switching element $Q_1$. In other words, in the embodiment of FIG. 2, the first capacitance $C_1$ is part of the output capacitance of the switching element $Q_1$.

Figure 3:
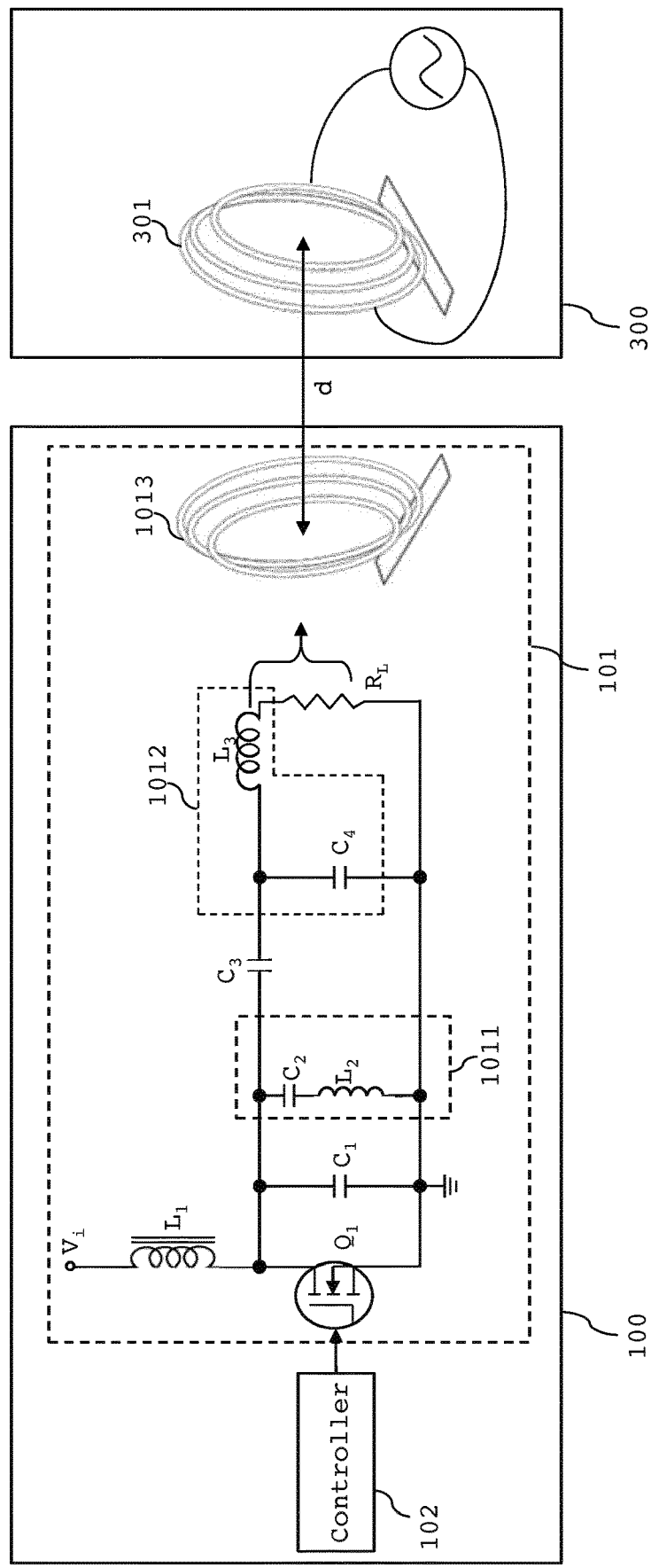
FIG. 3 is a diagram of an inductive power transfer system.

FIG. 3 depicts an inductive power transfer system, which comprises an inductive power transfer transmitter 100, as described previously, together with an inductive power transfer receiver 300. The inductive power transfer receiver comprises a receiver coil 301 spaced apart from the transmitter coil 1013 of the inductive power transfer transmitter 100. The centres of the receiver coil 301 and transmitter coil 1013 are spaced apart by a distance d. Although the diagram depicts the coils as angled relative to each other, this need not be the case and the coils are typically parallel to each other or may take any orientation with respect to each other. The inductive power transfer transmitter 100 transmits power via electromagnetic radiation to the receiver coil 1013 which is driven by the electromagnetic radiation to induce a current in the inductive power transfer receiver 300.

As noted above, the first tank circuit 1011 in embodiments of the present invention may be tuned to any integer multiple of the first frequency $f_s$; where the integer multiple is 2 or greater. The inventors have carried out investigations to determine which integer multiples provide better harmonic distortion than a conventional Class E inverter. More particularly, a hypothetical inductive power transfer system was considered with a transmitting coil inductance of 1 µH, an optimum reflected load of 6Ω, an output power of 100 W and a frequency of operation of 6.78 MHz. For simplification, lossless operation was also assumed. The harmonic content was analysed using state-space analysis.

FIGS. 33a-d show the output current (or the current flowing in the transmitting coil) for (i) a Class E inverter, (ii) an inverter of an embodiment in which the first tank circuit is tuned to twice the first frequency $f_s$ (Class $EF_2$), (iii) an inverter of an embodiment in which the first tank circuit is tuned to three times the first frequency $f_s$ (Class $E/F_3$), and (iv) an inverter of an embodiment in which the first tank circuit is tuned to four times the first frequency $f_s$ (Class $EF_4$), respectively. In these figures, the total harmonic distortion, THD, is shown for each inverter. It can be seen that an inverter in which the first tank circuit is tuned to twice the first frequency and an inverter in which the first tank circuit is tuned to three times the first frequency are both advantageous in that they both provide lower harmonic distortion than a Class E inverter. It will also be seen that the output current has the lowest distortion and is closer to an ideal sinusoidal waveform when the first tank circuit 1011 is tuned to twice the first frequency $f_s$.

FIG. 34 shows the harmonic content of the output current for all of the inverters. The harmonic corresponding to the tuned resonant frequency of the first tank circuit 1011 is removed leading to an improved total harmonic distortion for the cases where the first tank circuit 1011 is tuned to either twice or three times the first frequency $f_s$.

As will be explained in more detail below, the present inventors have also investigated how to optimise the new inverter 101 to achieve high output power capability, high switching frequency and/or steady state operation. The present inventors have found that, by selecting the capacitances $C_1$ and $C_2$ and the switching duty cycle of the switching element $Q_1$ (defined as the ratio of the time the switching element $Q_1$ is on to the total time of the period, i.e. the sum of the switching element $Q_1$ on-time and off-time in a period), the inductive power transfer transmitter 100 can be optimised for high output power capability, high switching frequency of the switching element $Q_1$ and/or steady state operation.

More particularly, for maximum output power capability in a transmitter 100 in which the first tank circuit 1011 of the inverter 101 is tuned to twice the first frequency $f_s$, or, taking into account tolerances between 1.95 and 2.05 of the first frequency $f_s$, the inventors have found that capacitances $C_1$ and $C_2$ should be selected such that the ratio of $C_1$ to $C_2$ is 0.867 or, taking into account tolerances between 0.767 and 0.967, and the controller 102 should be arranged to switch the switching element $Q_1$ with a duty cycle of 0.375 or, taking into account tolerances, between 0.365 and 0.385.

To achieve 90% or greater of the maximum output power capability, the inventors have found that capacitances $C_1$ and $C_2$ should be selected such that the ratio of $C_1$ to $C_2$ is between 0.8 and 1, and the controller 102 should be arranged to switch the switching element $Q_1$ with a duty cycle between 0.35 and 0.40.

To achieve 80% or greater of the maximum output power capability, the inventors have found that capacitances $C_1$ and $C_2$ should be selected such that the ratio of $C_1$ to $C_2$ is between 0.7 and 1, and the controller 102 should be arranged to switch the switching element $Q_1$ with a duty cycle between 0.35 and 0.40.

Accordingly, a method for inductive power transfer in an embodiment is shown in FIG. 4. Referring to FIG. 4, at step S401 an inverter is provided comprising a first inductor and a switching element in series between power supply terminals, the switching element being operable to be switched at a first frequency; a first capacitance in parallel with the switching element between the first inductor and a power supply terminal; a first tank circuit in parallel with the first capacitance, the first tank circuit comprising a second inductor and a second capacitance, wherein the second capacitance is arranged in series with the second inductor; a second tank circuit in parallel with the first capacitance; and a third capacitance in series with the first inductor between the first tank circuit and the second tank circuit, wherein the second tank circuit comprises a transmitter coil and a fourth capacitance, the fourth capacitance being arranged in parallel or series with the transmitter coil; wherein the fourth capacitance is selected such that the resonant frequency of the second tank circuit is not equal to the first frequency; and wherein the second inductor and the second capacitance are selected such that the resonant frequency of the first tank circuit is double the first frequency; and wherein the ratio of the first capacitance to the second capacitance is greater than or equal to 0.7 and less than or equal to 1.

At step S402, the switching element $Q_1$ is switched at the first frequency with a duty cycle greater than or equal to 0.35 and less than or equal to 0.40.

For maximum switching frequency in a transmitter 100 in which the first tank circuit 1011 of the inverter 101 is tuned to twice the switching frequency $f_s$, or, taking into account tolerances between 1.95 and 2.05 of the first frequency fs, the inventors have found that capacitances $C_1$ and $C_2$ should be selected such that the ratio of $C_1$ to $C_2$ is 1.567 or, taking into account tolerances between 1.467 and 1.667, and the controller 102 should be arranged to switch the switching element $Q_1$ with a duty cycle of 0.3718 or, taking into account tolerances, between 0.3618 and 0.3818.

To achieve 90% or greater of the maximum switching frequency, the inventors have found that capacitances $C_1$ and $C_2$ should be selected such that the ratio of $C_1$ to $C_2$ is between 1.2 and 3.7, and the controller 102 should be arranged to switch the switching element $Q_1$ with a duty cycle between 0.35 and 0.40.

To achieve 80% or greater of the maximum switching frequency, the inventors have found that capacitances $C_1$ and $C_2$ should be selected such that the ratio of $C_1$ to $C_2$ is between 1 and 5, and the controller 102 should be arranged to switch the switching element $Q_1$ with a duty cycle between 0.35 and 0.40.

Accordingly, a method for inductive power transfer in an embodiment is shown in FIG. 5. Referring to FIG. 5, at step S501 an inverter is provided comprising a first inductor and a switching element in series between power supply terminals, the switching element being operable to be switched at a first frequency; a first capacitance in parallel with the switching element between the first inductor and a power supply terminal; a first tank circuit in parallel with the first capacitance, the first tank circuit comprising a second inductor and a second capacitance, wherein the second capacitance is arranged in series with the second inductor; a second tank circuit in parallel with the first capacitance; and a third capacitance in series with the first inductor between the first tank circuit and the second tank circuit, wherein the second tank circuit comprises a transmitter coil and a fourth capacitance, the fourth capacitance being arranged in parallel or series with the transmitter coil; wherein the fourth capacitance is selected such that the resonant frequency of the second tank circuit is not equal to the first frequency; and wherein the second inductor and the second capacitance are selected such that the resonant frequency of the first tank circuit is double the first frequency; and wherein the ratio of the first capacitance to the second capacitance is greater than 1 and less than 5.

At step S502, the switching element $Q_1$ is switched at the first frequency with a duty cycle greater than 0.35 and less than 0.40.

For a steady state in a transmitter 100 in which the first tank circuit 1011 of the inverter 101 is tuned to twice the switching frequency fs, or, taking into account tolerances between 1.95 and 2.05 of the first frequency fs, the inventors have found that capacitances $C_1$ and $C_2$ should be selected such that the ratio of $C_1$ to $C_2$ is greater than or equal to 20, and the controller 102 should be arranged to switch the switching element $Q_1$ with a duty cycle between 0.35 and 0.4.

Accordingly, a method for inductive power transfer in an embodiment is shown in FIG. 6. Referring to FIG. 6, at step S601 the inverter is provided comprising a first inductor and a switching element in series between power supply terminals, the switching element being operable to be switched at a first frequency; a first capacitance in parallel with the switching element between the first inductor and a power supply terminal; a first tank circuit in parallel with the first capacitance, the first tank circuit comprising a second inductor and a second capacitance, wherein the second capacitance is arranged in series with the second inductor; a second tank circuit in parallel with the first capacitance; and a third capacitance in series with the first inductor between the first tank circuit and the second tank circuit, wherein the second tank circuit comprises a transmitter coil and a fourth capacitance, the fourth capacitance being arranged in parallel or series with the transmitter coil; wherein the fourth capacitance is selected such that the resonant frequency of the second tank circuit is not equal to the first frequency; and wherein the second inductor and the second capacitance are selected such that the resonant frequency of the first tank circuit is double the first frequency; and wherein the ratio of the first capacitance to the second capacitance is greater than or equal to 20.

At step S602 the switching element $Q_1$ is switched at the first frequency with a duty cycle greater than or equal to 0.35 and less than or equal to 0.40.

The advantages set out above, and those described below, can still be achieved even when the resonant frequency of the first tank circuit 1011 is not precisely an integer multiple, greater than one, of the first frequency $f_s$. More particularly, the present inventors have found that the integer multiple with a tolerance of ±0.05 is sufficient to ensure correct operation. By way of example, when the resonant frequency of the first tank circuit 1011 is to be tuned to twice the first frequency $f_s$, then correct operation can be achieved when the resonant frequency of the first tank circuit 1011 is between 1.95 and 2.05 times the first frequency $f_s$. In more detail, FIG. 35 depicts the switching element $Q_1$ voltage and current waveforms found by the inventors for cases where the tuning is slightly greater than twice the first frequency $f_s$. FIG. 36 depicts the switching element $Q_1$ voltage and current waveforms found by the inventors for cases where the tuning is slightly less than twice the first frequency $f_s$. Similarly, when the resonant frequency of the first tank circuit 1011 is to be tuned to three times the first frequency $f_s$, correct operation can be achieved when the resonant frequency of the first tank circuit 1011 is between 2.95 and 3.05 times the first frequency $f_s$. The ±0.05 tolerances therefore apply to all integers higher than 3.

The following analysis provides further details of the above-described inverter and its properties. The analysis below, for sake of simplicity, considers cases without the use of a semi-resonant mode, but the analysis is equally applicable, without loss of generality, to the semi-resonant mode.

Figure 7:
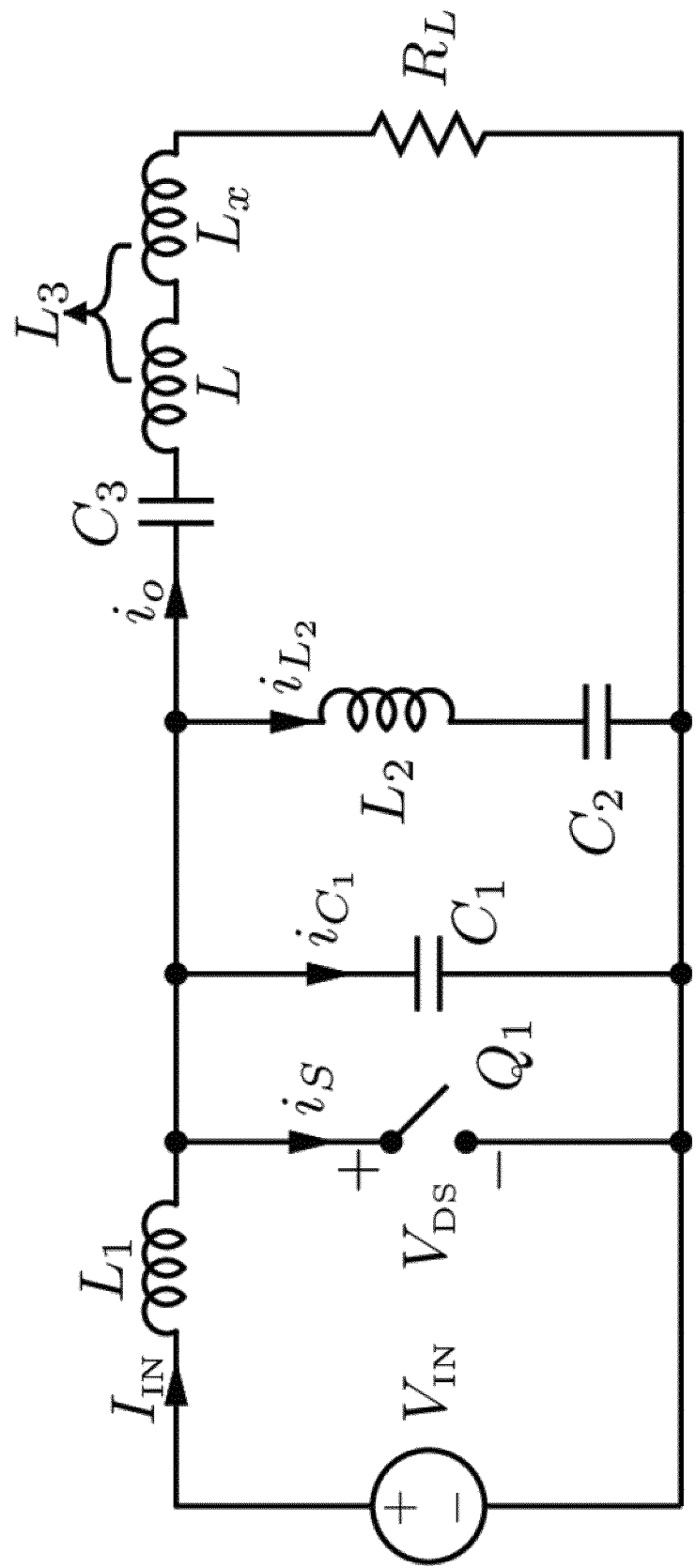
FIG. 7 depicts a circuit for analysis of the special modes of an inverter.

FIG. 7 depicts a simplified equivalent circuit for the inverter 101 in FIG. 1, without the first tank circuit 1011 that provides semi-resonant operation. The simplified equivalent circuit of FIG. 7 will be used for the analysis described below. Inductor $L_2$ and capacitor $C_2$ make the first tank circuit 1011 in FIG. 1. Inductor $L_3$ is divided into an inductance $L$ that resonates with $C_3$ at the switching frequency and a residual inductance $L_x$. The analysis will be based on the following assumptions:

1. The switching element $Q_1$ is a transistor. The transistor and its body diode form an ideal switch whose ON resistance is zero, OFF resistance is infinity, and switching times are zero.
2. The choke inductance is high enough such that the input current $I_{IN}$ is a DC current.
3. The loaded quality factor of the $L_3C_3R_L$ branch is high enough such that the current $i_o$ through it is sinusoidal.
4. The shunt capacitance $C_1$ is assumed to be linear.
5. There are no losses in the circuit, all the power supplied by the source is delivered to the load $R_L$.

The output current $i_o$ is sinusoidal and is given by $$i_o(\omega t) = i_m \sin(\omega t + \varphi) \tag{1}$$

where $i_m$ is the output current's magnitude and $\varphi$ is its phase. For the period $0 \leq \omega t < 2\pi D$ the switch is ON, therefore $$v_{DS}(\omega t) = 0 \text{ for } 0 \leq \omega t < 2\pi D \tag{2}$$

$$i_{C_1}(\omega t) = 0 \text{ for } 0 \leq \omega t < 2\pi D. \tag{3}$$

By applying KCL at the switch's drain node the switch's current is $$i_s(\omega t) = I_{IN} - i_{L_2}(\omega t) - i_o(\omega t) \text{ for } 0 \leq \omega t < 2\pi D. \tag{4}$$

Since the switch is ON, the total voltage across the series tuned $L_2C_2$ network is zero. The $L_2C_2$ network now is a source-free undamped circuit and its current ($i_{L_2}$) normalised with respect to the input DC current ($I_{IN}$) is given by $$\frac{i_{L_2}}{I_{IN}}(\omega t) = A_1 \cos(q_1 \omega t) + B_1 \sin(q_1 \omega t) \tag{5}$$

where q1 is the ratio of the resonant frequency of $L_2C_2$ to the switching frequency and is given, by $$q_1 = n = \frac{1}{\omega \sqrt{L_2 C_2}}. \tag{6}$$

The coefficients $A_1$ and $B_1$ are to be determined based on equation's boundary conditions.

For the period $2\pi D \leq \omega t < 2\pi$ the switch is turned OFF, therefore $$i_s(\omega t) = 0 \text{ for } 2\pi D \leq \omega t < 2\pi. \tag{7}$$

By applying KOL at the switch's drain node the current in the series tuned $L_2C_2$ network is $$i_{L_2}(\omega t) = I_{IN} - i_o(\omega t) - i_{C_1}(\omega t) \tag{8}$$

$$= I_{IN} - i_m \sin(\omega t + \phi) - \omega C_1 \frac{dv_{DS}(\omega t)}{d\omega t}.$$

The switch's voltage is equal to the total voltage across the $L_2C_2$ network and is given by $$v_{DS}(\omega t) = \omega L_2 \frac{di_{L_2}(\omega t)}{d\omega t} + \frac{1}{\omega C_2} \int_{2\pi D}^{\tau} i_{L_2}(\omega t) d\omega t + v_{C_2}(2\pi D). \tag{9}$$

Differentiating the above equation results in $$\frac{dv_{DS}(\omega t)}{d\omega t} = \omega L_2 \frac{d^2 i_{L_2}(\omega t)}{d\omega t^2} + \frac{1}{\omega C_2} i_{L_2}(\omega t). \tag{10}$$

Substituting Eq. 10 in Eq. 8 and normalising with respect to the input current $$\frac{i_{L_2}}{I_{IN}}(\omega t) = 1 - \frac{i_m}{I_{IN}} \sin(\omega t + \phi) - \omega^2 L_2 C_1 \frac{\frac{d^2 i_{L_2}}{I_{IN}}(\omega t)}{d\omega t^2} - \frac{C_1}{C_2} \frac{i_{L_2}}{I_{IN}}(\omega t). \tag{11}$$

Eq. 11 is a linear non-homogeneous second-order differential equation which has the following general solution $$\frac{i_{L_2}}{I_{IN}}(\omega t) = A_2 \cos(q_2 \omega t) + B_2 \sin(q_2 \omega t) - \frac{q_2^2 p}{q_2^2 - 1} \sin(\omega t + \phi) + \frac{1}{k+1} \quad (12)$$

$$k = \frac{C_1}{C_2} \quad (13)$$

$$q_2 = \frac{1}{\omega} \sqrt{\frac{C_1 + C_2}{L_2 C_1 C_2}} = q_1 \sqrt{\frac{k+1}{k}} \quad (14)$$

$$p = \frac{C_2}{C_1 + C_2} \frac{i_m}{I_{IN}} = \frac{1}{k+1} \frac{i_m}{I_{IN}} \quad (15)$$

and the coefficients $A_2$ and $B_2$ are to be determined based on the equation's boundary conditions. The boundary conditions are determined from the current and voltage continuity conditions when the switch turns ON and OFF which can be described by $$i_{L_2}(2\pi D^-) = i_{L_2}(2\pi D^+) \quad (16)$$

$$i_{L_2}(0) = i_{L_2}(2\pi) \quad (17)$$

$$\left.\frac{di_{L_2}(\omega t)}{d\omega t}\right|_{\omega t = 2\pi D^-} = \left.\frac{di_{L_2}(\omega t)}{d\omega t}\right|_{\omega t = 2\pi D^+} \quad (18)$$

$$\left.\frac{di_{L_2}(\omega t)}{d\omega t}\right|_{\omega t = 0} = \left.\frac{di_{L_2}(\omega t)}{d\omega t}\right|_{\omega t = 2\pi}. \quad (19)$$

The current through capacitor $C_1$ for the period $2\pi D \leq \omega t < 2\pi$ is $$i_{C_1}(\omega t) = I_{IN} - i_o(\omega t) - i_{L_2}(\omega t) \quad (20)$$

and normalising with respect to the input current and using Eq. 13 gives $$\frac{i_{C_1}}{I_{IN}}(\omega t) = 1 - p(k+1)\sin(\omega t + \phi) - \frac{i_{L_2}}{I_{IN}}(\omega t). \quad (21)$$

The drain voltage for the period $2\pi D \leq \omega t < 2\pi$ is $$v_{DS}(\omega t) = \frac{I_{IN}}{\omega C_1} \int_{2\pi D}^{\omega t} \frac{i_{C_1}}{I_{IN}}(\tau) d\tau \quad (22)$$

where $\tau$ is a dummy variable. Substituting the ZVS ($v_{DS}(2\pi)=0$) and ZDS ($iC_1(2\pi)=0$) conditions in the above equation gives the following two equations $$2\pi \frac{k}{k+1}(1-D) + p(\cos(2\pi D + \phi) - \cos\phi)\left(\frac{q_2^2}{q_2^2-1} - (k+1)\right) + \quad (23)$$
$$\frac{A_2}{q_2}(\sin(2\pi D q_2) - \sin(2\pi q_2)) + \frac{B_2}{q_2}(\cos(2\pi q_2) - \cos(2\pi D q_2)) = 0$$

$$\frac{k}{k+1} + p\sin\phi\left(\frac{q_2^2}{q_2^2-1} - (k+1)\right) - (A_2 \cos(2\pi q_2) + B_2 \sin(2\pi q_2)) = 0. \quad (24)$$

Figure 8A:
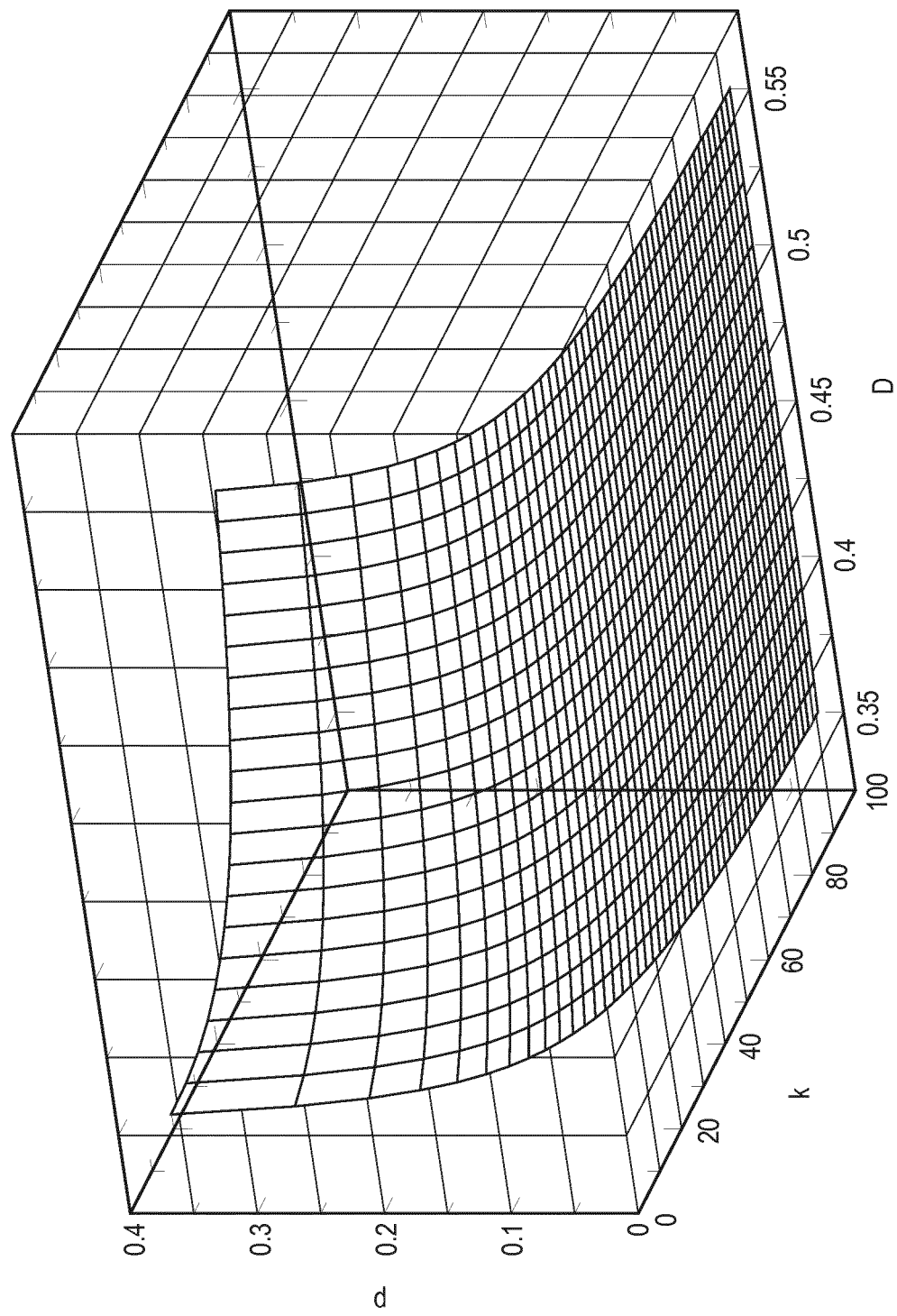
FIGS. 8a and 8b show numerically solved values of p and φ as a function of k and the duty cycle D for q1=2.
Figure 8B:
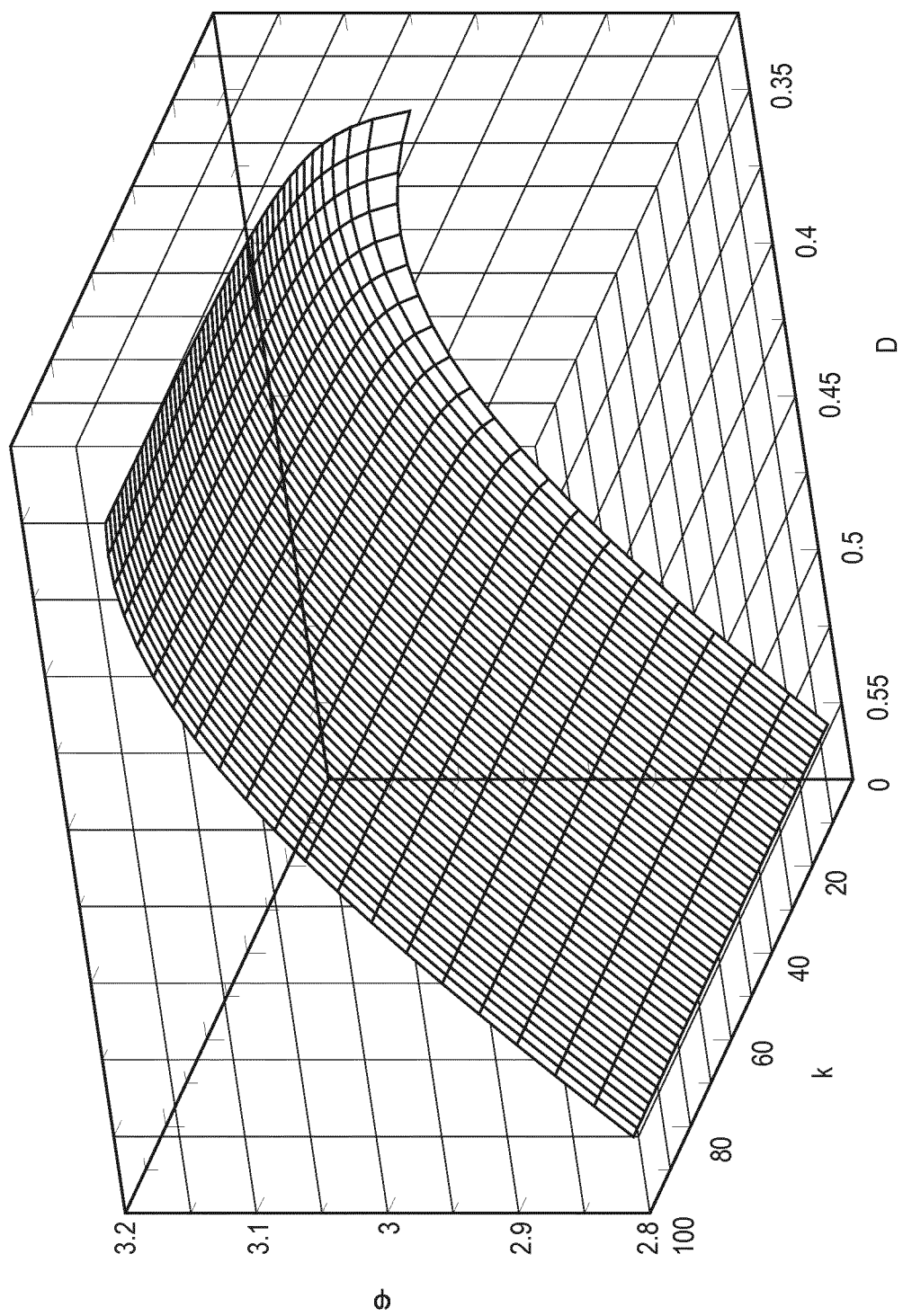
Figure 9A:
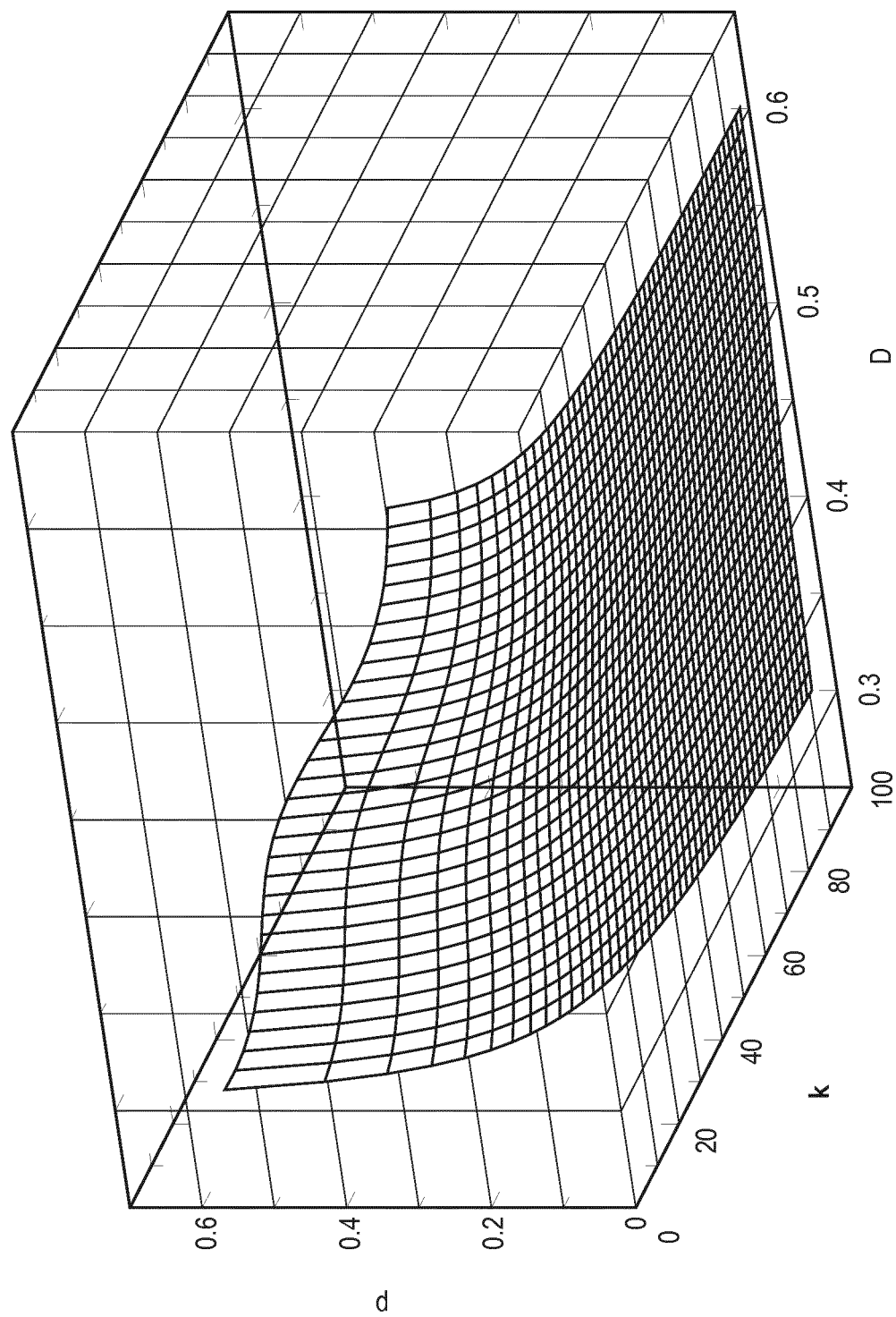
FIGS. 9a and 9b show numerically solved values of p and φ as a function of k and the duty cycle D for q1=3.
Figure 9B:
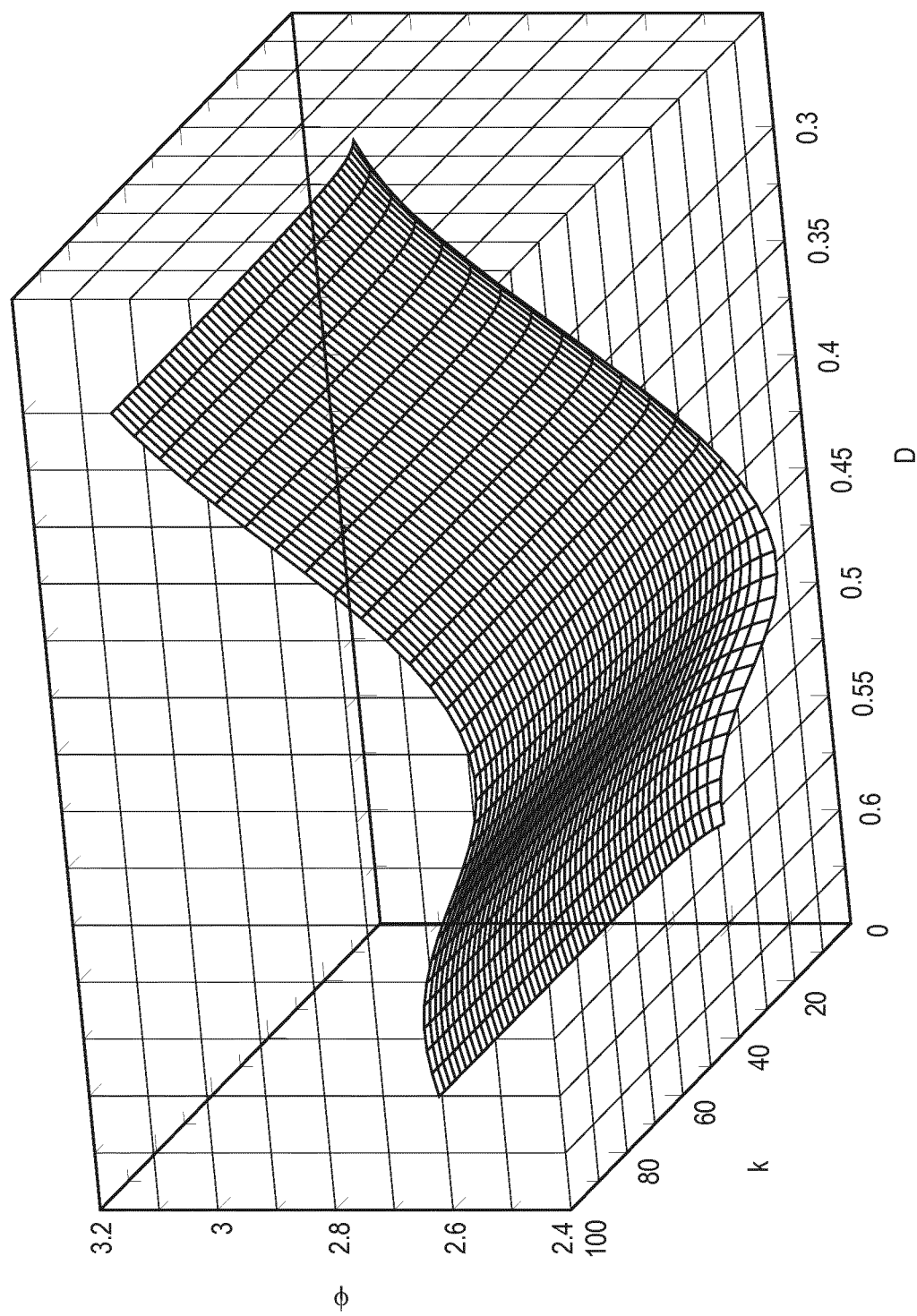
Figure 10A:
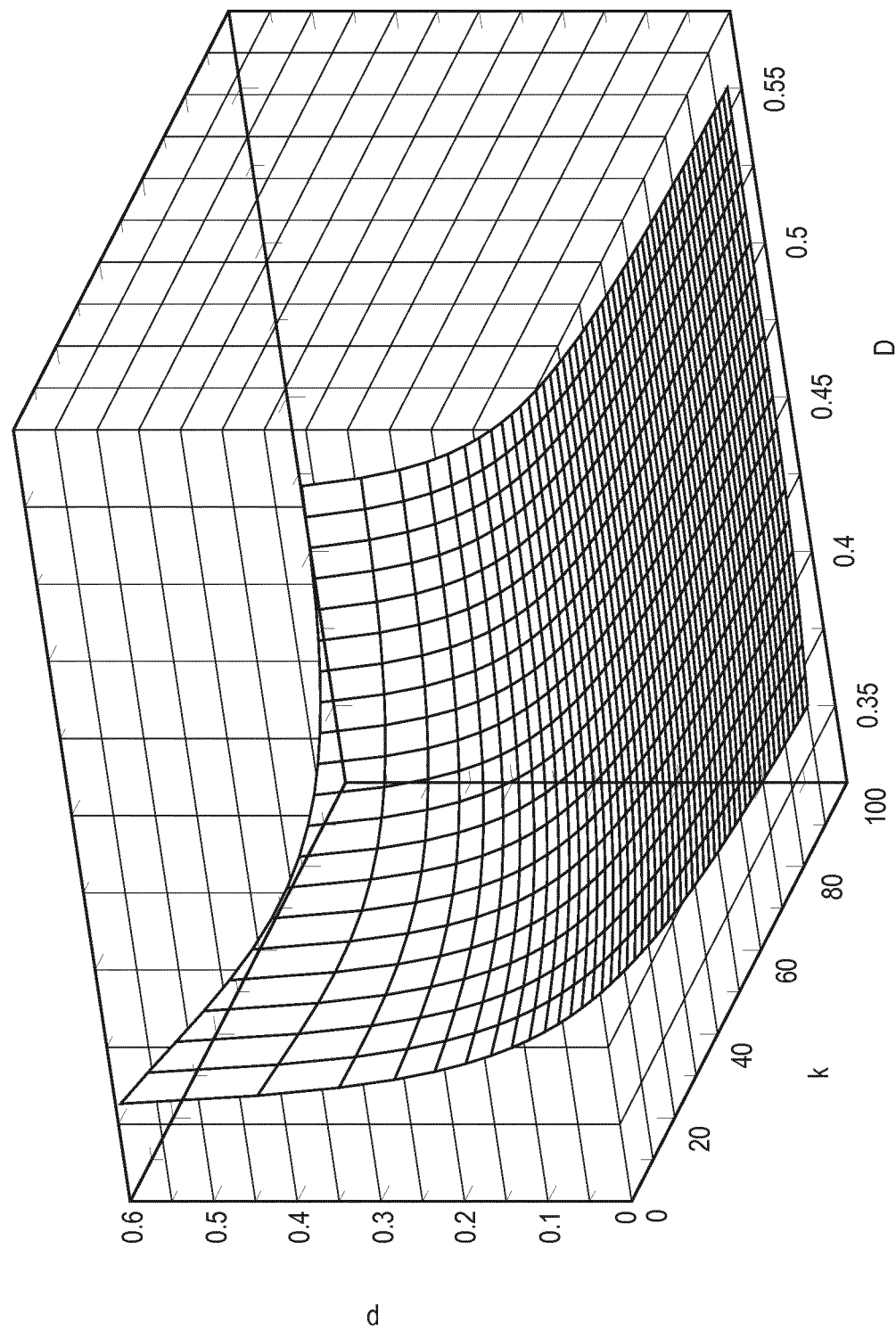
FIGS. 10a and 10b show numerically solved values of p and φ as a function of k and the duty cycle D for q1=4.
Figure 10B:
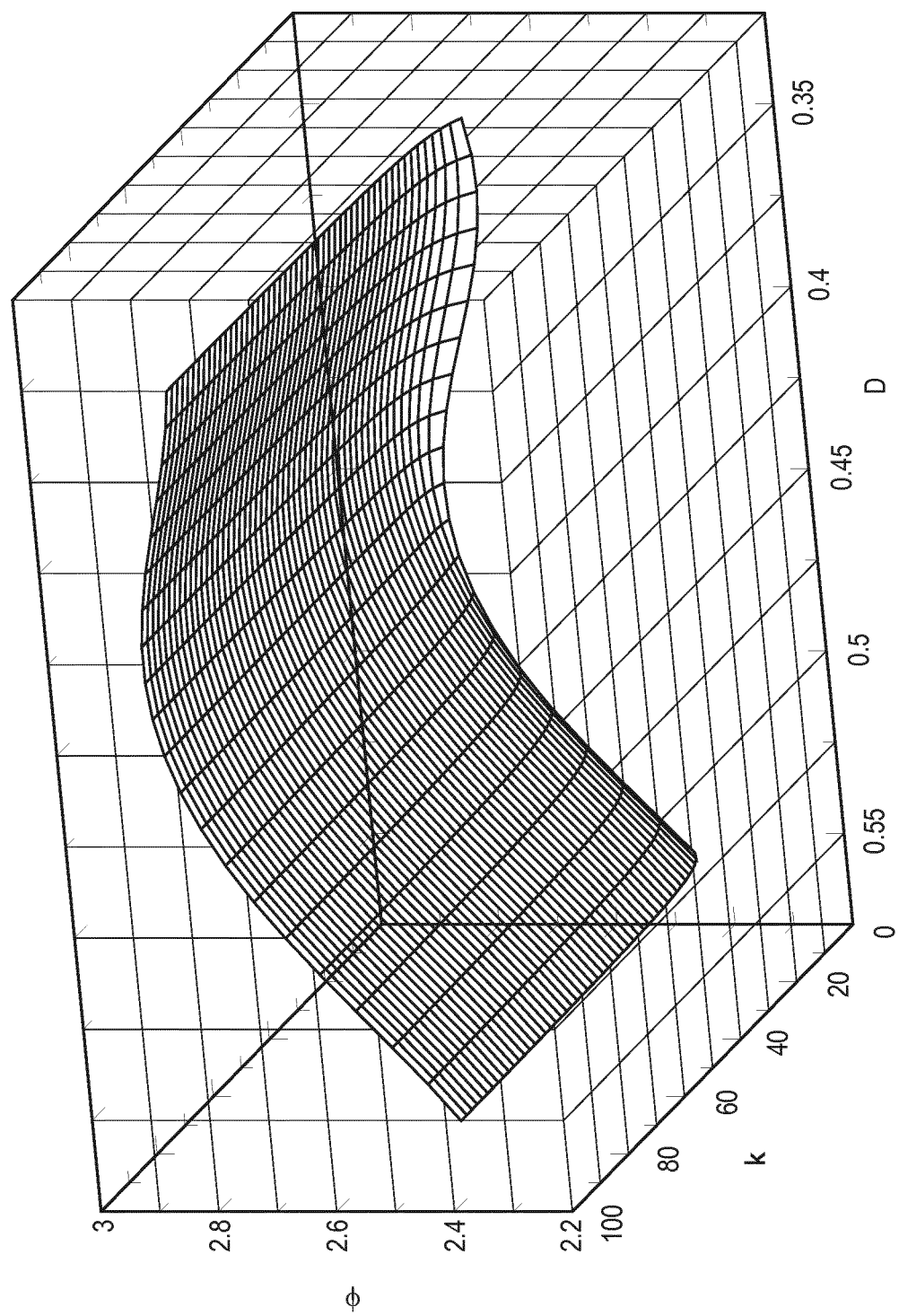

Eqs. 16-19 and Eqs. 23-24 are six simultaneous equations that can be solved numerically to obtain the values of $A_1$, $A_2$, $B_1$, $B_2$, $p$ and $\varphi$ for specific values of q1, duty cycle D and k. FIGS. 8-10 show numerically solved values of p and φ as a function of k and the duty cycle D for q=2, 3 & 4. In particular, FIG. 8 depicts numerically solved values of p and φ for q1=2, FIG. 9 for q1=3 and FIG. 10 for q1=4.

[Voltage and Current Waveforms]

Eq. 22 can be written as $$v_{DS}(\omega t) = \frac{I_{IN}}{\omega C_1} \beta(\omega t) \quad (25)$$

where $$\beta(\omega t) = \int_{2\pi D}^{\omega t} \frac{i_{C_1}}{I_{IN}}(\tau) d\tau. \quad (26)$$

The DC component (or average) of the drain's voltage is equal to the input voltage supply, i.e, $$V_{IN} = \frac{I_{IN}}{2\pi \omega C_1} \int_{2\pi D}^{2\pi} \beta(\omega t) d\omega \tau. \quad (27)$$

By substituting Eq. 27 in Eq. 25, the normalised drain voltage with respect to the input voltage can be written as $$\frac{v_{DS}}{V_{IN}}(\omega t) = \begin{cases} 0 & \text{for } 0 \leq \omega t < 2\pi D \\ \frac{2\pi \beta(\omega t)}{\int_{2\pi D}^{2\pi} \beta(\omega t) d\omega \tau} & \text{for } 2\pi D \leq \omega t < 2\pi \end{cases}. \quad (28)$$

Using Eq. 15 the normalised switch's current with respect to the input DC current can be written as $$\frac{i_S}{I_{IN}}(\omega t) = \begin{cases} 1 - p(k+1)\sin(\omega t + \phi) - \\ (A_1 \cos(q_1 \omega t) + B_1 \sin(q_1 \omega t)) & \text{for } 0 \leq \omega t < 2\pi D \\ 0 & \text{for } 2\pi D \leq \omega t < 2\pi \end{cases}. \quad (29)$$

Figure 11:
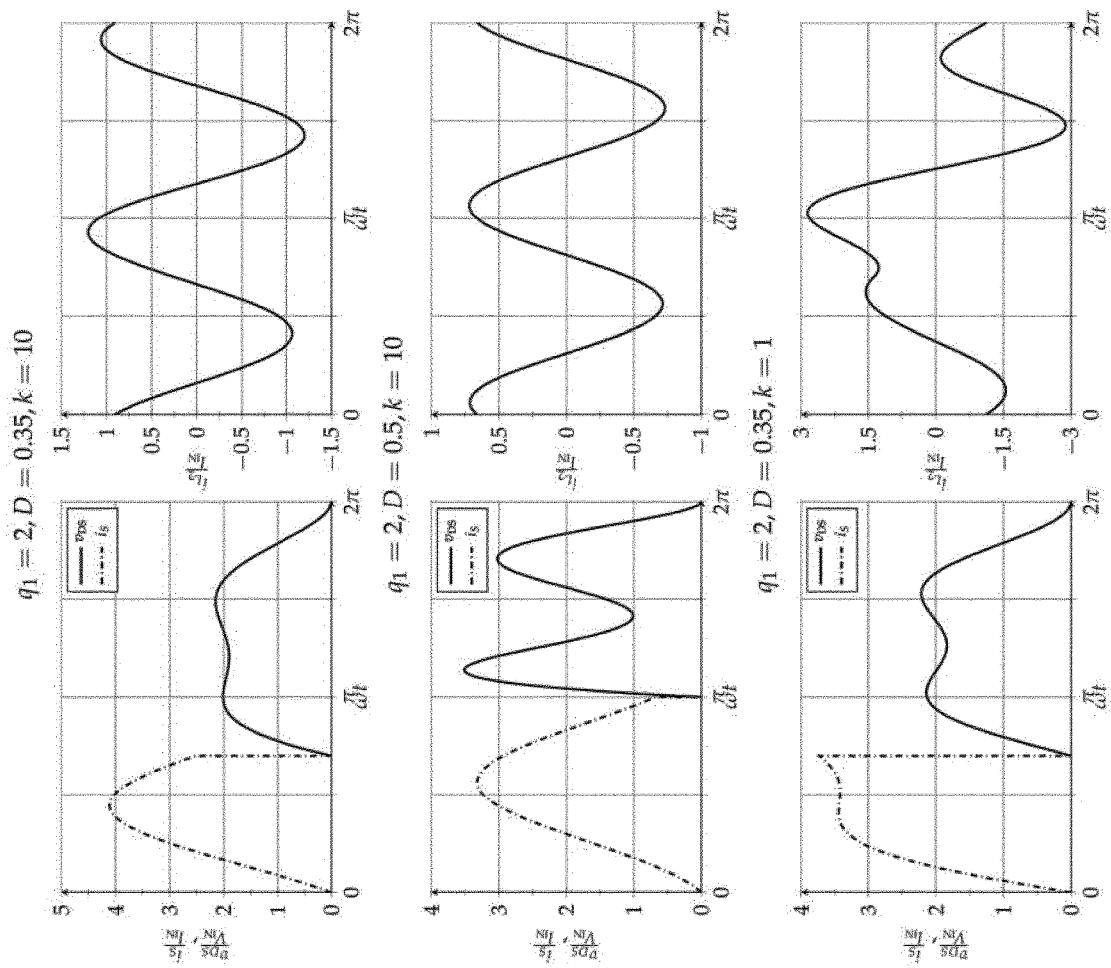
FIG. 11 shows switch's voltage and current waveforms and the current of inductor $L_2$ for selected values of duty cycle and k for q1=2.
Figure 12:
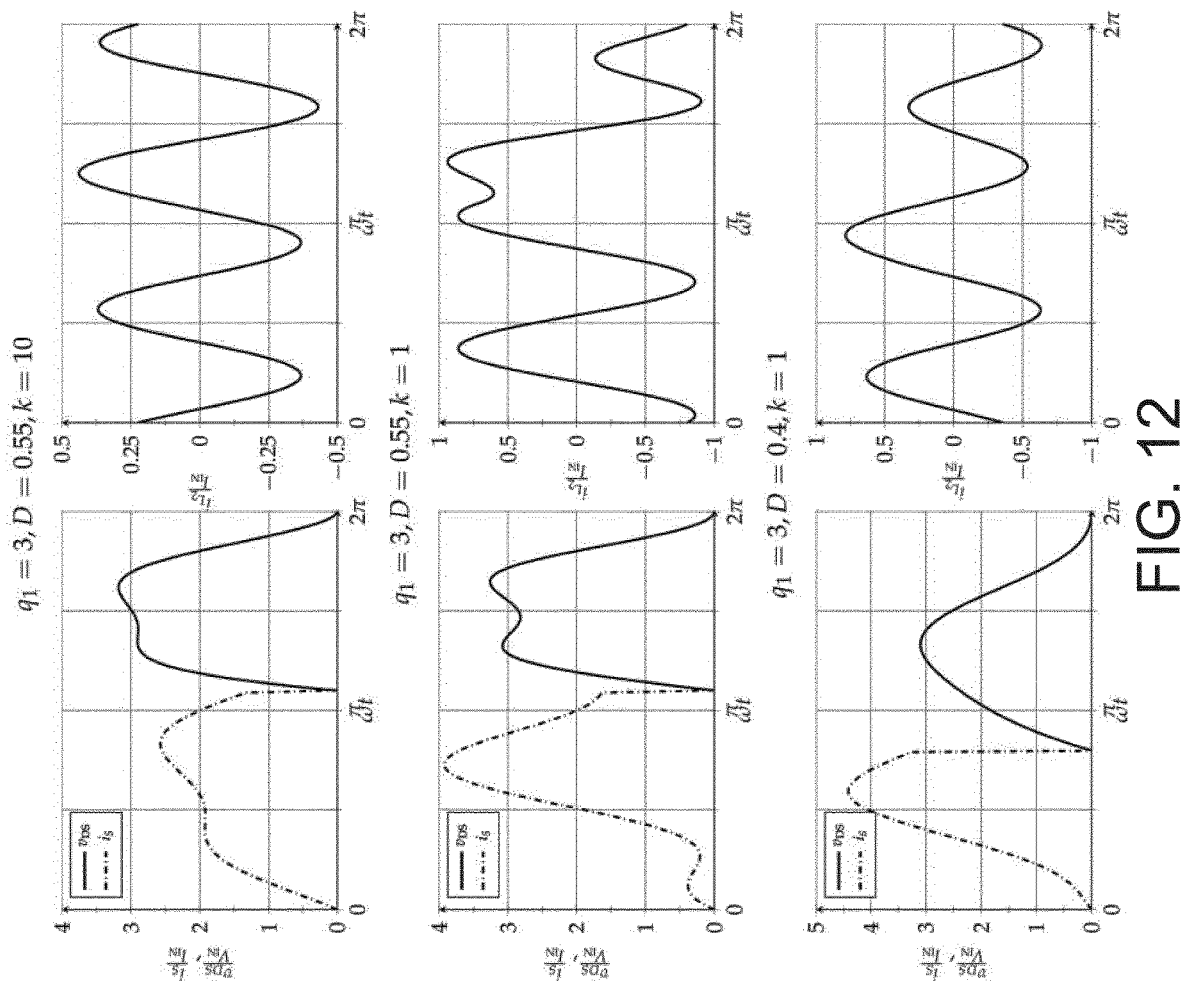
FIG. 12 shows switch's voltage and current waveforms and the current of inductor $L_2$ for selected values of duty cycle and k for q1=3.
Figure 13:
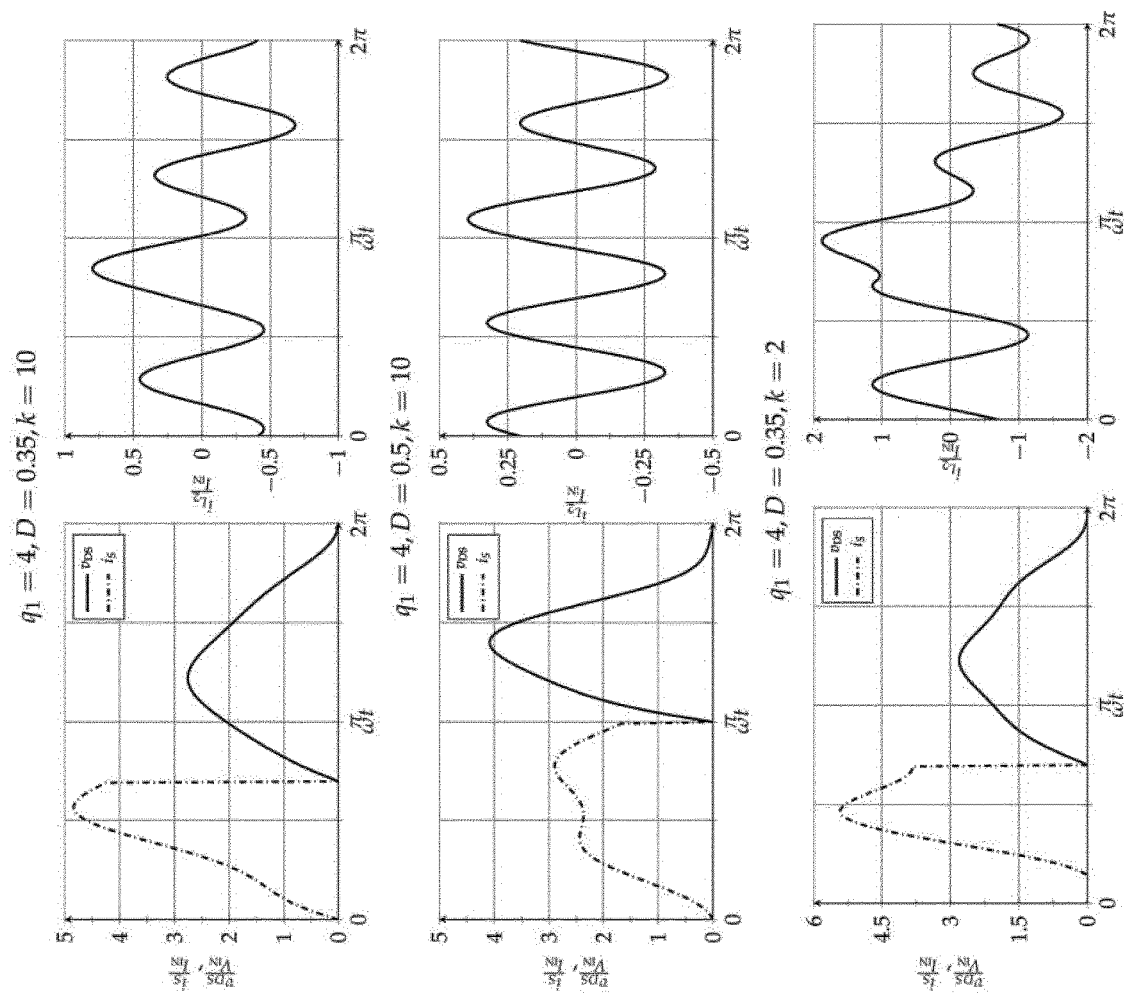
FIG. 13 shows switch's voltage and current waveforms and the current of inductor $L_2$ for selected values of duty cycle and k for q1=4.

By using the numerical solutions for $A_1$, $A_2$, $B_1$, $B_2$, p and φ, the voltage and current waveforms throughout the inverter can be plotted for given values of q1, duty cycle and k. FIGS. 11-13 show switch's voltage and current waveforms and the current of inductor $L_2$ for selected values of q1, duty cycle and k. In particular, FIG. 11 depicts voltage and current waveforms at difference duty cycle and k values for q1=2, FIG. 12 for q1=3 and FIG. 13 for q1=4.

It can be noticed from the plotted waveforms that the switch's peak drain voltage and peak drain current and the shape of their waveform change according to the duty cycle. As the duty cycle decreases the switch's peak drain voltage increases and its peak drain current decreases. The switch's peak drain voltage decreases and its peak drain current increase as the duty cycle increases. The shape of the current through inductor $L_2$ is mainly affected by the value of k. The current is almost sinusoidal at high k values and its frequency ratio to the switching frequency is equal to the value q1 over the entire switching period. The current becomes less sinusoidal, or contains additional harmonics, at low k values. For the case when q1=2 the slope of the switch's current at the instant when it is turned OFF is positive at a higher k, and is negative at a lower k.

[Input DC Resistance]

The DC component (or average) of the switch's current is equal to the DC input current, hence $$\frac{1}{2\pi}\int_0^{2\pi}\frac{i_S}{I_{IN}}(\omega t)d\omega t = 1 = \frac{p}{2\pi}(\cos(2\pi D+\phi)-\cos\phi)(k+1) + \quad (30)$$
$$D - \frac{1}{2\pi q_1}(A_1\sin(2\pi Dq_1)+2B_1\sin^2(\pi Dq_1)).$$

Solving Eq. 30 for p $$p = \frac{2\pi(1-D)+\frac{A_1}{q_1}\sin(2\pi Dq_1)+\frac{2B_1}{q_1}\sin^2(\pi Dq_1)}{(k+1)(\cos(2\pi D+\phi)-\cos\phi)}. \quad (31)$$

Substituting Eq. 31 in Eq. 15 gives the normalised value of $i_m$ with respect to the input DC current $$\frac{i_m}{I_{IN}} = \frac{2\pi(1-D)+\frac{A_1}{q_1}\sin(2\pi Dq_1)+\frac{2B_1}{q_1}\sin^2(\pi Dq_1)}{\cos(2\pi D+\phi)-\cos\phi}. \quad (32)$$

All the power supplied by the source will be consumed in the load, thus $$P_{IN} = P_o \quad (33)$$
$$V_{IN}I_{IN} = \frac{1}{2}i_m^2 R_L.$$

Rearranging the above equation and using Eq. 33 gives in the input DC resistance seen y the source $$\frac{V_{IN}}{I_{IN}} = R_{DC} = \frac{1}{2}\left(\frac{i_m}{I_{IN}}\right)^2 R_L \quad (34)$$

$$\frac{R_{DC}}{R_L} = \frac{1}{2}\left(\frac{2\pi(1-D)+\frac{A_1}{q_1}\sin(2\pi Dq_1)+\frac{2B_1}{q_1}\sin^2(\pi Dq_1)}{\cos(2\pi D+\phi)-\cos\phi}\right)^2. \quad (35)$$

Figure 14A:
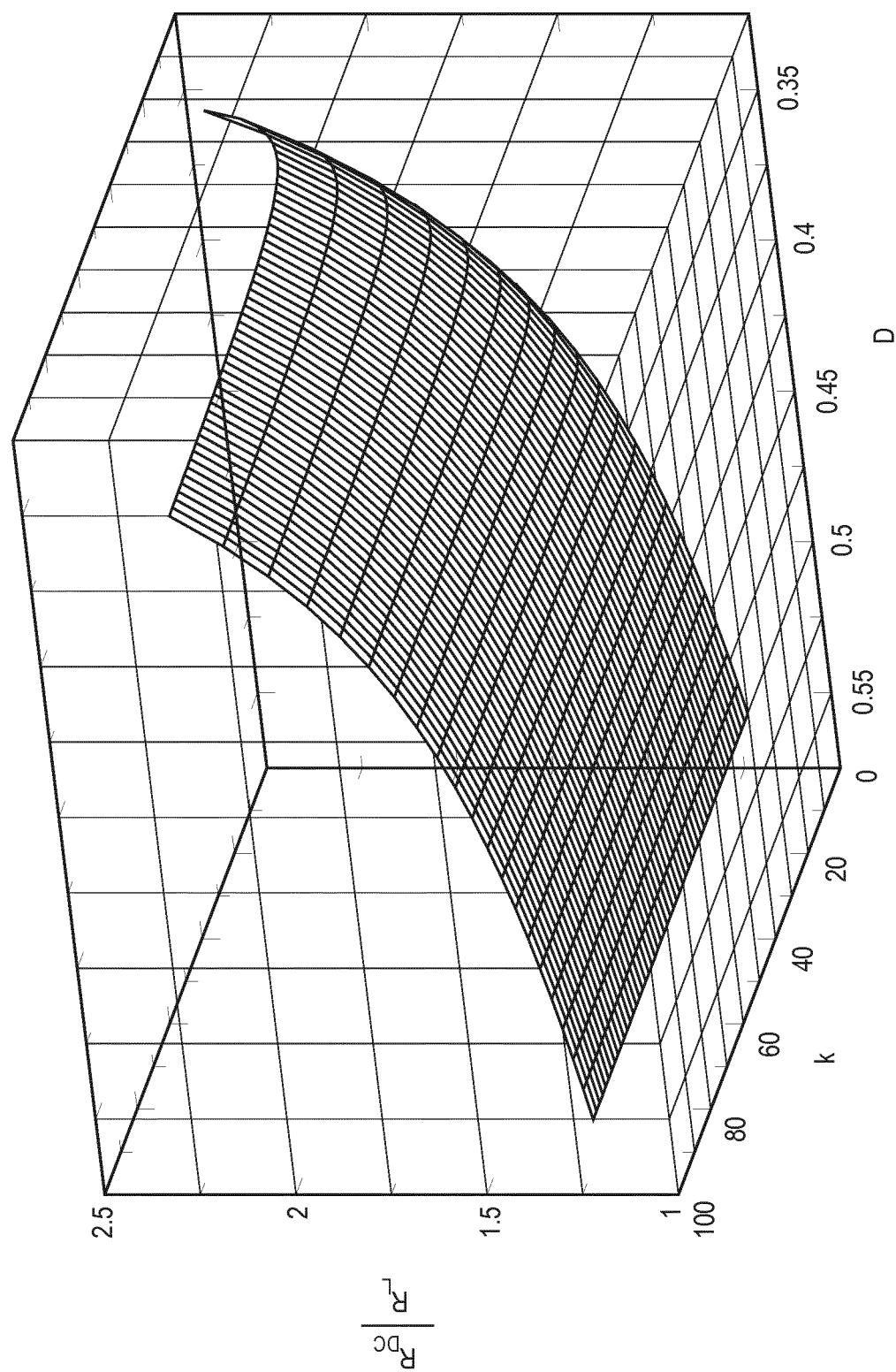
FIGS. 14a-14c show the variation of the normalised DC resistance with duty cycle and k. For FIG. 14a, q1=2, FIG. 14b with q1=3 and FIG. 14c q1=4.
Figure 14B:
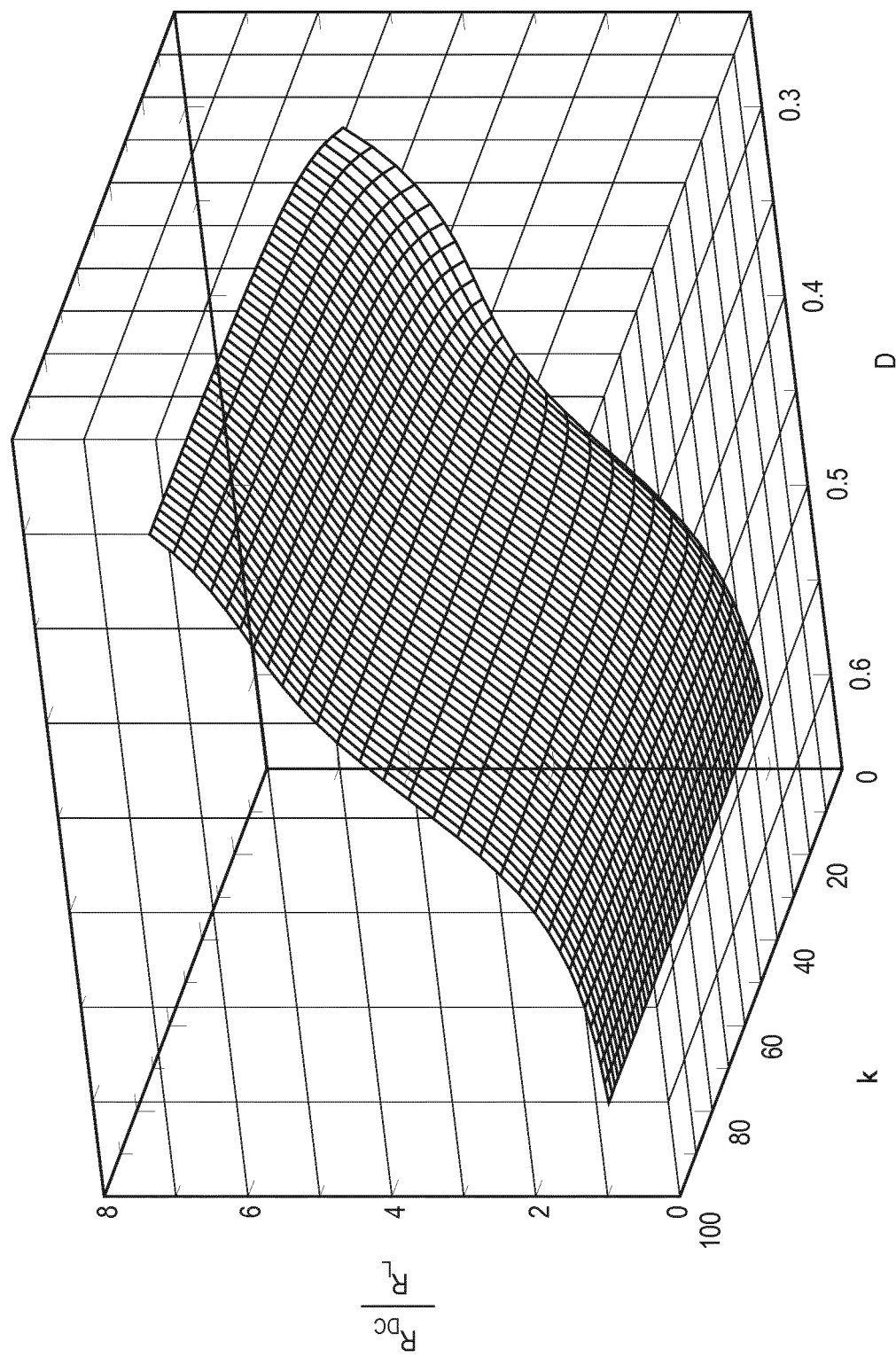
Figure 14C:
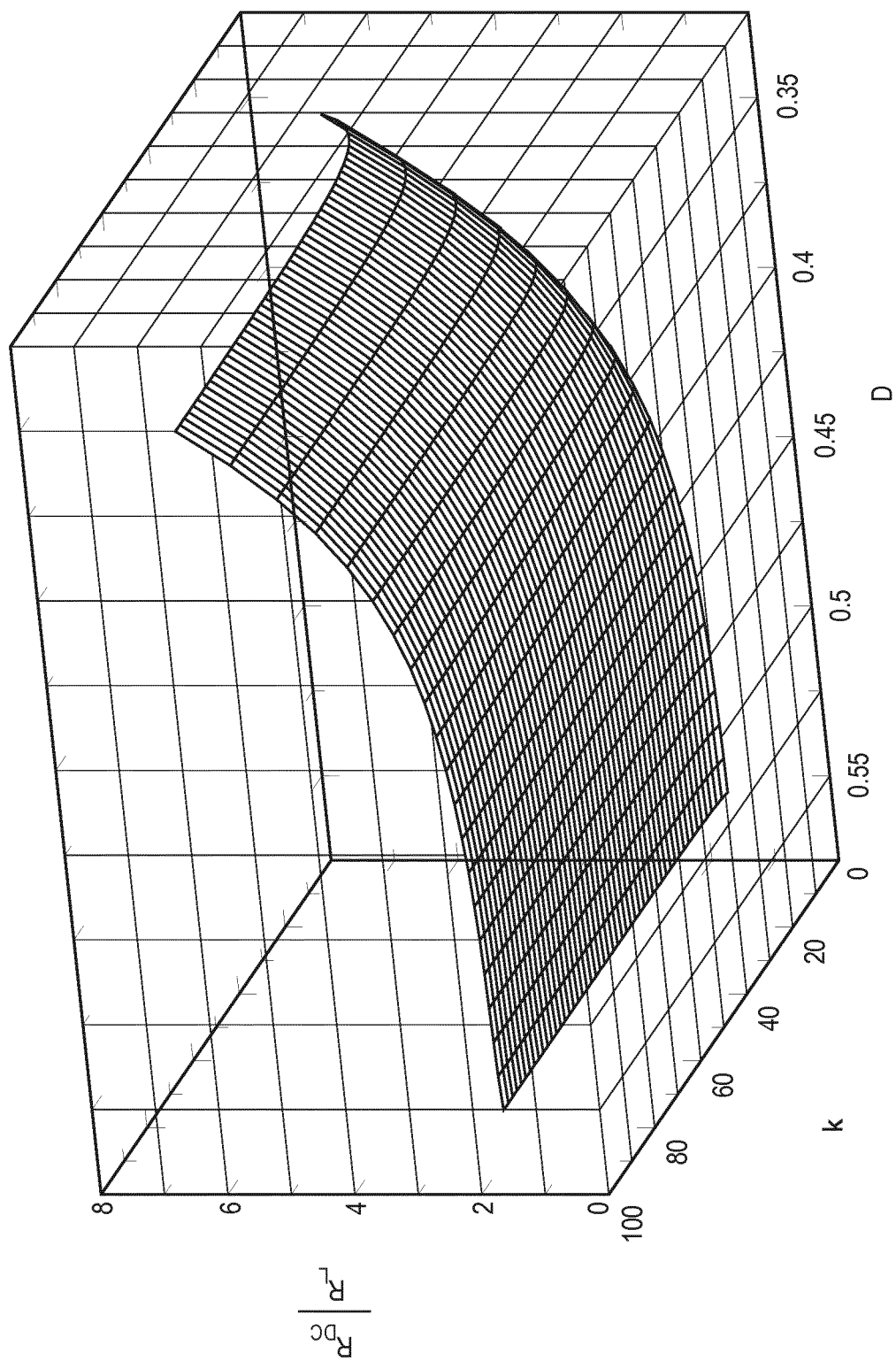

FIG. 14 shows the variation of the normalised DC resistance with duty cycle and k. For FIG. 14a, q1=2, FIG. 14b with q1=3 and FIG. 14c with q1=4. It can be noticed that the value of k has a small effect on the DC resistance whereas the duty cycle has a much more significant effect.

[Voltage and Current Stresses]

The peak voltage across the switch can be calculated by differentiation Eq. 28 and setting it to zero $$\frac{d\frac{v_{DS}}{V_{IN}}(\omega t)}{d\omega t} = 0 \quad (36)$$

which leads to the following equation $$\frac{d\beta(\omega t)}{d\omega t} = \frac{i_{C_1}}{I_{IN}}(\omega t) = 0. \quad (37)$$

An explicit solution does not exist for Eq. 37, it can however be solved numerically for specific values of q1, duty cycle and k. Another approach to determine the peak voltage across the switch is to search for a value for ωt that maximises the switch's voltage. The Matlab function fminbnd( ) can be used to determine the switch voltage peaks for a certain q1 value over a duty cycle range and a k.

The peak switch current can either occur during the switch ON period 0≤ωt<2πD or at the end of the switch ON period ωt=2πD. The peak switch current during the switch ON period can be obtained by differentiating Eq. 29 and Setting it to zero and solved for ωt $$\frac{d\frac{i_S}{I_{IN}}(\omega t)}{d\omega t} = 0. \quad (38)$$

Figure 15A:
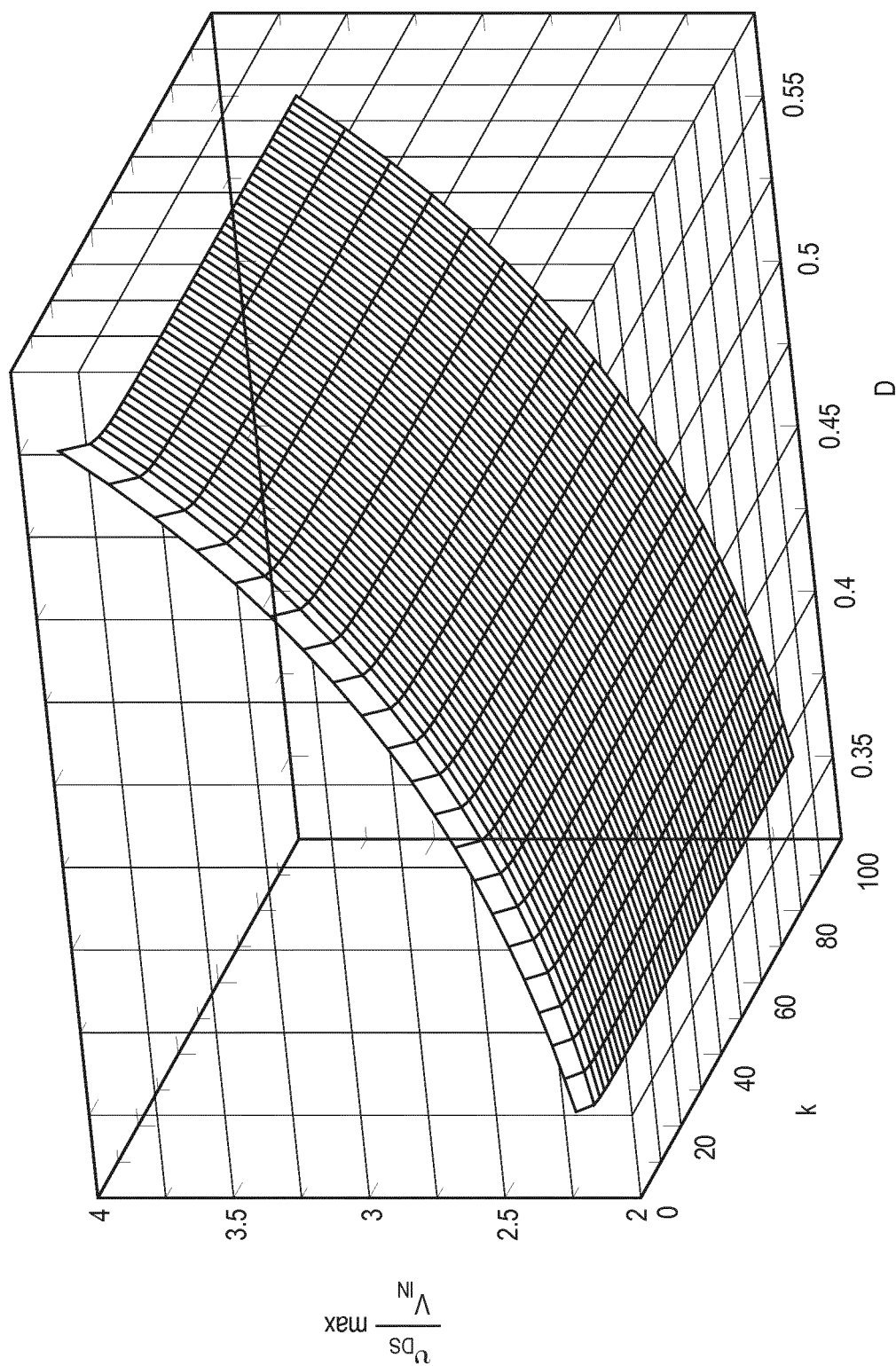
FIGS. 15a and 15b depict maximum switch voltage and current for q1=2.
Figure 15B:
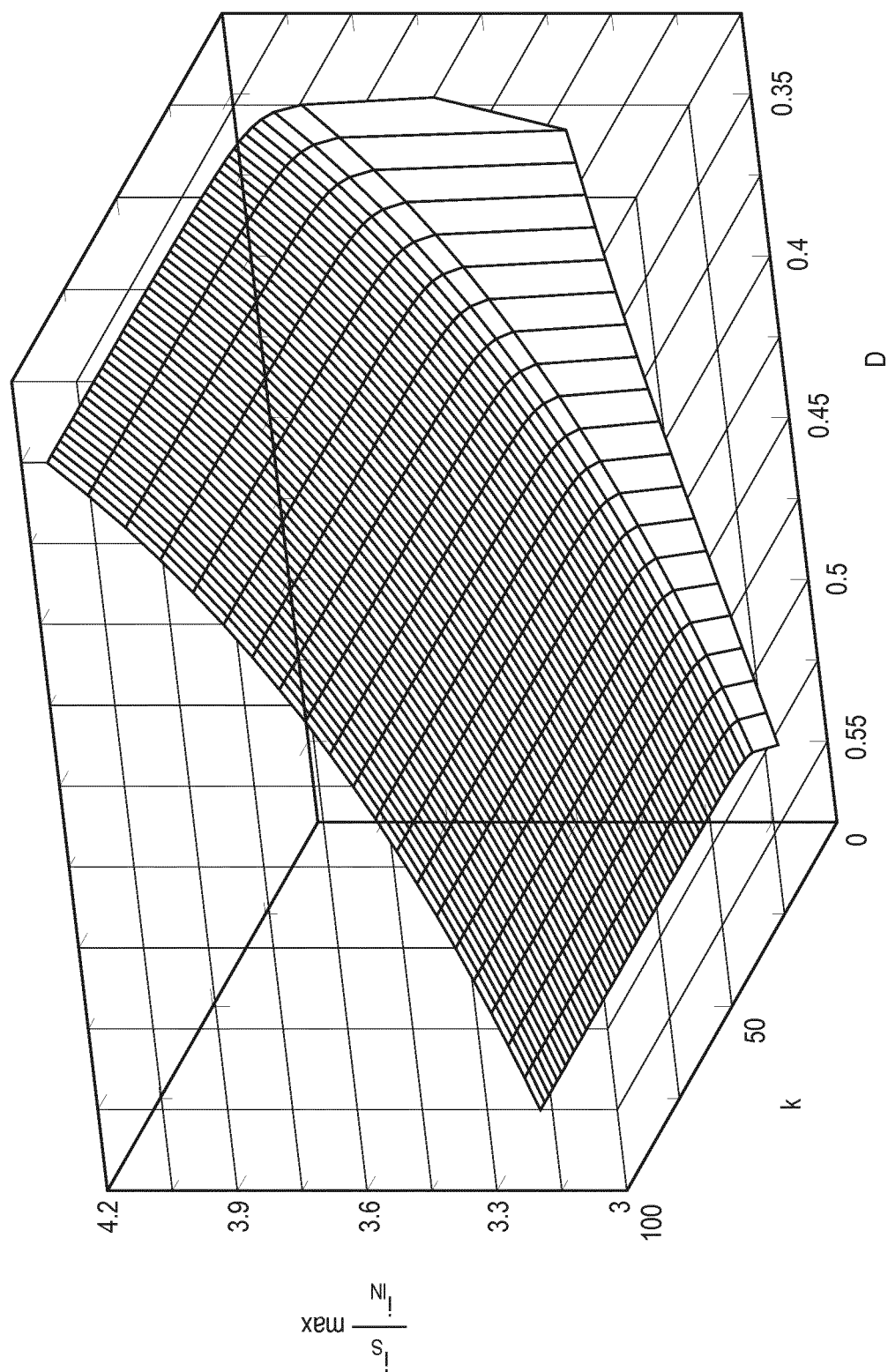
Figure 16A:
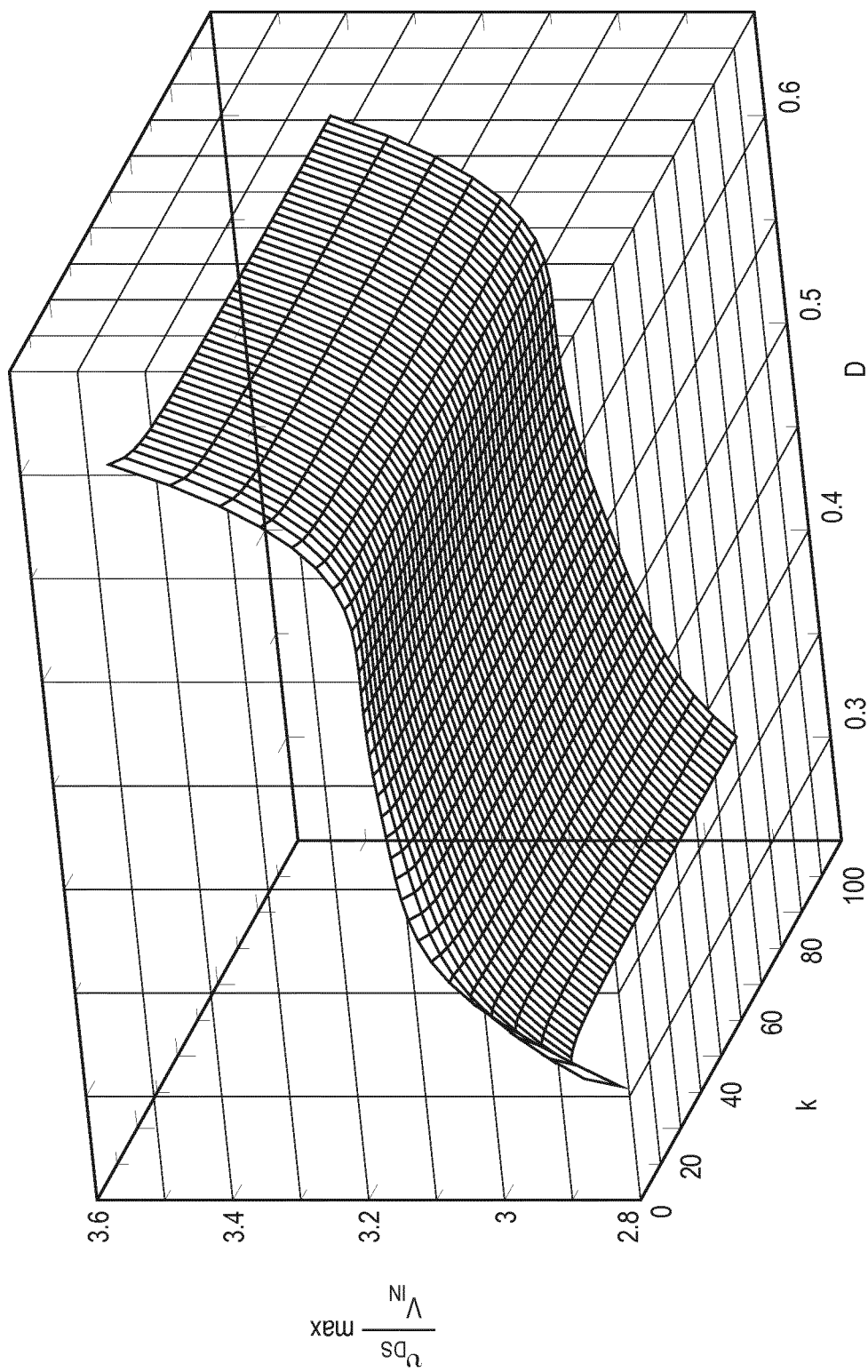
FIGS. 16a and 16b depict maximum switch voltage and current for q1=3.
Figure 16B:
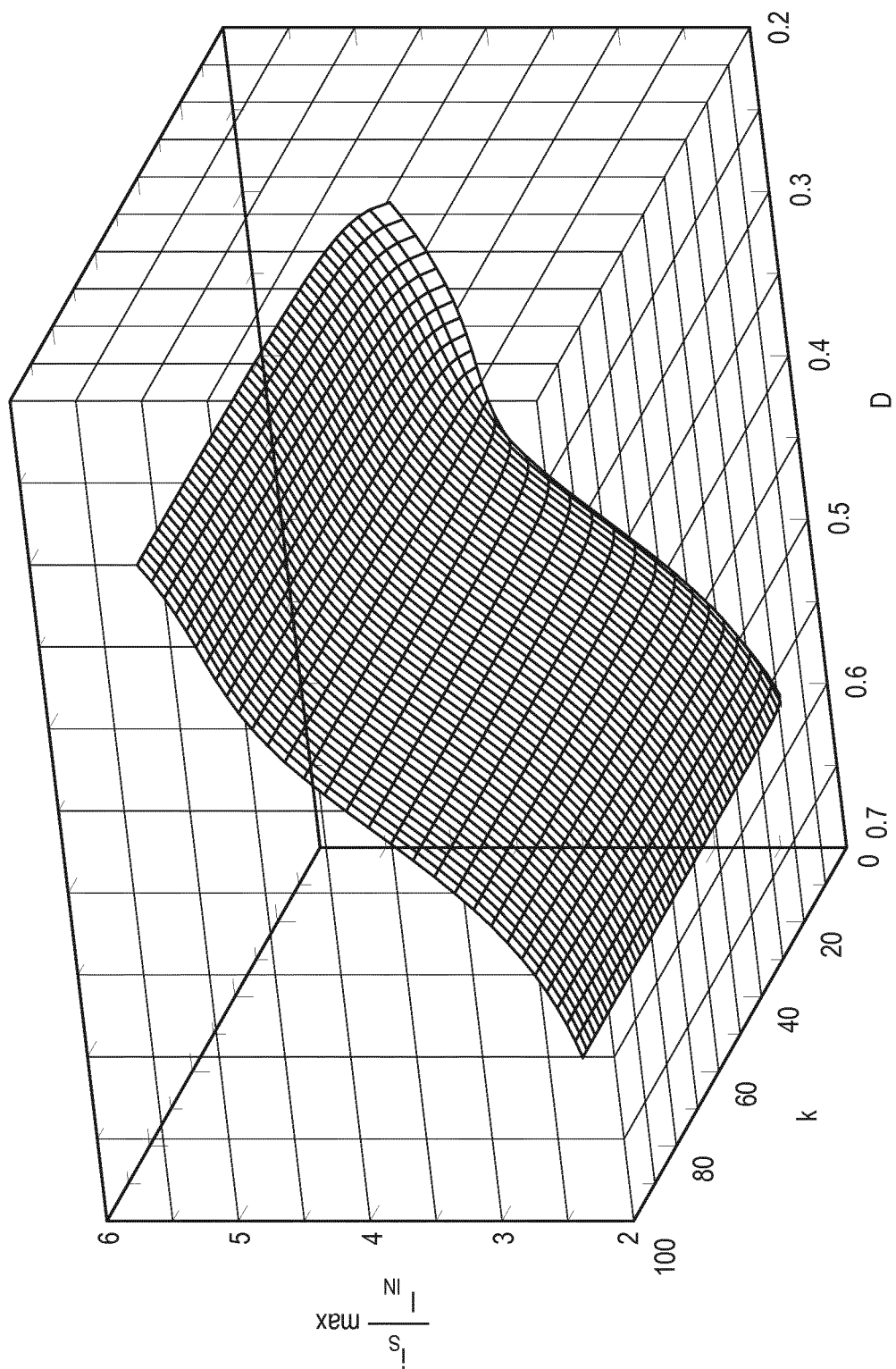
Figure 17A:
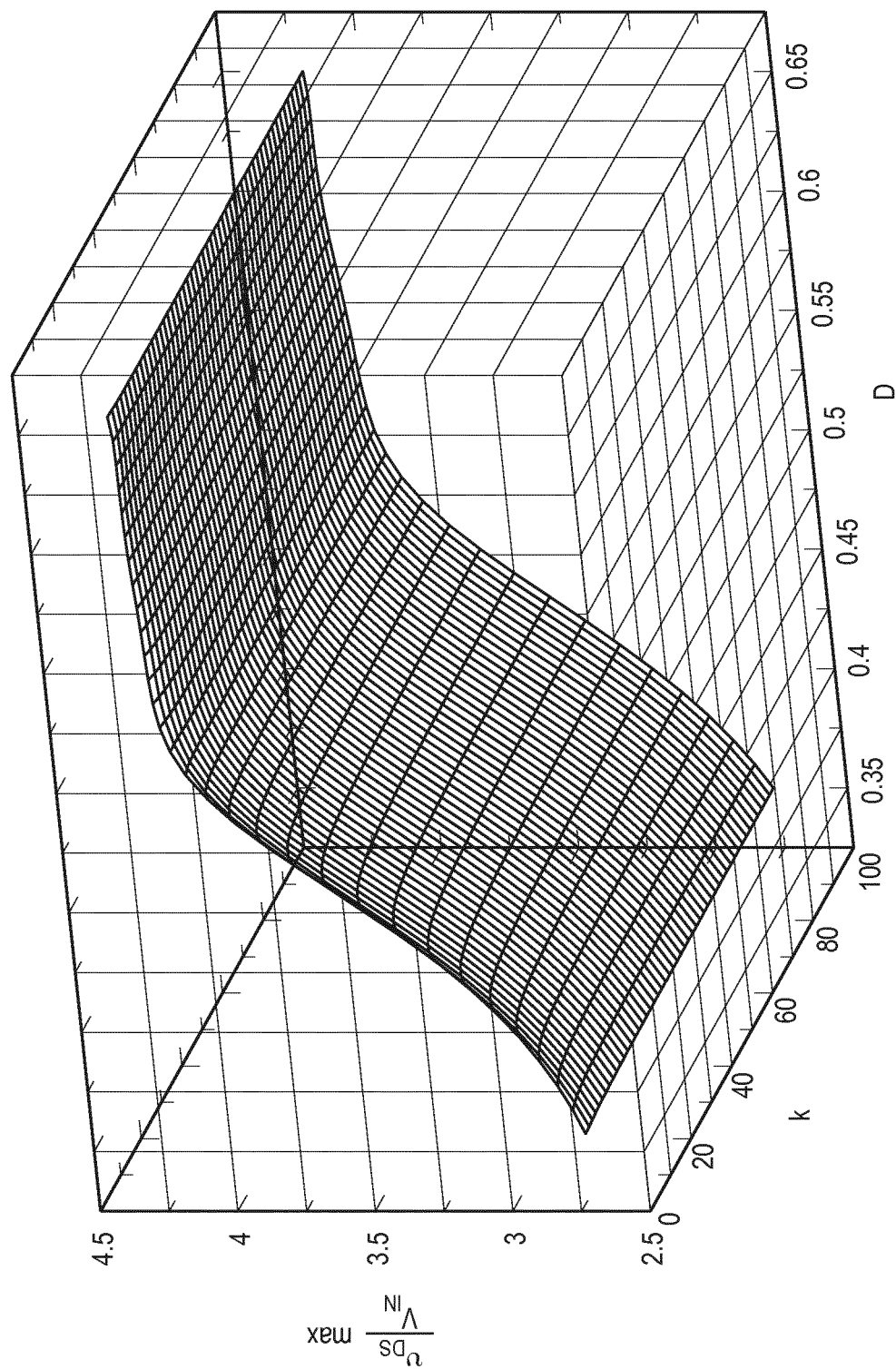
FIGS. 17a and 17b depict maximum switch voltage and current for q1=4.
Figure 17B:
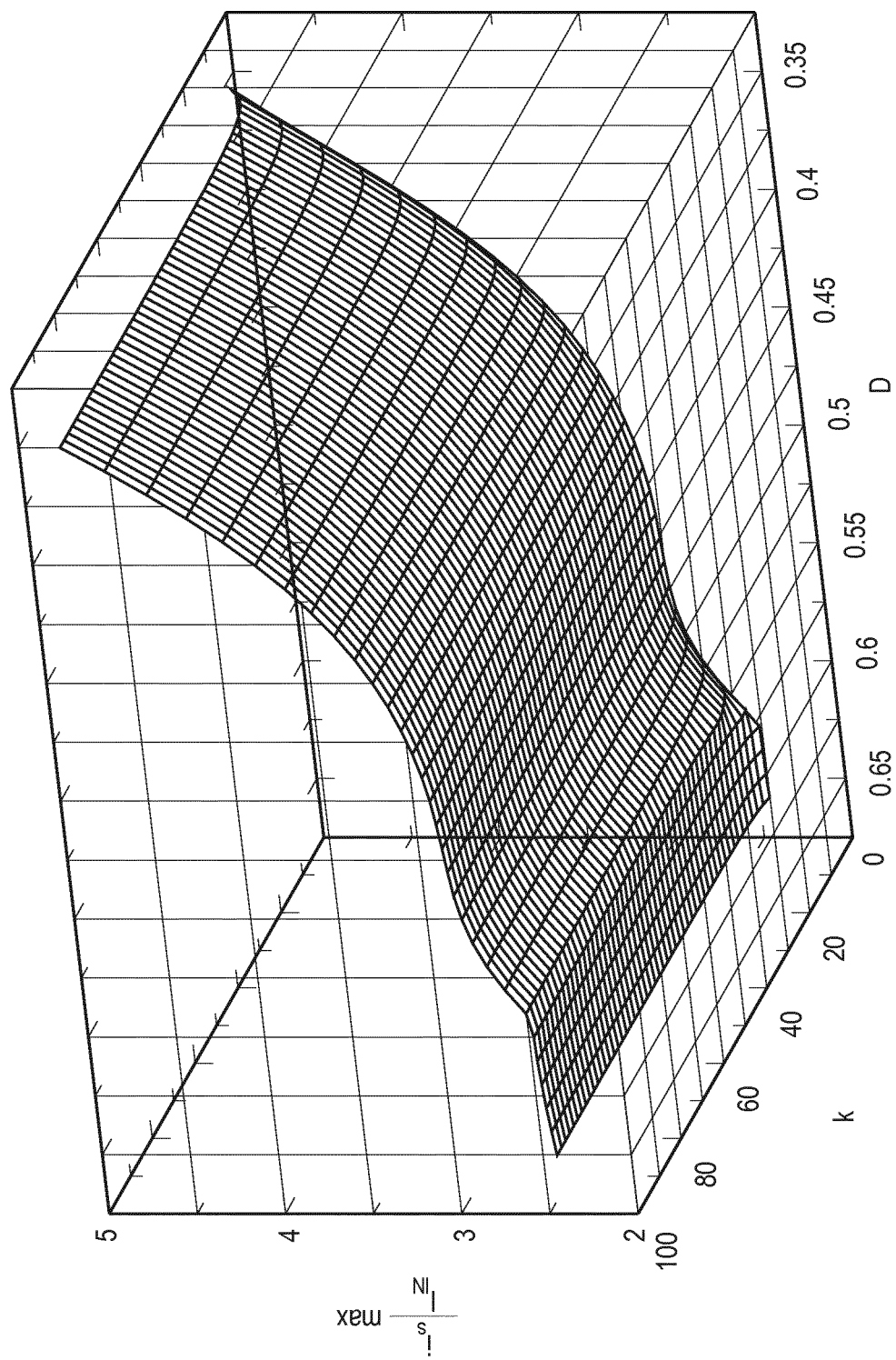

The calculated value of ωt should be substituted back into Eq. 29 and the evaluated peak switch current should be compared with the switch's current value at ωt=2πD and the switch's maximum current is the greater value of the two. Alternatively, the peak switch current can be found by searching for a value for ωt that maximises the switch's current. FIGS. 15-18 show that the switch's maximum voltage and current normalised with respect to the input voltage and input DC current respectively for q1=2, q1=3 and q1=4. In particular FIG. 15a depicts max switch voltage for q1=2, FIG. 16a for q1=3 and FIG. 17a for q1=4. FIG. 15b depicts max switch current q1=2, FIG. 16b for q1=3 and FIG. 17b for q1=4. It can be noted from the figures that large values of k have a slight effect on the peak values of the switch's voltage and current whereas the duty cycle has a much more significant effect.

[Power Output Capability]

The power output capability is defined as the ratio of the output power to the maximum voltage and current stresses of the switch. It is an indication of the switch utilization for a certain output power. It can be represented as $$c_p = \frac{P_o}{v_{DSmax}i_{Smax}}. \quad (39)$$

Since it has been assumed that the is ideal therefore all the power supplied by the source is consumed in the load, the output power capability can be written as $$c_p = \frac{V_{IN}I_{IN}}{v_{DSmax}i_{Smax}}. \quad (40)$$

Figure 18A:
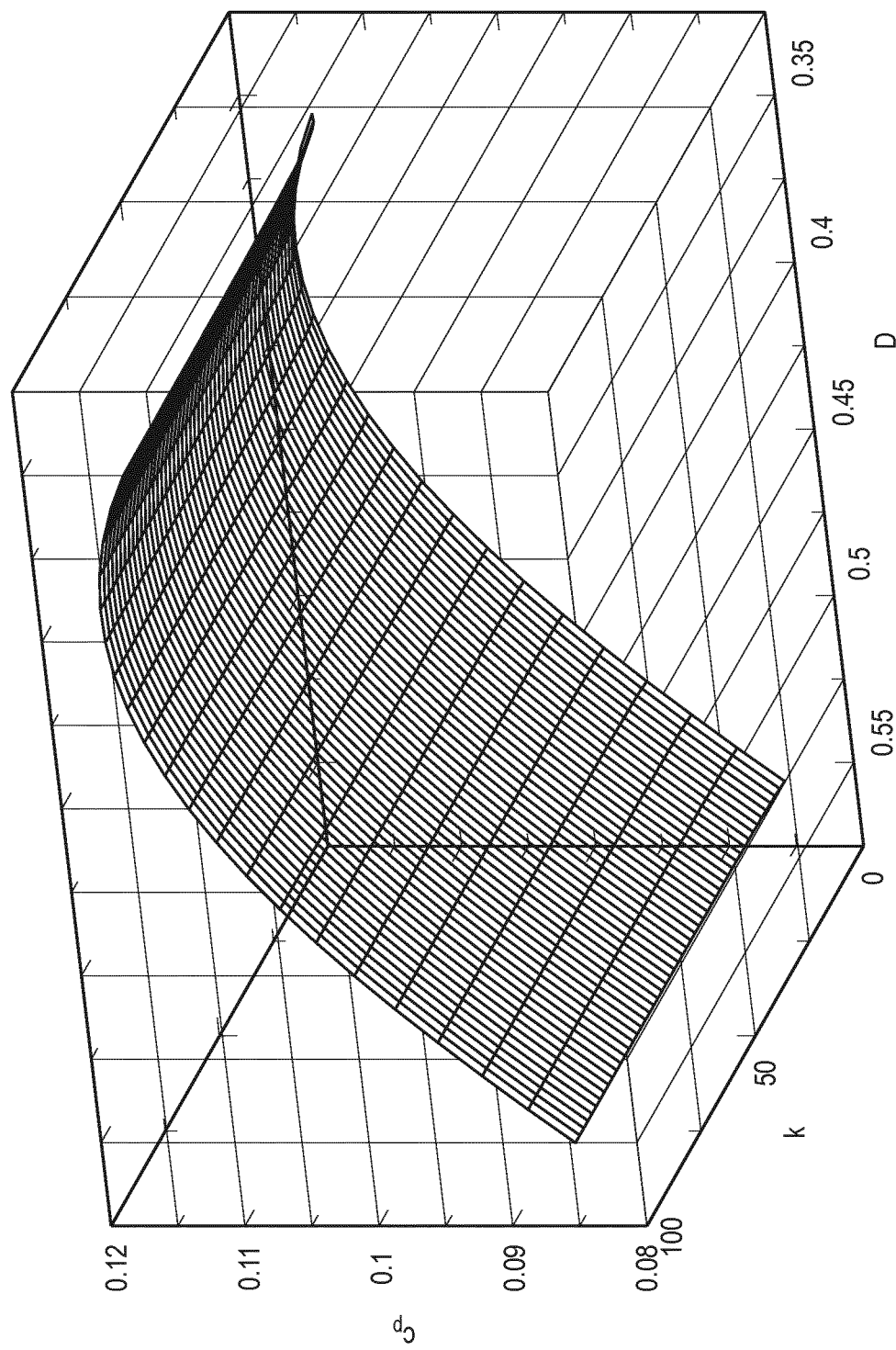
Figure 18B:
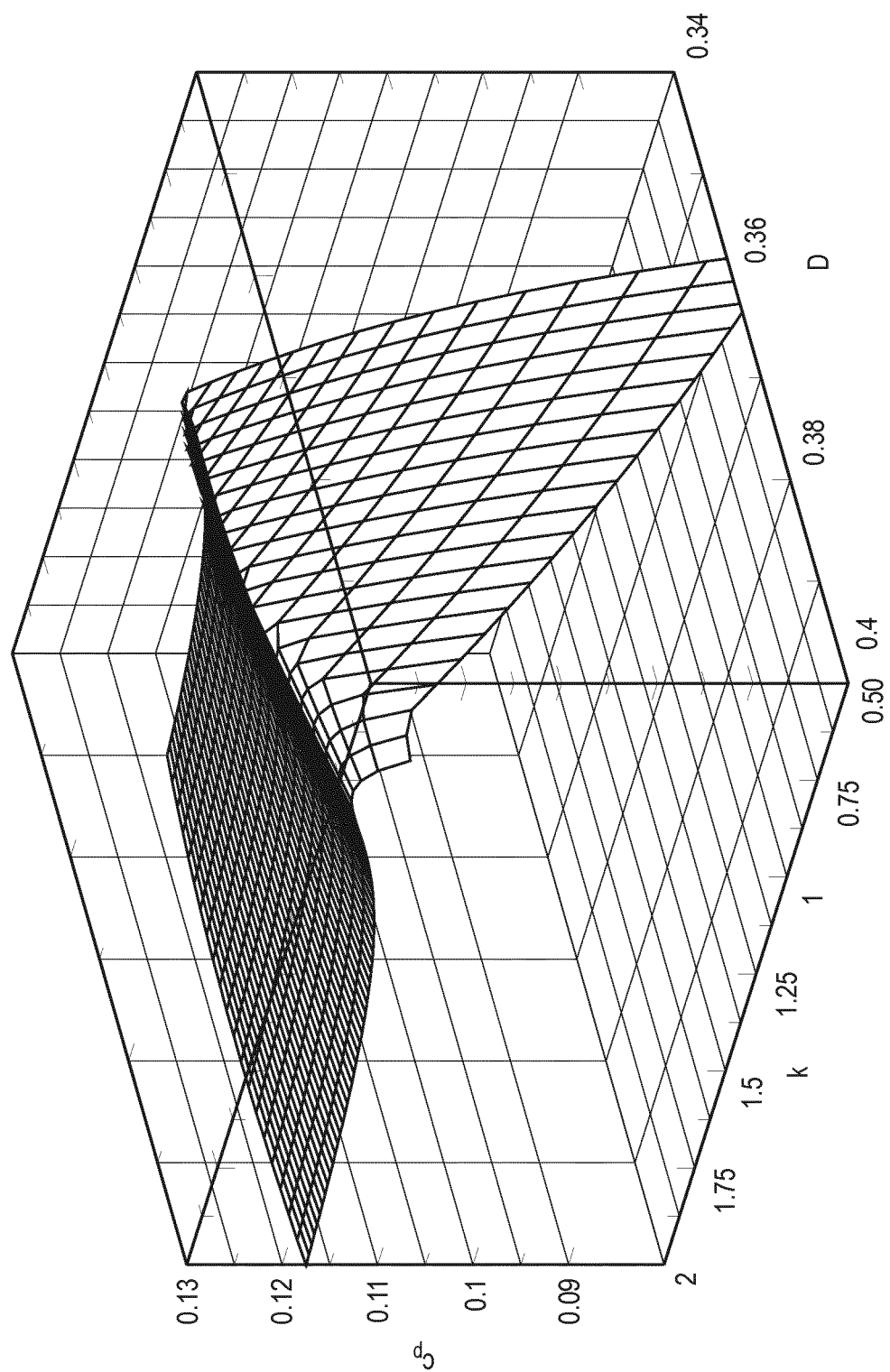
Figure 19A:
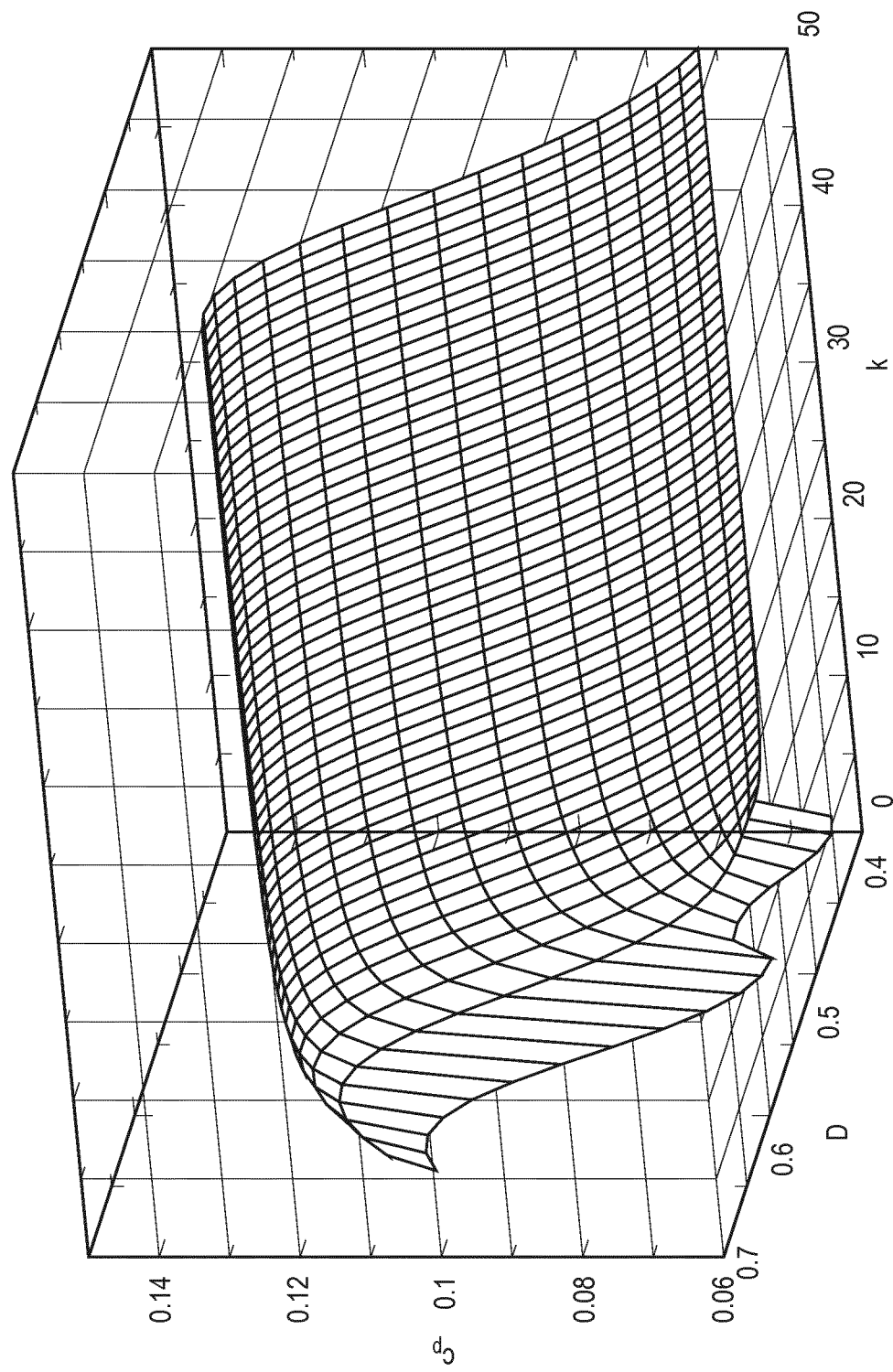
FIGS. 19a and 19b depict the variation of output power capability for q1=3.
Figure 19B:
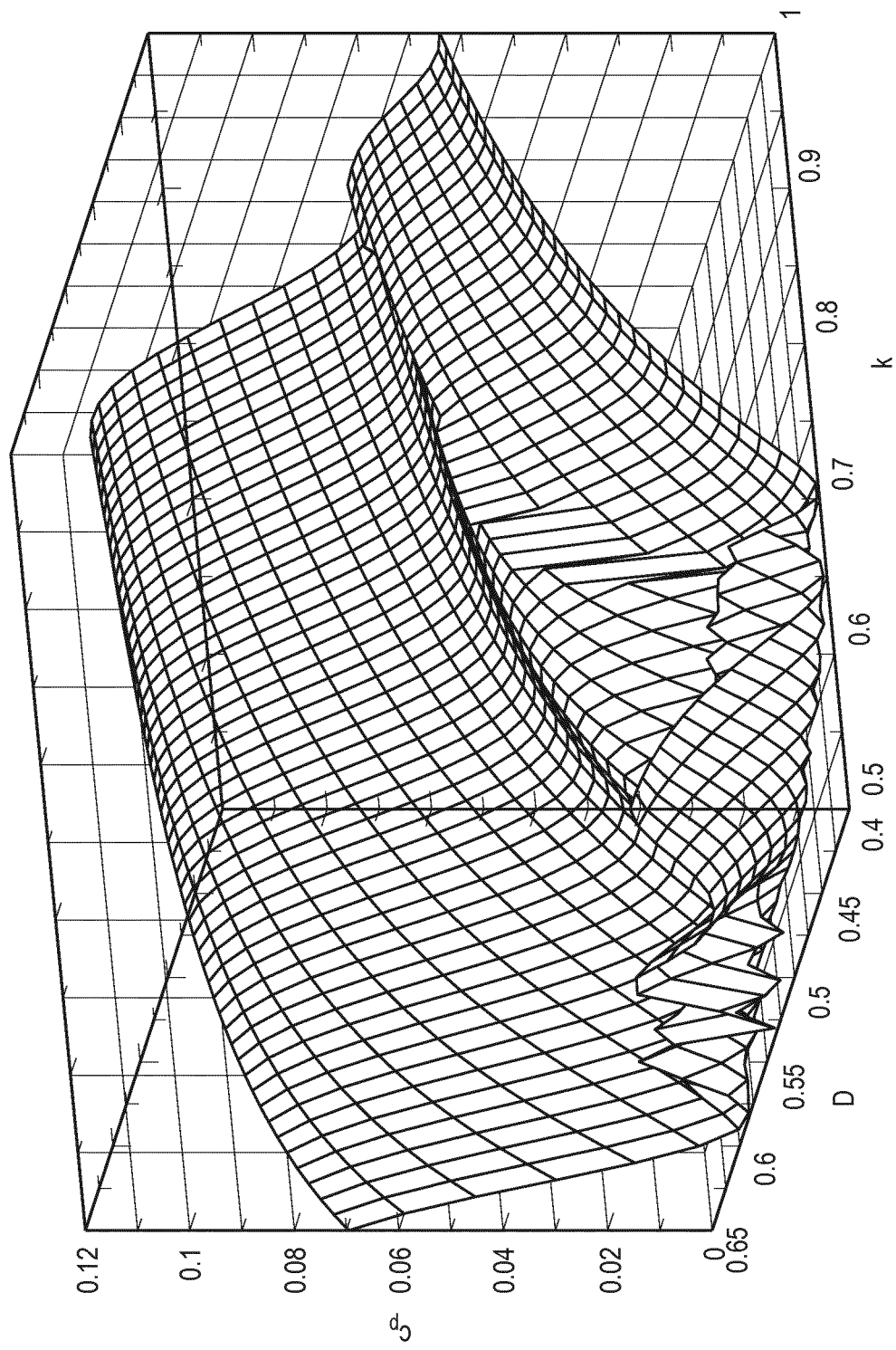
Figure 20A:
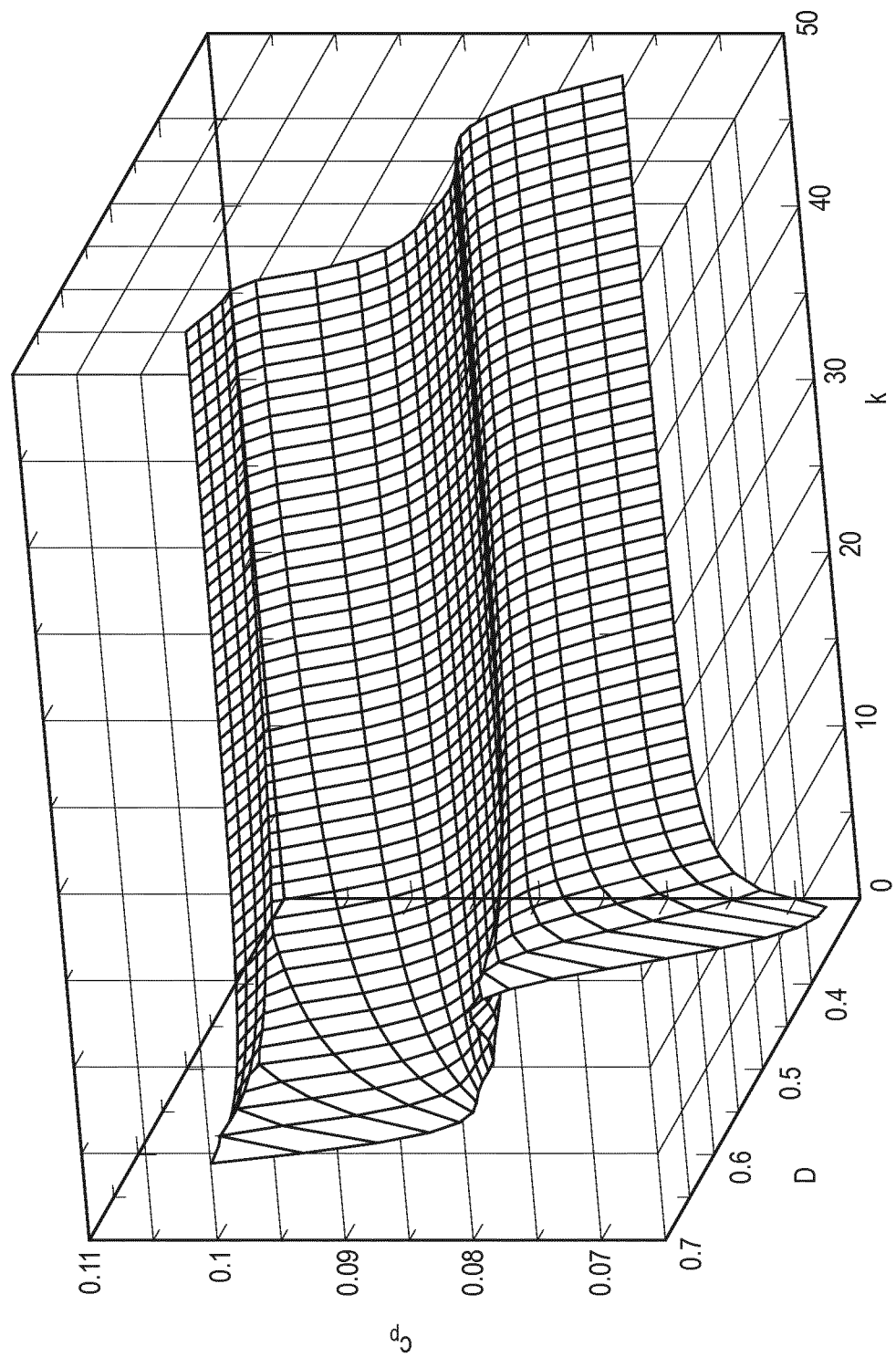
FIGS. 20a and 20b depict the variation of output power capability for q1=4.
Figure 20B:
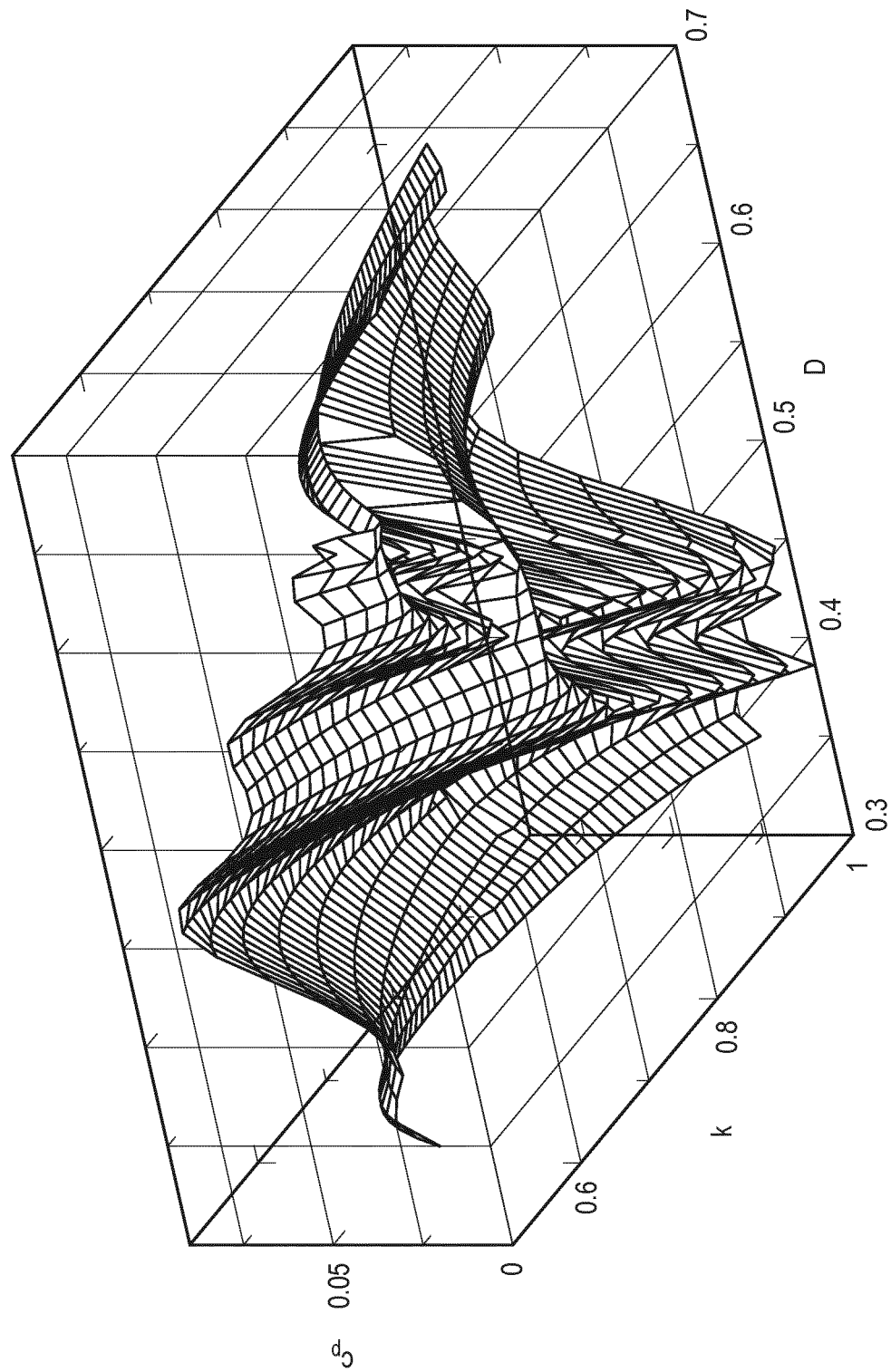

Using the solutions obtained from Eq. 37 & 38 the output power capability can be calculated for specific values of q1. FIGS. 18-20 show the variation of the output power capability with duty cycle and k for q1=2, q1=3, q1=4. In particular, FIGS. 18a and 18b show the variation of output power capability for q1=2. FIG. 18c depicts a graphical solution for 80% of the maximum output power capability level according to that depicted in FIG. 18b. Similarly, FIG. 18d depicts 90% of the maximum output power capability level according to that depicted in FIG. 18b. FIGS. 19a and 19b for q1=3. FIGS. 20a and 20b for q1=4.

[Design Equations and Special Cases for the Class EF2 Inverter]

[Power Output Capability as a Function of k]

Figure 21A:
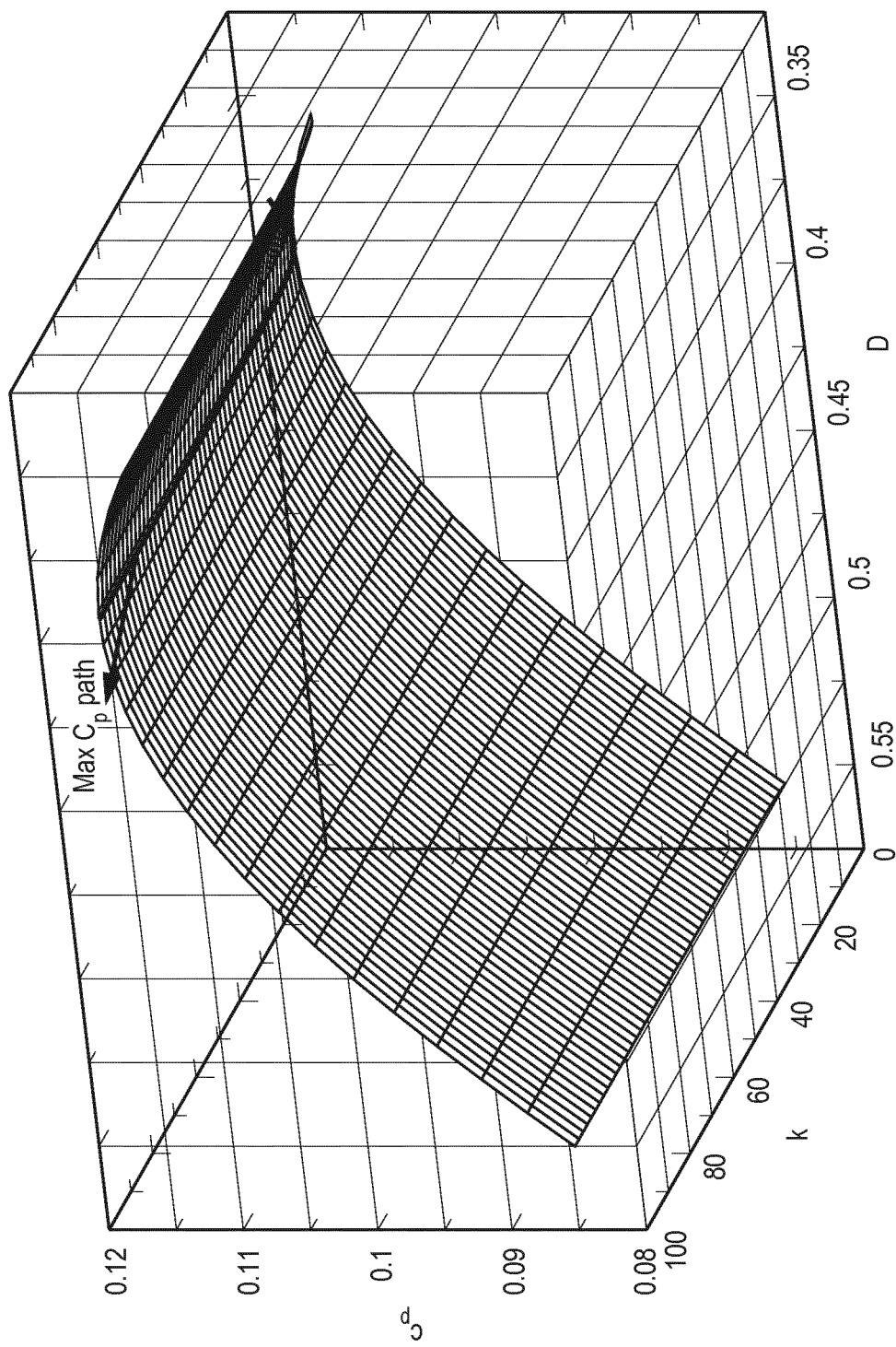
FIGS. 21a and 21b depict the path of maximum output capability as k and the duty cycle vary.
Figure 21B:
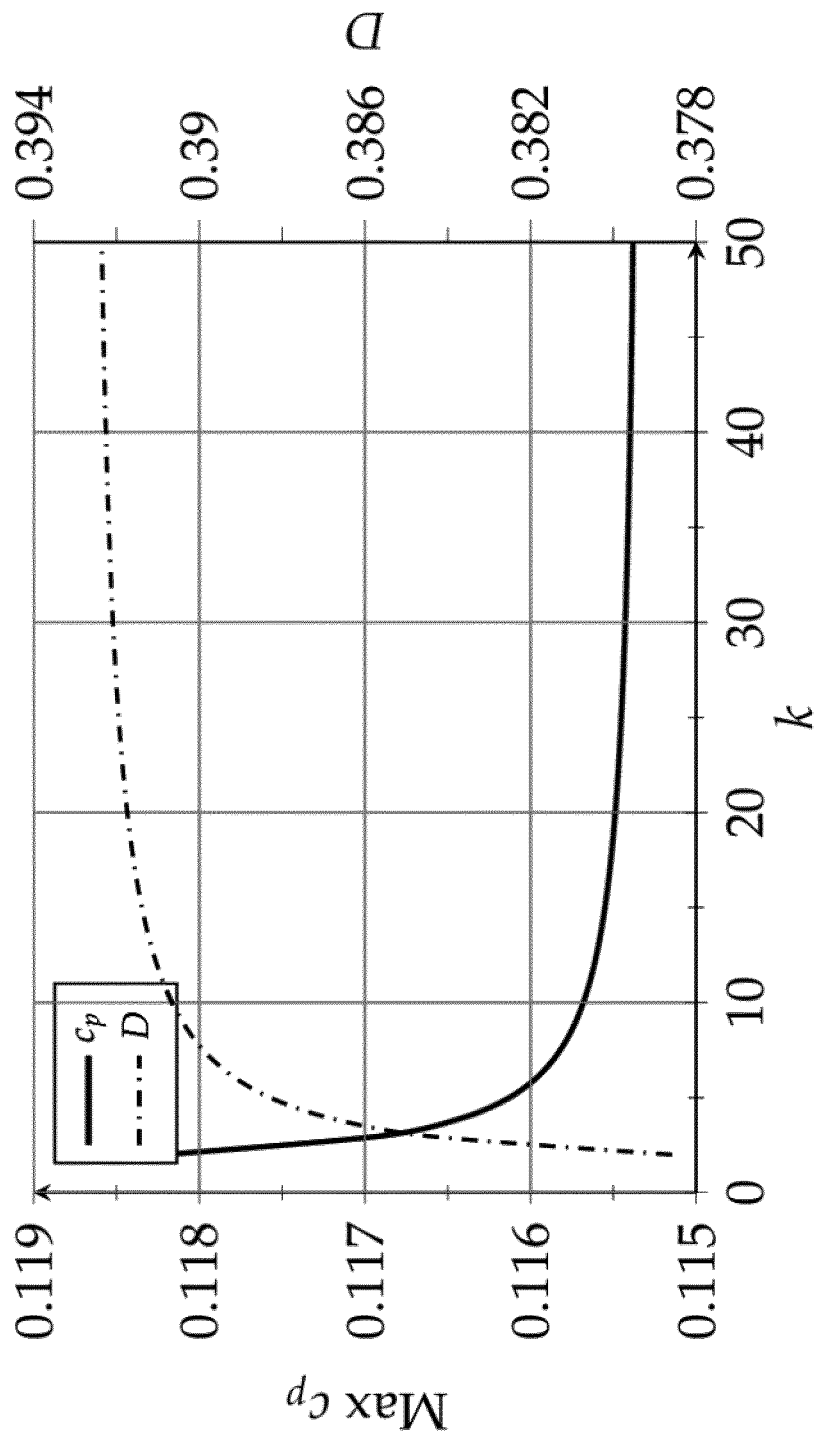
Figure 22A:
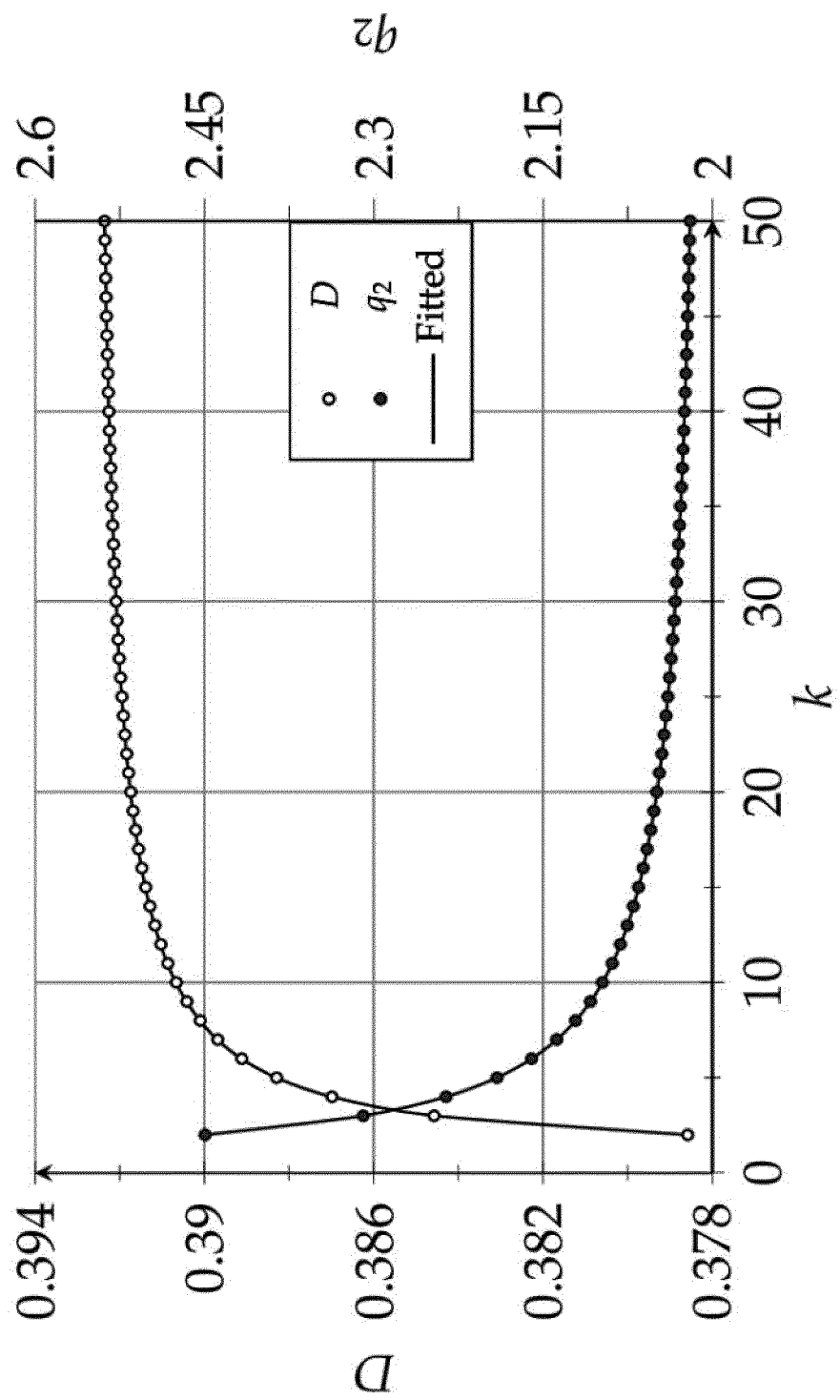
FIGS. 22a-22d depict the variation of characterising parameters along the maximum output power capability path.
Figure 22B:
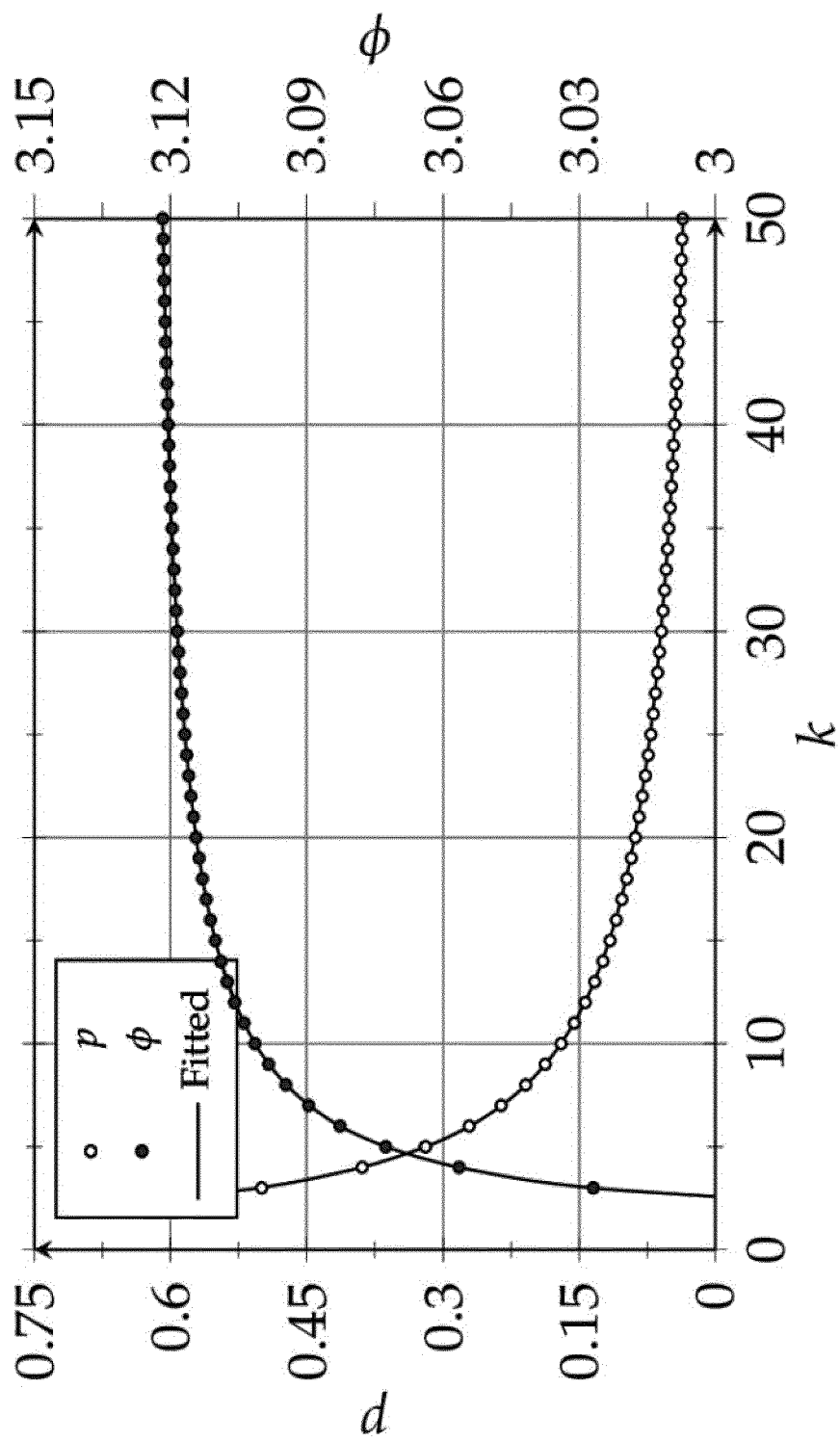
Figure 22C:
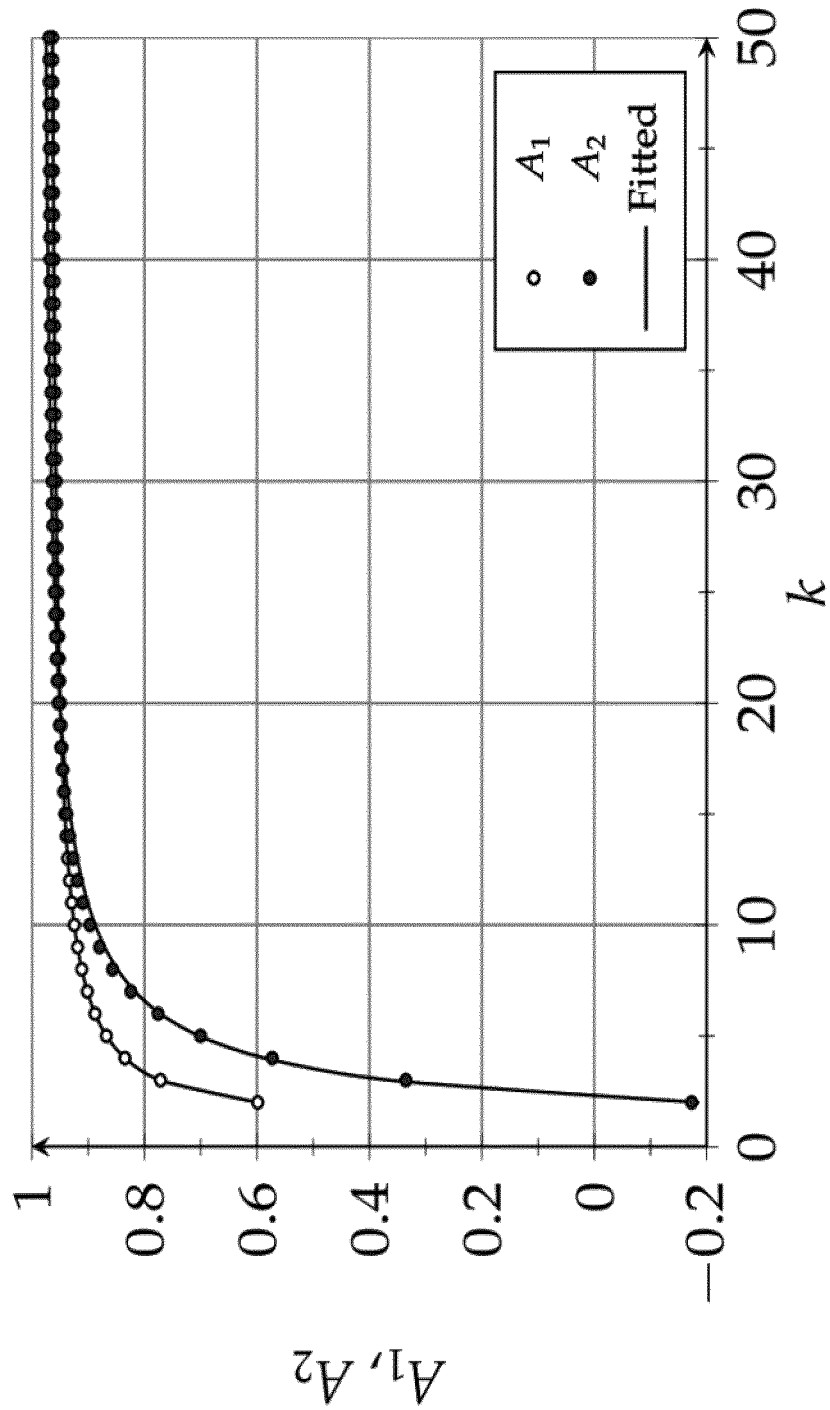
Figure 22D:
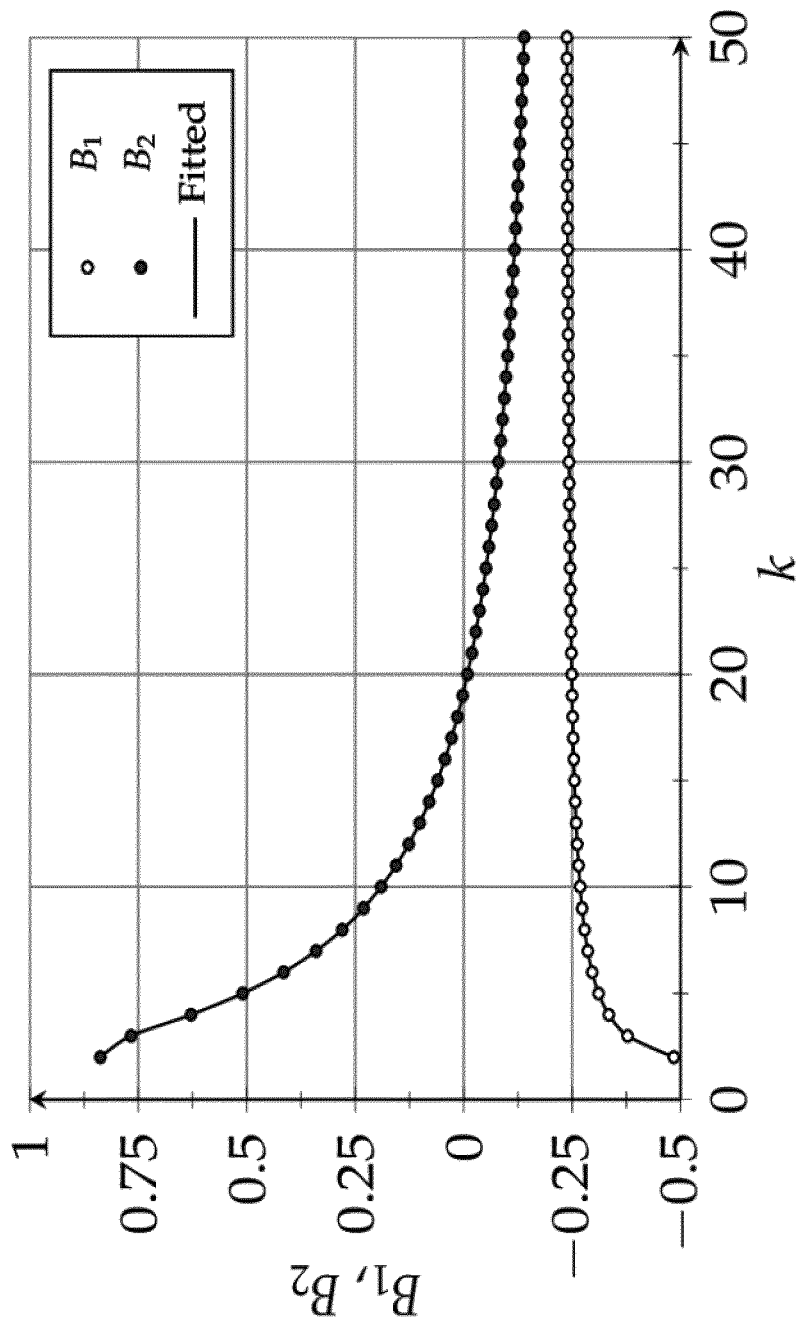

Since the inverter can operate at any given value of q1, duty cycle and k, it is of interest to operate the inverter 101 at its highest power output capability point. It will be assumed that series $L_2C_2$ is tuned to the second harmonic of the switching frequency, i.e. q1=2 (Class EF2). The aim now is for a given k to find the value of duty cycle that will result in the highest power output capability operation. FIGS. 21a and 21b show the path of maximum output capability as k and the duty cycle vary. FIG. 22 shows the variation of the parameters $A_1$, $A_2$, $B_1$, $B_2$, q2, p and φ along the maximum output power capability path.

Figure 23A:
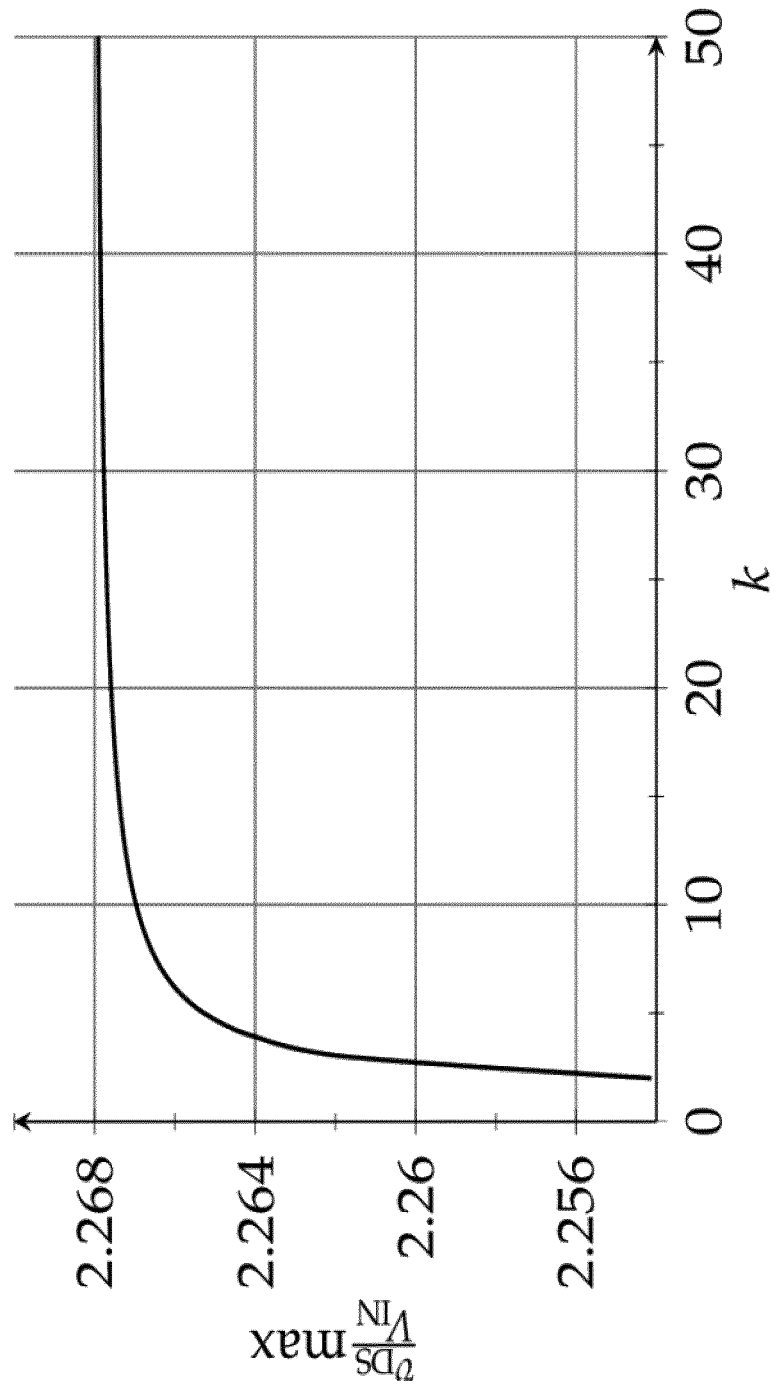
FIGS. 23a and 23b depict the variation of the switch's peak drain voltage and current with k.
Figure 23B:
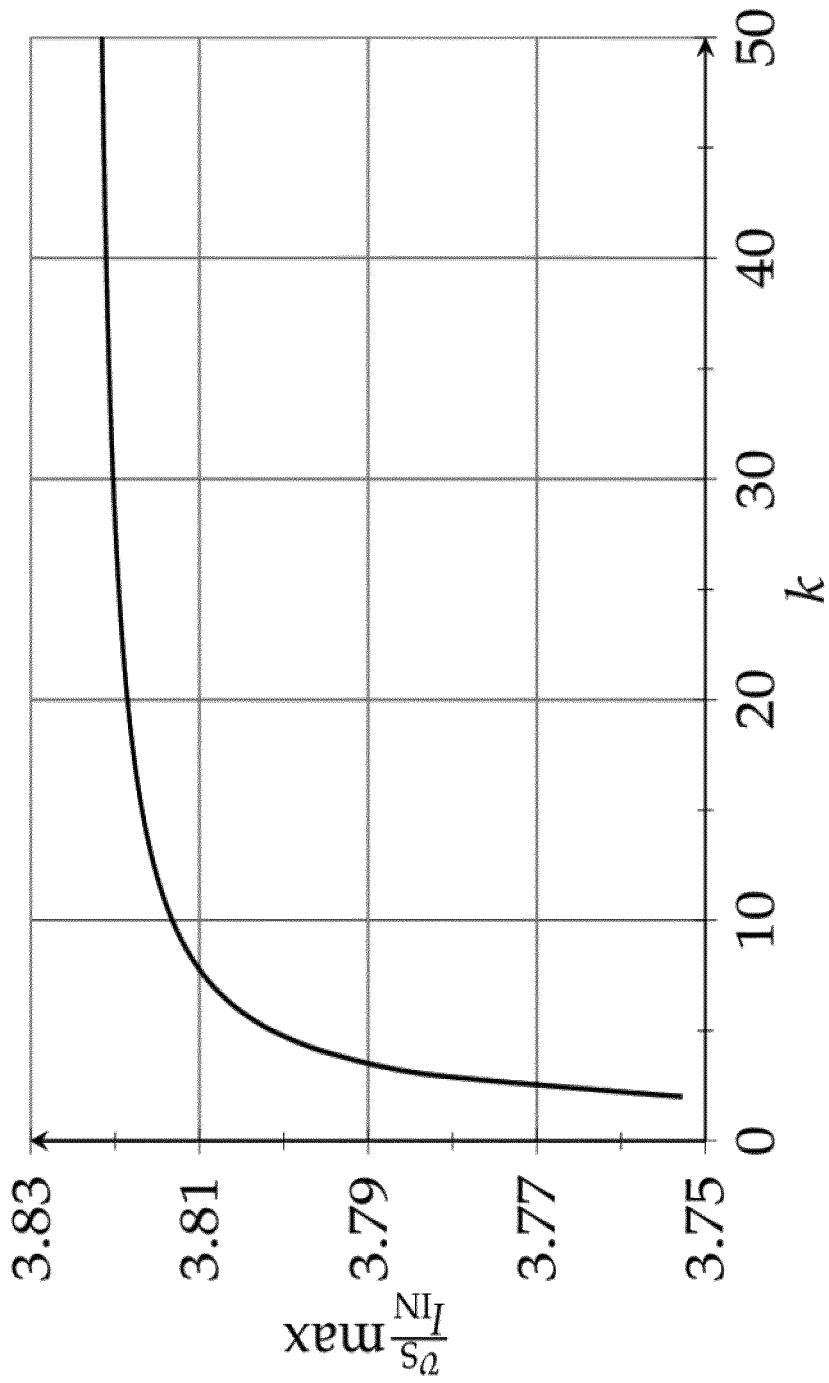

FIG. 23a shows the variation of the switch's peak drain voltage with k. FIG. 23b shows the variation of the switch's peak drain current with k.

It can be noticed from FIG. 22 that as k increases the value of q2 approaches the value of q1 which is 2. The values of the coefficients $A_1$ and $A_2$ begin to approach each other and the values of the coefficients $B_1$ and $B_2$ approach each other as well. This means that the current in inductor $L_2$ becomes sinusoidal with a frequency equal to q1ω or 2ω for the case when q1=2.

Based on the previous analysis the graphical solutions of the normalised values of the input resistance $R_{DC}$, capacitors $C_1$, $C_2$ and residual impedance $L_x$ can be plotted as shown in FIG. 20. It can be noticed in FIG. 20a that for a k value below 12 the input resistance is higher than that of the Class E inverter, this means that at a certain input voltage and load resistance the Class EF inverter provides less power than the Class E inverter. For k values higher than 12 the input resistance is lower than that of the Class E inverter, this means that the Class EF inverter will provide more power than the Class E inverter for a certain load resistance and input voltage. Using the Curve Fitting Toolbox in Matlab the following equations have been obtained that provide an accurate fit to the graphical solutions in FIG. 20 which depicts the variation of $R_L$, $R_x$, $C_1$ and $C_2$ with k for maximum power output capability.

$$D(k) = \frac{0.39275k - 0.26593}{k - 0.62755} \quad (41)$$

$$\frac{R_{DC}}{R_L}(k) = \frac{1.6835k - 1.1984}{k - 1.0681} \quad (42)$$

$$\omega R_L C_1(k) = \frac{0.14069k + 0.08613}{k + 0.1315} \quad (43)$$

$$\omega R_L C_2(k) = \omega R_L C_1(k)k \quad (44)$$

$$\frac{\omega L_2}{R_L}(k) = \frac{1}{4\omega R_L C_2(k)} \quad (45)$$

$$\frac{\omega L_x}{R_L}(k) = \frac{0.58805k - 0.10034}{k - 0.82871} \quad (46)$$

$$\omega R_L C_3(k) = \frac{1}{Q_L - \frac{\omega L_x}{R_L}(k)}. \quad (47)$$

Eqs. 42-47 can be used to determine the values of capacitors $C_1$, $C_2$ and $C_3$ and the required duty cycle for a given k, load resistance $R_L$, switching frequency and output network quality factor $Q_L$ that will result in the highest power output capability operation.

[Special Case I: Solution for Maximum Power Output Capability Operation]

For the case when q1=2 the maximum power output capability is 0.1323 which occurs when the duty cycle is 0.375 and k is 0.867. In this case the values of $A_1$=0.9394, $A_2$=−0.8589, $B_1$=−1.2405, $B_2$=1.2276, p=1.9204, φ=2.5701 rad, q2=2.9349 and $\int_{2\pi D}^{2\pi}\beta(\omega t)=\int_{0.75\pi}^{2\pi}\beta(\omega t)=5.3241$.

According to FIG. 18c, 80% or above of the maximum output power capability can be obtained when k lies in the range of greater than equal to 0.7 and less than or equal to 1.0, while D is greater than or equal to 0.35 and less than or equal to 0.40.

According to FIG. 18d, 90% or above of the maximum output power capability is obtained when k lies in the range of greater than equal to 0.8 and less than or equal to 1.0 while D is greater than or equal to 0.35 and less than or equal to 0.40.

The values of the normalised output current, input resistance and maximum voltage and current stresses are given in Table 2 at the end of this analysis.

The switch's voltage, switch's current and the current through inductor $L_2$ for this particular case are $$\frac{v_{DS}}{V_{IN}}(\omega t) = \begin{cases} 0 & \text{for } 0 \le \omega t < 0.75\pi \\ -1.4510 + 0.5481\omega t - \\ 1.6673\sin(\omega t + 57.26°) + & \text{for } 0.75\pi \le \omega t < 2\pi \\ 0.6024\sin(2.9349\omega t - 55.02°) \end{cases} \quad (48)$$

$$\frac{i_{DS}}{I_{IN}}(\omega t) = \begin{cases} 1 - 3.5853\sin(\omega t + 147.25°) + \\ 1.5560\sin(2\omega t - 142.86°) & \text{for } 0 \le \omega t < 0.75\pi \\ 0 & \text{for } 0.75\pi \le \omega t < 2\pi \end{cases} \quad (49)$$

$$\frac{i_{L2}}{I_{IN}}(\omega t) = \quad (50)$$
$$\begin{cases} 1.5560\sin(2\omega t - 142.86°) & \text{for } 0 \le \omega t < 0.75\pi \\ 0.5356 + 1.4982\sin(2.9349\omega t - 145.02°) - \\ 2.1726\sin(\omega t + 147.25°) & \text{for } 0.75\pi \le \omega t < 2\pi. \end{cases}$$

Figure 25:
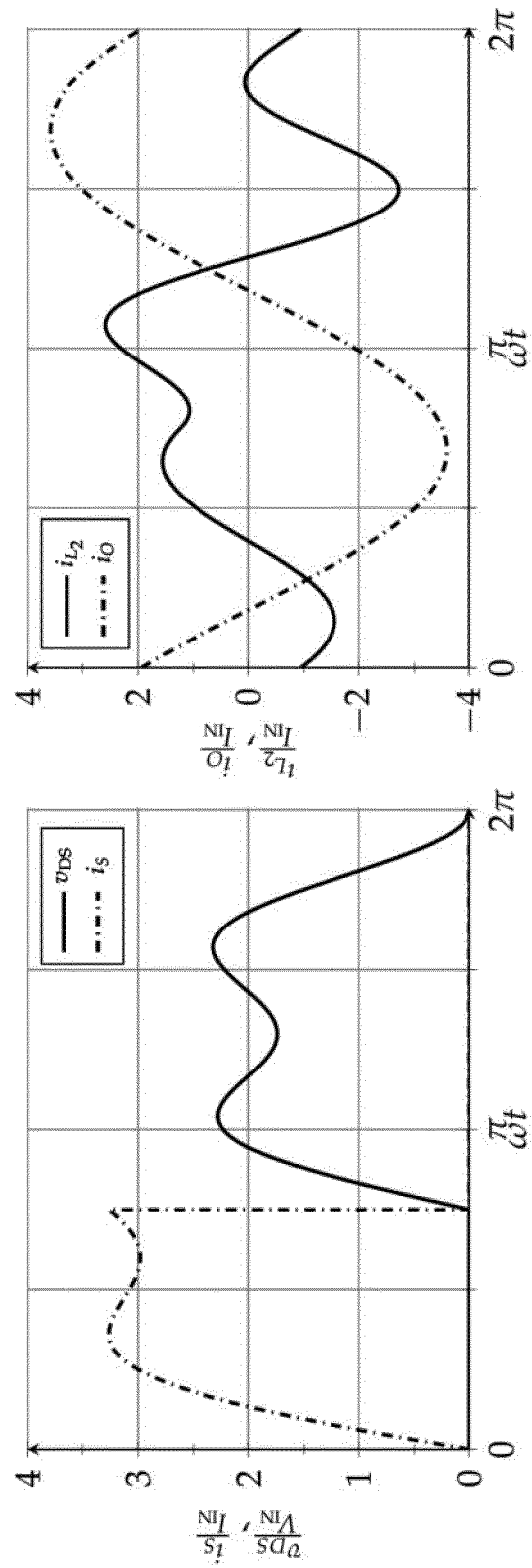
FIG. 25 depicts the voltage and current waveforms for maximum output power capability.

FIG. 25 shows the voltage and current waveforms for this particular case. The normalised maximum voltage across the switch is 2.3162 which occurs at ωt=4.9349, the normalised maximum switch current is 3.2632 which occurs at ωt=1.1310 and at ωt=2πD=2.3562.

Next, the values of further components will be determined for this particular case. Starting with $C_1$, referring to Eqs. 26 & 27 the average voltage of the switch's voltage is $$V_{IN} = \frac{I_{IN}}{2\pi\omega C_1}\int_{0.75\pi}^{2\pi}\beta(\omega t)d\omega t = 5.3241\frac{I_{IN}}{2\pi\omega C_1} \quad (51)$$

and using Eq. 35

$$\frac{V_{IN}}{I_{IN}} = R_{DC} = 6.4273 R_L = 5.3241\frac{1}{2\pi\omega C_1}. \quad (52)$$

Therefore the normalised reactance value of $C_1$ with respect to the load is $$\frac{1}{\omega R_L C_1} = 7.5851. \quad (53)$$

Using Eq. 13 the normalised value of $C_2$ is $$\frac{1}{\omega R_L C_2} = 6.5762. \tag{54}$$

Using Eq. 6 the normalised value of $L_2$ is $$\frac{\omega L_2}{R_L} = 1.6441. \tag{55}$$

The value of the residual impedance is equal to $$\omega L_x = \frac{v_x}{i_m} \tag{56}$$

where $v_x$ is the amplitude of the voltage across the residual impedance and is equal to $$v_x = \frac{1}{\pi} \int_{2\pi D}^{2\pi} v_{DS}(\omega t) \cos(\omega t + \phi) d\omega t. \tag{57}$$

Using Eq. 28 $v_x$ is also equal to $$\frac{v_x}{V_{IN}} = \frac{2 \int_{0.75\pi}^{2\pi} \beta(\omega t) \cos(\omega t + \phi) d\omega t}{\int_{0.75\pi}^{2\pi} \beta(\omega t) d\omega t} = 1.1346 \tag{58}$$

Using Eq. 32 & 35 the normalised value of the residual impedance is $$\frac{\omega L_x}{R_L} = 2.0339 \tag{59}$$

and the normalised reactance value of $C_3$ is $$\frac{1}{\omega R_L C_3} = Q_L - \frac{\omega L_x}{R_L} = Q_L - 2.0339 \tag{60}$$

[Special Case II: Solution for Operation at High k Values]

Case II corresponds to the previously discussed steady state case.

The analysis and design equations can be simplified for operation at a value of k higher than 20. The following assumptions can be concluded based on the previous sections as k begins to increase $$k > 20 \tag{61}$$

$$p \to 0 \tag{62}$$

$$q_2 \approx q_1 \tag{63}$$

$$A_2 \approx A_1 \tag{64}$$

$$B_2 \approx B_1. \tag{65}$$

Applying the above assumptions to Eqs. 5 & 12 the current through inductor $L_2$ for the period $0 \leq \omega t < 2\pi$ can be written as $$\frac{i_{L_2}}{I_{IN}}(\omega t) = A_1 \cos(q_1 \omega t) + B_1 \sin(q_1 \omega t) \text{ for } 0 \leq \omega t < 2\pi. \tag{66}$$

The above equation shows that the current through inductor $L_2$ is sinusoidal for the entire switching signal with a frequency equal to the resonant frequency of $L_2$ and $C_2$ which is equal to $q_1 \omega$. The current in the switch when it is turned ON is $$\frac{i_S}{I_{IN}}(\omega t) = 1 - \frac{i_o}{I_{IN}}(\omega t) - \frac{i_{L_2}}{I_{IN}}(\omega t) = 1 - \frac{i_m}{I_{IN}} \sin(\omega t + \phi) - \tag{67}$$
$$A_1 \cos(q_1 \omega t) - B_1 \sin(q_1 \omega t) \quad \text{for } 0 \leq \omega t < 2\pi D.$$

The harmonic content of the current in the switch consists of a DC component, a component at the fundamental switching frequency $\omega$ and a component at the resonant frequency of $L_2 C_2$ which here is $q_1 \omega$. The components with frequency $q_1 \omega$ can be calculated using two quadrature current Fourier components at $q_1 \omega$. These two quadrature Fourier components are equal to $A_1$ and $B_1$ respectively as follows $$A_1 = -\frac{1}{\pi} \int_0^{2\pi D} \frac{i_S}{I_{IN}}(\omega t) \cos(q_1 \omega t) d\omega t = \tag{68}$$
$$-\frac{\sin(2\pi D q_1)}{q_1 \pi} \left(1 - \frac{B_1 \sin(2\pi D q_1)}{2}\right) + \frac{A_1}{\pi}\left(\frac{\sin(4\pi D q_1)}{4 q_1} + \pi D\right) -$$
$$\frac{i_m}{I_{IN}} \left(\frac{-\cos\phi}{q_1^2 - 1} + \frac{\cos(\phi + 2\pi D(q_1+1))}{2(q_1+1)} - \frac{\cos(\phi - 2\pi D(q_1-1))}{2(q_1-1)}\right)$$

$$B_1 = -\frac{1}{\pi} \int_0^{2\pi D} \frac{i_S}{I_{IN}}(\omega t) \sin(q_1 \omega t) d\omega t = \tag{69}$$
$$-\frac{2\sin^2(\pi D q_1)}{q_1 \pi}\left(1 - \frac{A_1}{4}\right) - \frac{B_1}{\pi}\left(\frac{\sin(4\pi D q_1)}{4 q_1} - \pi D\right) -$$
$$\frac{i_m}{I_{IN}} \left(\frac{-\sin\phi}{q_1^2 - 1} + \frac{\sin(\phi + 2\pi D(q_1+1))}{2(q_1+1)} + \frac{\sin(\phi - 2\pi D(q_1-1))}{2(q_1-1)}\right).$$

The current in capacitor $C_1$ when the switch is turned OFF is $$\frac{i_{C_1}}{I_{IN}}(\omega t) = 1 - \frac{i_o}{I_{IN}}(\omega t) - \frac{i_{L_2}}{I_{IN}}(\omega t) = -\frac{i_m}{I_{IN}}\sin(\omega t + \phi) - \tag{70}$$
$$A_1 \cos(q_1 \omega t) - B_1 \sin(q_1 \omega t) \quad \text{for } 2\pi D \leq \omega t < 2\pi.$$

From Eq. 28 the voltage developed across capacitor $C_1$ is $$\frac{v_{DS}}{V_{IN}}(\omega t) = \frac{2\pi \beta'(\omega t)}{\int_{2\pi D}^{2\pi} \beta'(\omega t) d\omega t} \quad \text{for } 2\pi D \leq \omega t < 2\pi \tag{71}$$

$$\beta'(\omega t) = \tag{72}$$
$$\int_{2\pi D}^{\omega t} \frac{i_{C_1}}{I_{IN}}(\tau) d\tau = \omega t - 2\pi D + \frac{i_m}{I_{IN}}(\cos(\omega t + \phi) - \cos(\phi + 2\pi D)) -$$
$$\frac{A_1}{q_1}(\sin(q_1 \omega t) - \sin(2\pi D q_1)) + \frac{B_1}{q_1}(\cos(q_1 \omega t) - \cos(2\pi D q_1)).$$

Substituting the ZITS ($v_{DS}(2\pi)=0$) and ZDS ($i_{C_1}(2\pi)=0$) conditions in Eq. 71 gives the following two equations $$2\pi(1-D) + \frac{i_m}{I_{IN}}(\cos\phi - \cos(2\pi D + \phi)) - \qquad (73)$$

$$\frac{A_1}{q_1}(\sin(2\pi q_1) - \sin(2\pi D q_1)) + \frac{B_1}{q_1}(\cos(2\pi q_1) - \cos(2\pi D q_1)) = 0$$

$$1 - A_1\cos(2\pi q_1) - B_1\sin(2\pi q_1) - \frac{i_m}{I_{IN}}\sin\phi = 0. \qquad (74)$$

Eqs. 68, 69, 73 & 74 are four simultaneous equations that can be solved numerically for $i_m/I_{IN}$, $\varphi$, $A_1$ and $B_1$ for a given value of q1 and duty cycle.

The peak drain current can be obtained by differentiating Eq. 71 and setting it to zero which results in the following equation $$A_1 q_1 \sin(q_1\omega t) - B_1 q_1 \cos(q_1\omega t) - \frac{i_m}{I_{IN}}\cos(\omega t + \phi) = 0 \qquad (75)$$

which can be solved numerically. The peak drain voltage can be obtained by differentiating Eq. 71 and setting it to zero which results in the following equation $$1 - \frac{i_m}{I_{IN}}\sin(\omega t + \phi) - A_1\cos(q_1\omega t) - B_1\sin(q_1\omega t) = 0 \qquad (76)$$

which can also be solved numerically. It should be noted that drain voltage may contain two local maximum points depending on the set duty cycle. Therefore the maximum drain voltage is the highest of the two local maximum voltages. The output power capability can then be calculated from Eq. 40.

The above equations can be used to proceed with the calculations of the values of the components and other parameters. However, by observing FIG. 21b, it can be noticed that the maximum output power capability and the associated duty cycle approach 0.115 and 0.392 respectively as k increases when q1=2. By approximating the duty cycle value for maximum output power capability to 0.40, the solved values of $A_1$=0.96012, $B_1$=−0.18365, $i_m/I_{IN}$=1.8099, $\varphi$=3.1196 and $\int_{0.8\pi}^{2\pi}\beta'(\omega t)d\omega t$=1.3195

From Eq. 34 the normalised input DC resistance is $$\frac{R_{DC}}{R_L} = \frac{1}{2}\left(\frac{i_m}{i_{IN}}\right)^2 = 1.6379 \qquad (77)$$

and the output power is $$P_o = 0.6105\frac{V_{IN}^2}{R_L}. \qquad (78)$$

From Eqs. 26 & 27 and using Eq. 77 and the solved value of $\int\beta'(\omega t)d\omega t$ the normalised value of capacitor $C_1$ is $$\frac{1}{\omega R_L C_1} = 2\pi \frac{R_{DC}}{R_L} \frac{1}{\int_{0.8\pi}^{2\pi}\beta'(\omega t)d\omega t} = 7.7993. \qquad (79)$$

From Eq. 58 the voltage across the residual impedance is $$\frac{v_x}{V_{IN}} = \frac{2\int_{0.8\pi}^{2\pi}\beta'(\omega t)\cos(\omega t + \phi)d\omega t}{\int_{0.8\pi}^{2\pi}\beta'(\omega t)d\omega t} = 0.62424. \qquad (80)$$

From Eq. 56 and using Eq. 77 and the solved value of $i_m/I_{IN}$ the normalised value of the residual impedance is $$\frac{\omega L_x}{R_L} = 0.56491 \qquad (81)$$

and from Eqs. 60 the normalised value of capacitor $C_3$ is $$\frac{1}{\omega R_L C_3} = Q_L - \frac{\omega L_x}{R_L} = Q_L - 0.56491. \qquad (82)$$

Figure 26:
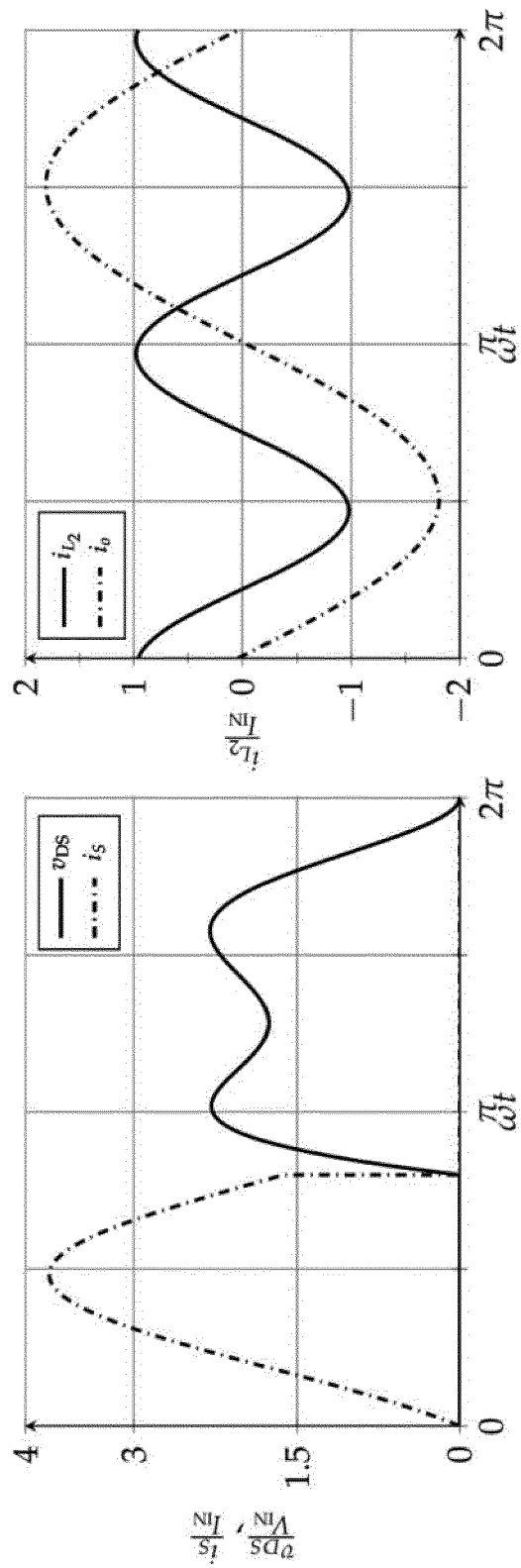
FIG. 26 depicts the voltage and current waveforms for the steady state case.

The values of $L_2$ and $C_2$ should be chosen such that their resonant frequency is equal to 2ω and k is larger than 20. FIG. 26 shows voltage and current waveforms for this particular case. The values of the normalised output current and maximum voltage and current stresses are given in Table 2.

[Special Case III: Maximum Switching Frequency]

The maximum frequency that the Class EF can operate at is when the value of $C_1$ equals the output capacitance of the switch Co (assuming that the switch's output capacitance is linear). For the maximum output power capability case (q1=2, D=0.375, k=0.867) the maximum frequency at which the ZVS and ZDS conditions can be achieved is determined from Eq. 53

$$f_{max} = \frac{1}{7.5851 \times 2\pi R_L C_o} = \frac{0.02098}{R_L C_o} \qquad (83)$$

which is about 0.7 times that of the Class E inverter. For the case when k>20 the maximum frequency at which the ZVS and ZDS conditions can be achieved is determined from Eq. 79

$$f_{max} = \frac{1}{7.7993 \times 2\pi R_L C_o} = \frac{0.02041}{R_L C_o} \qquad (84)$$

which is about 0.7 times that of the Class E inverter.

Figure 24A:
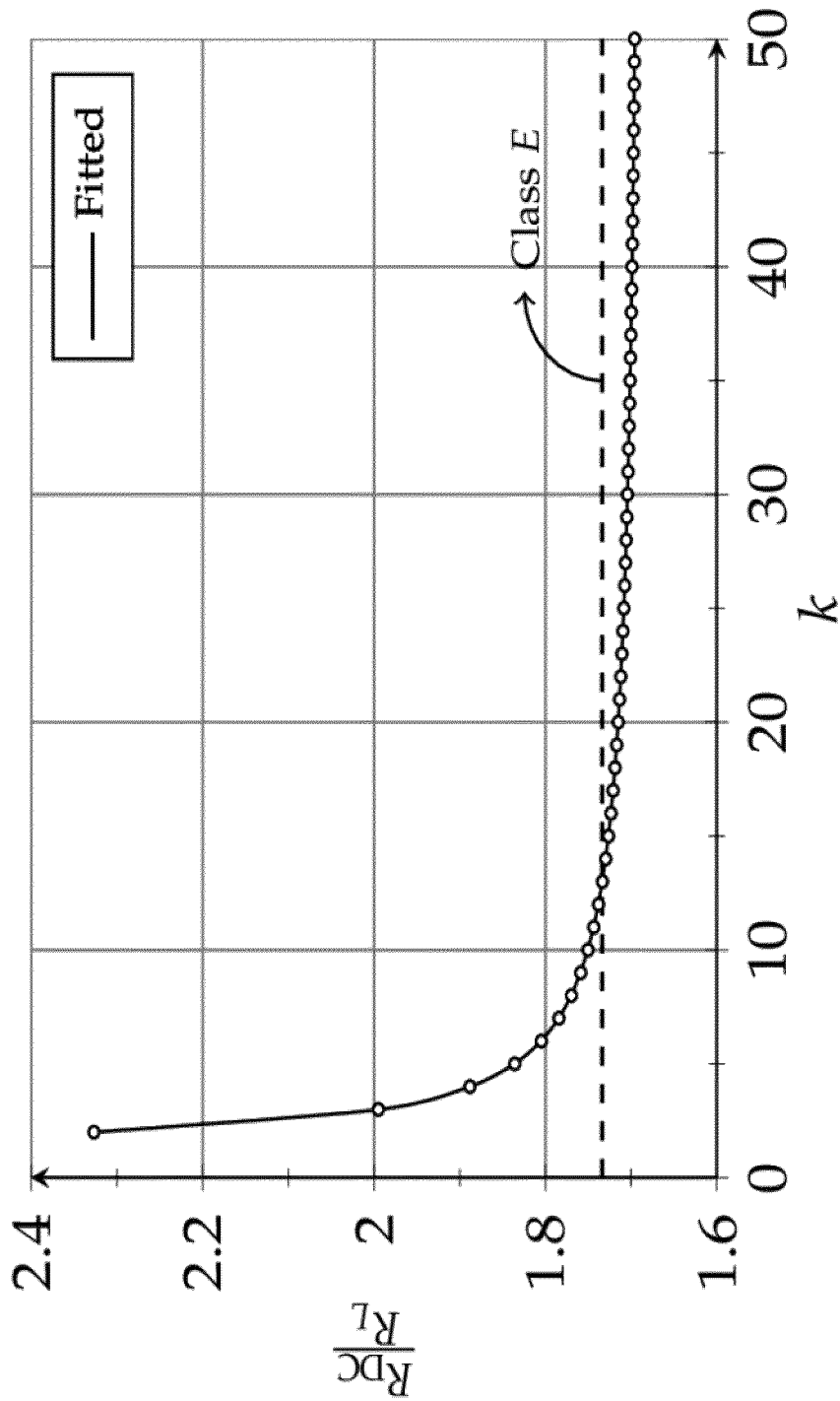
FIGS. 24a-24d depict the variation of $R_L$, $R_x$, $C_1$ and $C_2$ with k for maximum output power capability.
Figure 24B:
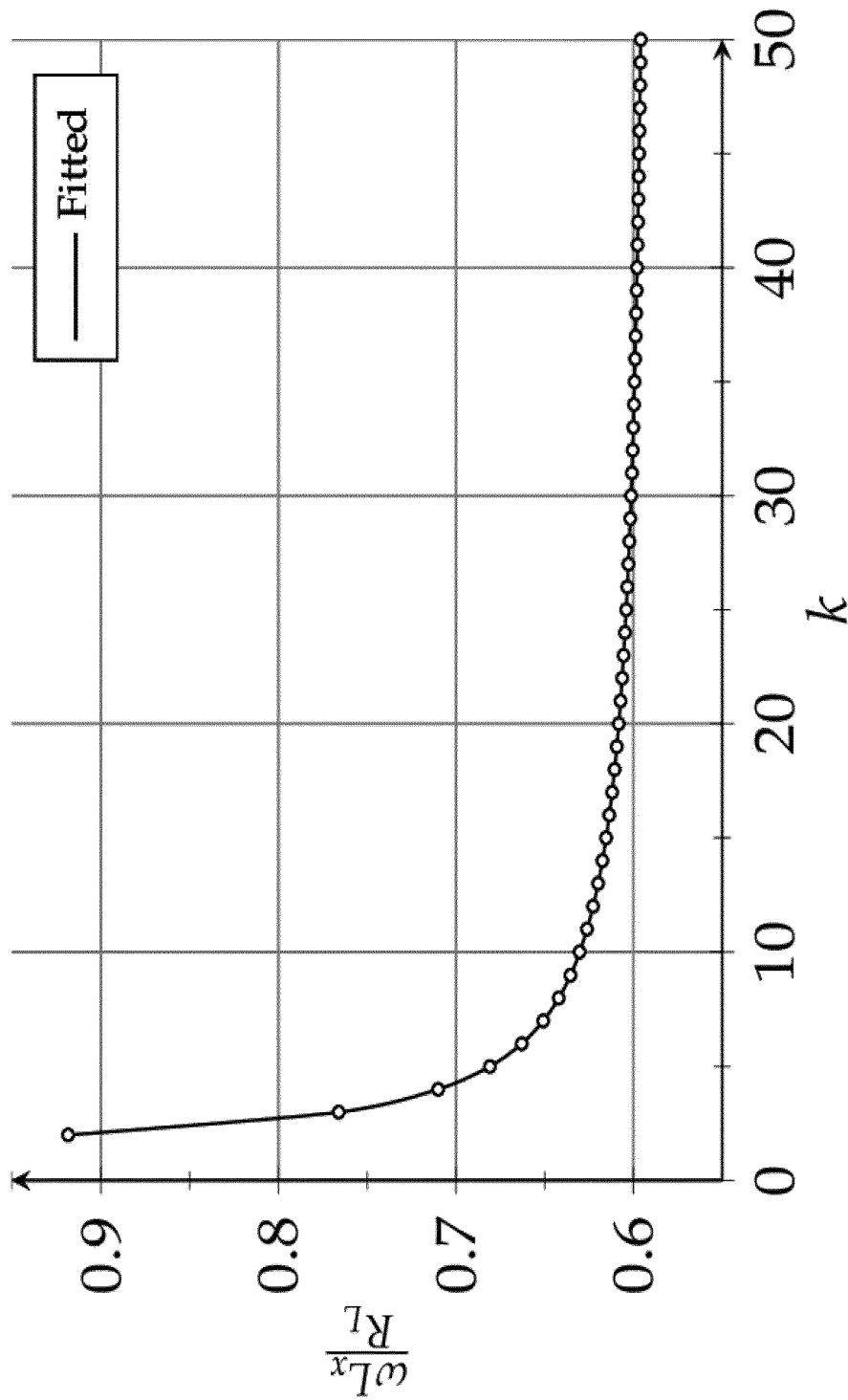
Figure 24C:
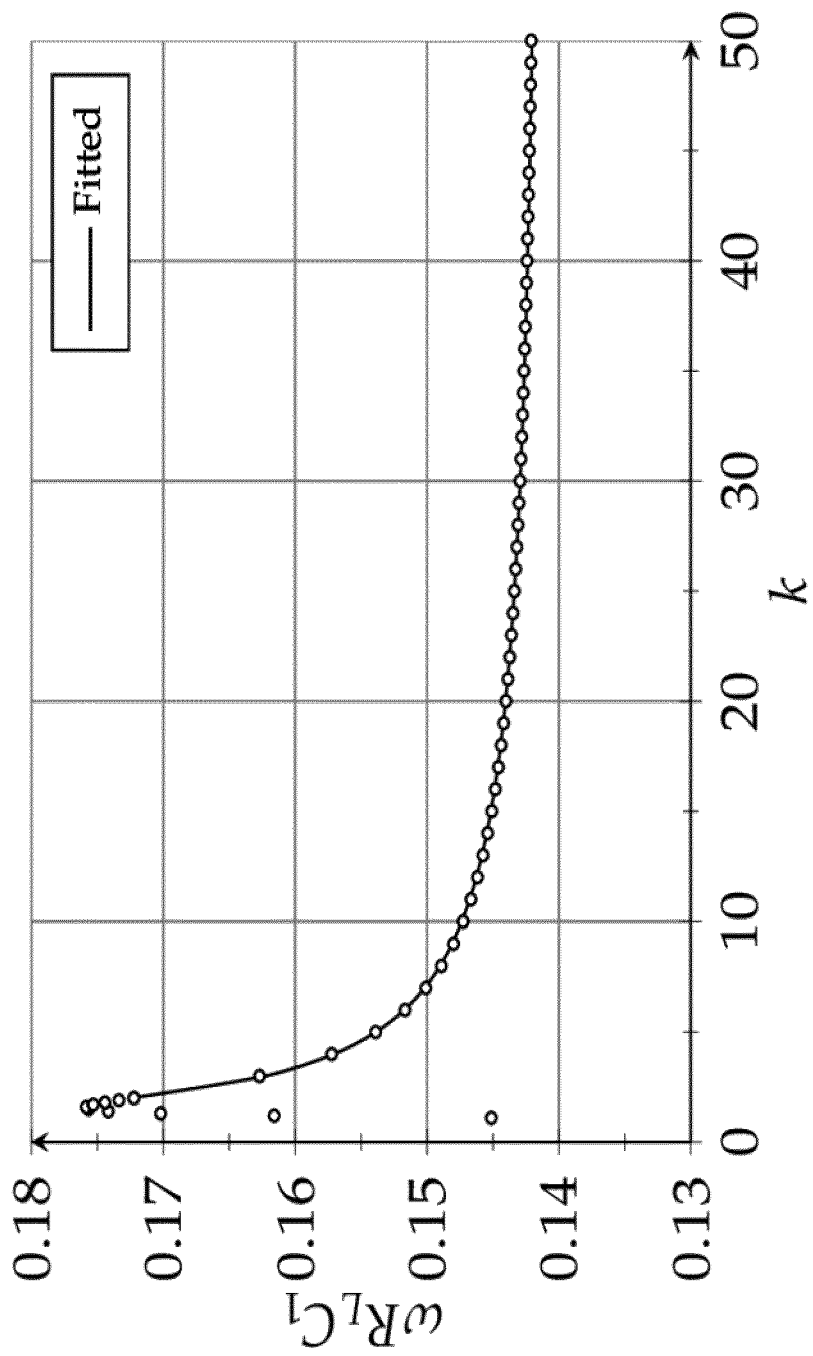
Figure 24D:
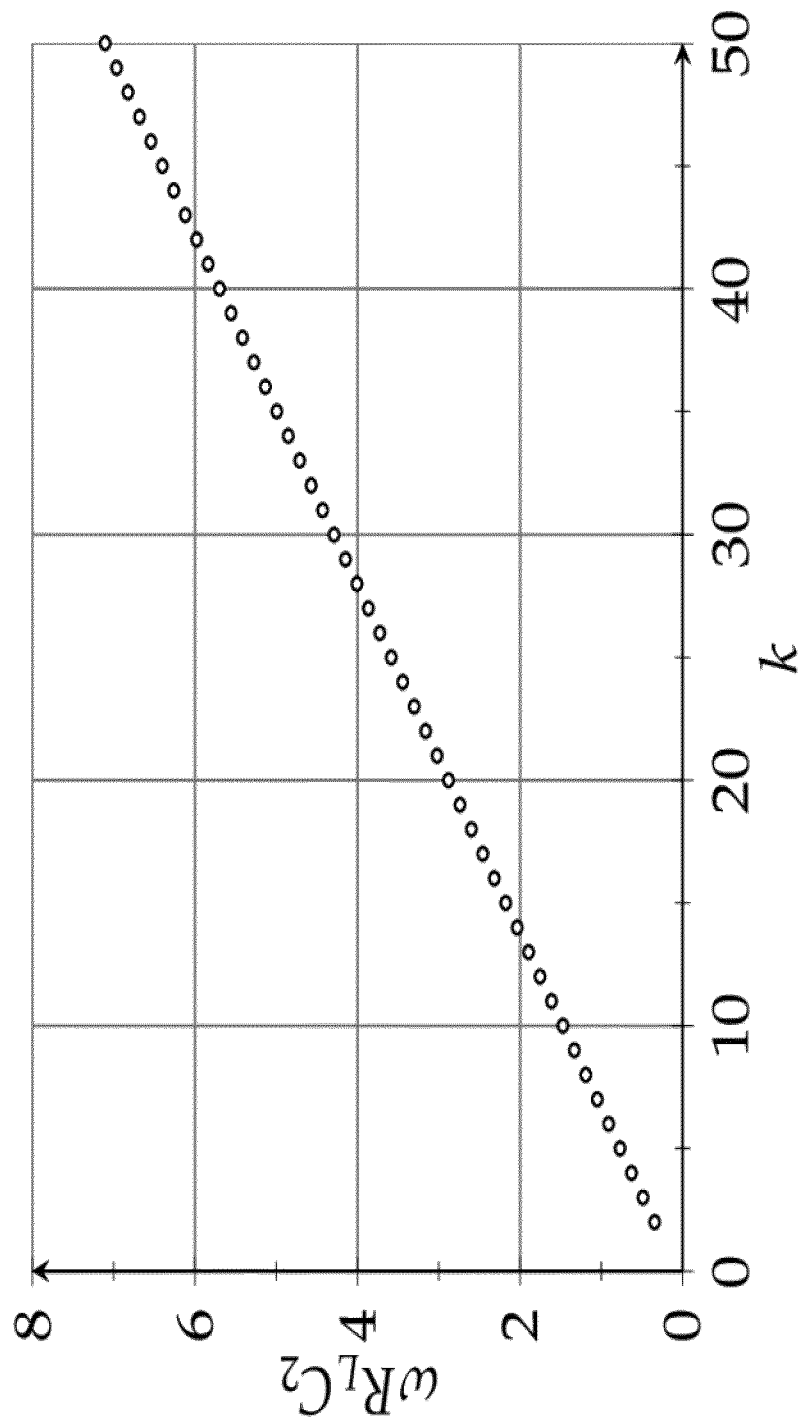
Figure 27A:
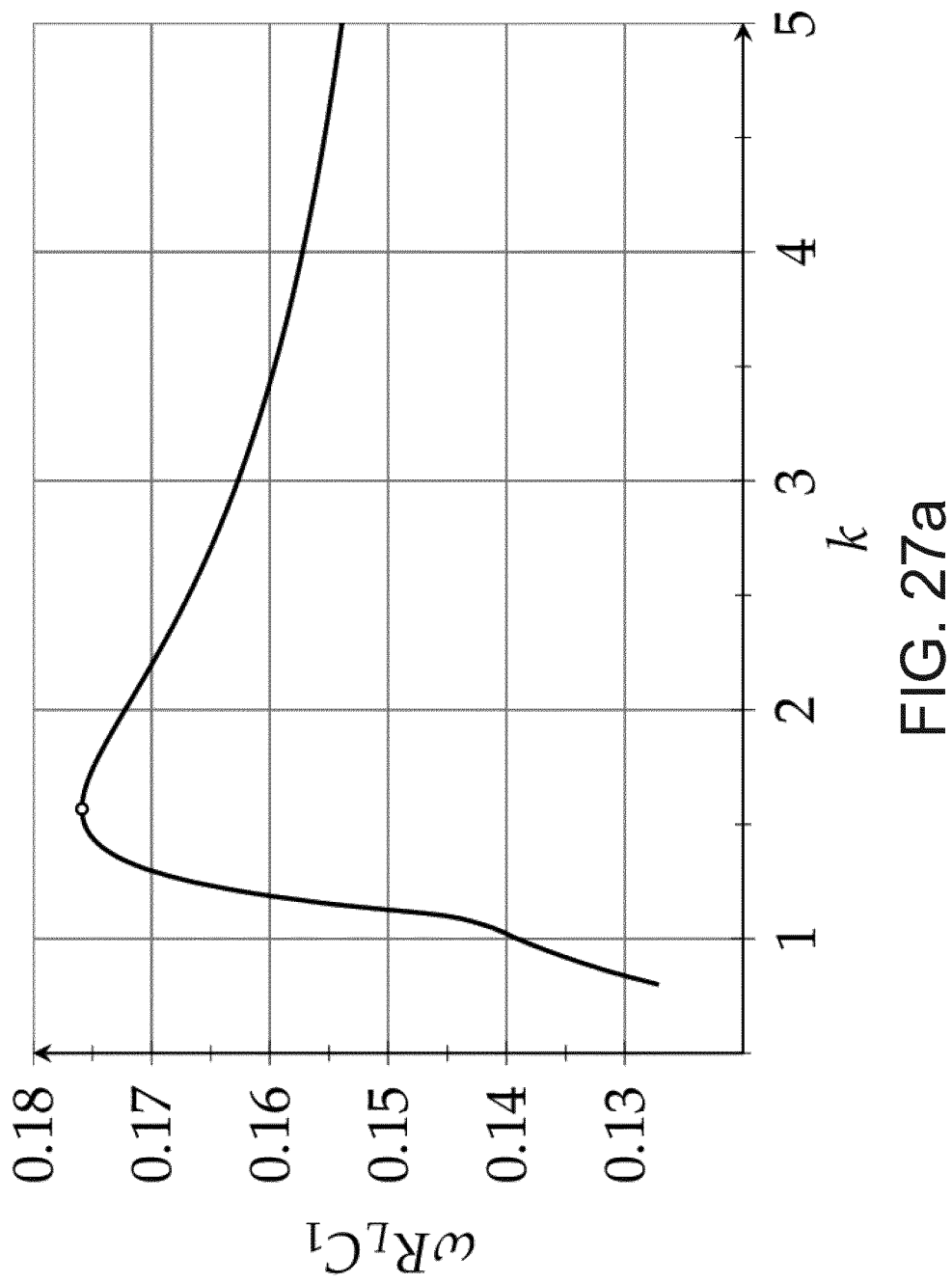
FIGS. 27a-27c depict the variation of $\omega R_L C_1$ with k.

By examining FIG. 24c the maximum frequency the Class EF inverter can operate at and at the same time operate at the maximum output power capability is at the maximum value of $\omega R_L C_1$. FIG. 27 shows a closer look at the variation of $\omega R_L C_1$ with k, the peak value is 0.17588 when k=1.567 and D=0.3718. The maximum frequency at which the ZVS and ZDS conditions can be achieved is $$f_{max} = \frac{0.17588}{2\pi R_L C_o} = \frac{0.02799}{R_L C_o} \qquad (85)$$

which approximately equals to the maximum frequency of the Class E inverter.

Figure 27B:
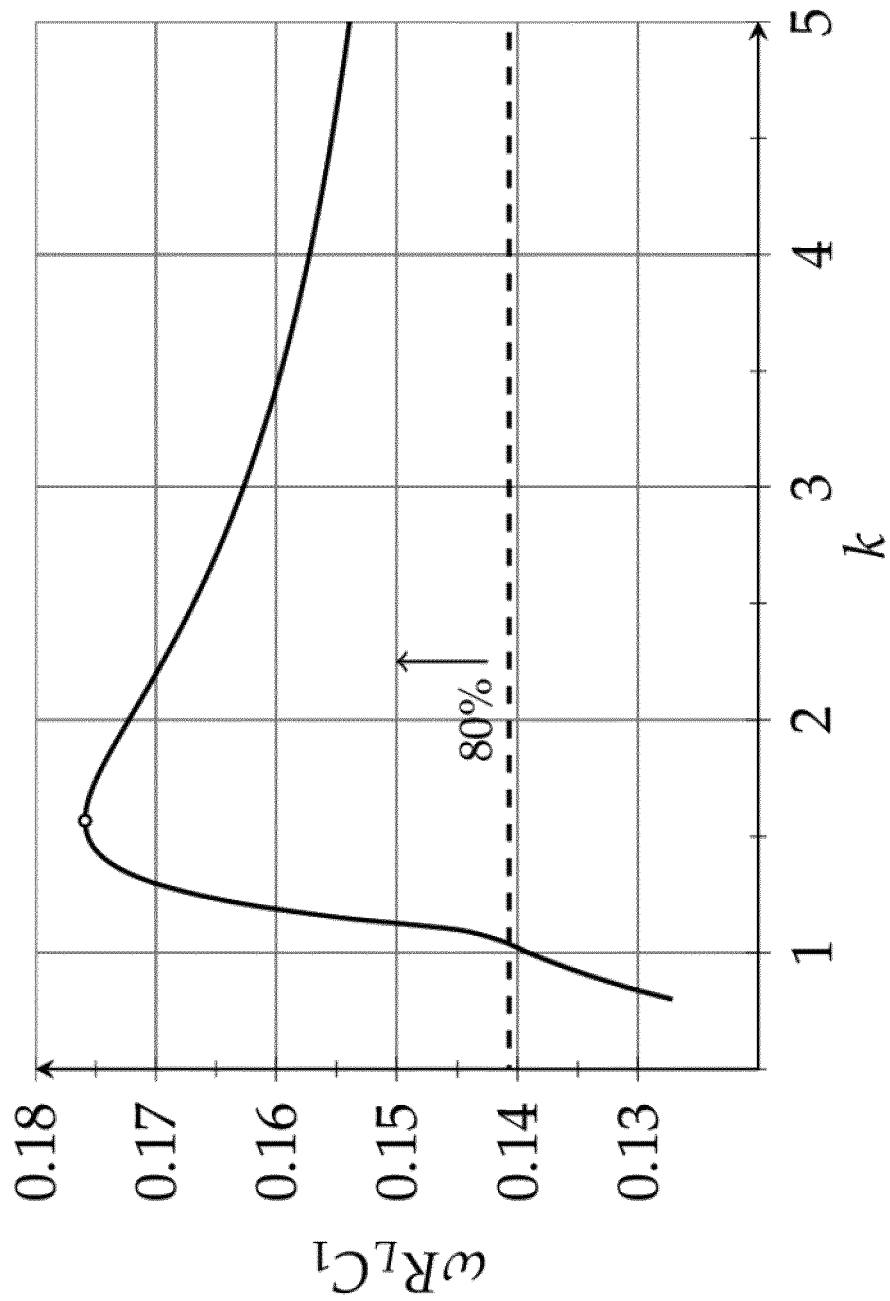

However, FIG. 27b shows that for 80% or above of the maximum switching frequency is obtained with a k value greater than or equal to 1 and less than or equal to 5, while the corresponding D value is greater than or equal to 0.35 and less than or equal to 0.40.

Figure 27C:
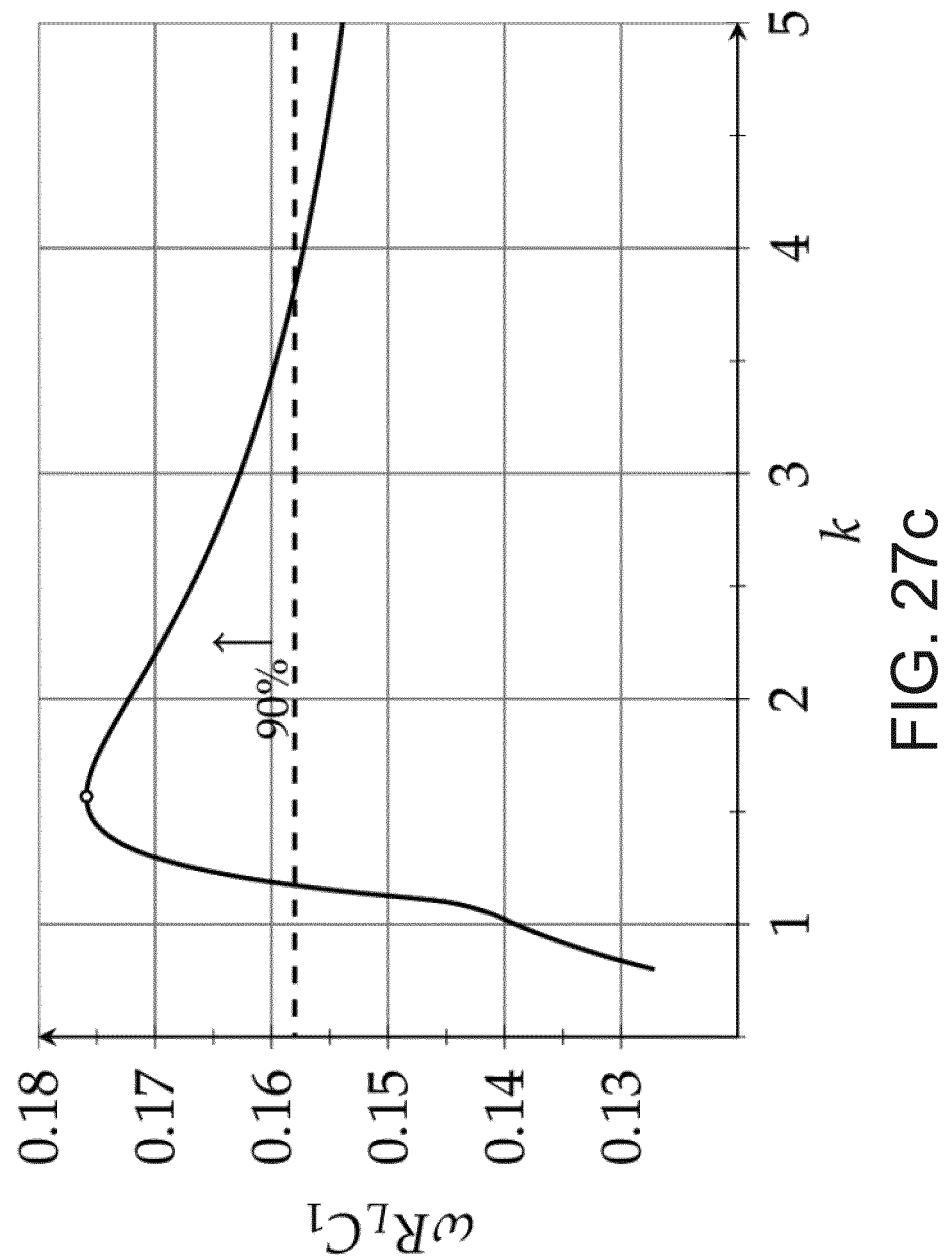

Similarly, FIG. 27c shows that for 90% or above of the maximum switching frequency is obtained with a k value greater than or equal to 1.2 and less than or equal to 3.7, while the corresponding D value is greater than or equal to 0.35 and less than or equal to 0.40.

Figure 28:
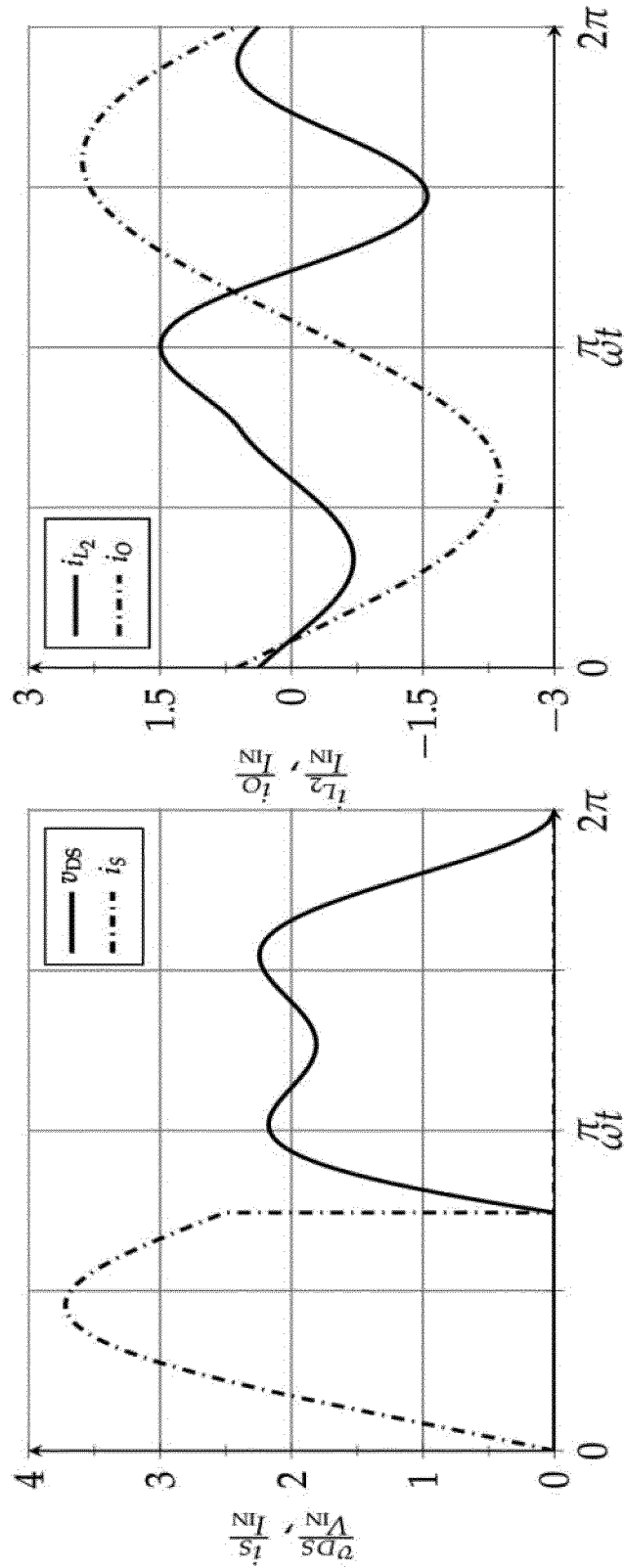
FIG. 28 depicts the voltage and current waveforms for the maximum switching frequency case.

The design equations for this new particular case (maximum frequency case), which can be calculated in a similar manner to what has been done for Case I, are given in Table 2. The values of the normalised output current, maximum voltage and current stresses, input DC resistance and output power capability are also given in Table 2. FIG. 28 shows the voltage and current waveforms for this particular case.

[Minimum Input Choke Inductance]

The minimum inductance value of the input choke will be determined here for all of the special cases above. When the switch is ON, the voltage across the input choke is $$v_{L_1}(\omega t) = V_{IN} \tag{86}$$

and the current through the choke inductance is $$i_{L_1}(\omega t) = \frac{1}{\omega L_1}\int_0^{\omega t} v_{L_1}(\omega t)d\omega t + i_{L_1}(0) = \frac{V_{IN}}{\omega L_1}\omega t + i_{L_1}(0). \tag{87}$$

The current in the input choke at the end of the ON period is $$i_{L_1}(2\pi D) = 2\pi D\frac{V_{IN}}{\omega L_1} + i_{L_1}(0). \tag{88}$$

Therefore the peak-to-peak ripple in the input current is $$\Delta i_{L_1} = i_{L_1}(2\pi D) - i_{L_1}(0) = 2\pi D\frac{V_{IN}}{\omega L_1}. \tag{89}$$

The minimum input choke inductance required for the maximum peak-to-peak current ripple is $$L_{1min} = 2\pi D\frac{V_{IN}}{\omega \Delta i_{L_1 max}}. \tag{90}$$

Using Eq. 34 the minimum input choke inductance can be written as $$L_{1min} = 2\pi D\frac{R_{DC}}{\omega\frac{\Delta i_{L_1}}{I_{IN}}}. \tag{91}$$

The above equation gives the minimum input choke inductance for a certain maximum input current ripple percentage. For the maximum output power capability case (Case I, q1=2, D=0.375, k=0.867) the minimum inductance for a 10% ($\Delta i L_1/I_{IN}$=0.1) input ripple current is $$L_{1min} = 24.1024\frac{R_L}{f} \tag{92}$$

which is about 2.7 times more than that of the Class E inverter.

For the case when k>20 (Case II) the minimum inductance for a 10% ($\Delta i L_1/I_{IN}$=0.1) input ripple current is $$L_{1min} = 6.5516\frac{R_L}{f} \tag{93}$$

which is about 0.8 times less than that of the Class E inverter.

For the maximum frequency case (Case III) the minimum inductance for a 10% ($\Delta i L_1/I_{IN}$=0.1) input ripple current is $$L_{1min} = 10.5952\frac{R_L}{f} \tag{94}$$

which is about 1.2 times more than that of the Class E inverter.

[Efficiency]

The losses and efficiency will be considered for all special cases. The efficiency is defined as η=Po/PIN. Beginning with the input choke, it losses can be represented by a series resistor rf which includes the winding resistance and core losses. According to the first assumption, the current in the input choke is constant therefore the loss in the input choke is equal to $$P_{L_1} = I_{IN}^2 r_f = \frac{2}{\left(\frac{i_m}{I_{IN}}\right)^2}\frac{r_f}{R_L}P_o. \tag{95}$$

The switch conduction power loss due to its ON resistance rDS is determined first by calculating the rms value of the switch's current from Eq. 29 as follows $$i_{Srms} = I_{IN}\sqrt{\frac{1}{2\pi}\int_0^{2\pi D}\frac{i_S}{I_{IN}}^2(\omega t)d\omega t} \tag{96}$$

and the conduction power loss is $$P_{DS} = i_{Srms}^2 r_{DS} = \frac{1}{\pi\left(\frac{i_m}{I_{IN}}\right)^2}\int_0^{2\pi D}\frac{i_S}{I_{IN}}^2(\omega t)d\omega t\frac{r_{DS}}{R_L}P_o. \tag{97}$$

The power loss in the shunt capacitor $C_1$ due to its resistance r$C_1$ is determined first by calculation the rms value of it's current from Eq. 21 as follows $$i_{C_1 rms} = I_{IN}\sqrt{\frac{1}{2\pi}\int_{2\pi D}^{2\pi}\frac{i_{C_1}}{I_{IN}}^2(\omega t)d\omega t} \tag{98}$$

and the power loss is $$P_{C_1} = i_{C_1 rms}^2 r_{DS} = \frac{1}{\pi\left(\frac{i_m}{I_{IN}}\right)^2}\int_{2\pi D}^{2\pi}\frac{i_{C_1}}{I_{IN}}^2(\omega t)d\omega t\frac{r_{C_1}}{R_L}P_o. \tag{99}$$

The power loss in the series tuned $L_2C_2$ branch due to the ESR of the inductor $rL_2$ and the resistance loss of the capacitor $rC_2$ is first determined by calculated the rms current value of inductor $L_2$ as from Eqs. 5 & 12 as follows $$i_{L_2 rms} = I_{IN}\sqrt{\frac{1}{2\pi}\int_0^{2\pi}\frac{i_{L_2}}{I_{IN}}^2(\omega t)d\omega t} \qquad (100)$$

and the total power loss is $$P_{L_2C_2} = i_{L_2 rms}^2 (r_{L_2} + r_{C_2}) \qquad (101)$$

$$= \frac{1}{\pi\left(\frac{i_m}{I_{IN}}\right)^2}\int_0^{2\pi}\frac{i_{L_2}}{I_{IN}}^2(\omega t)d\omega t\left(\frac{r_{L_2}+r_{C_2}}{R_L}\right)P_o.$$

The power loss in the output load network $L_3C_3$ due to the inductor's ESR $rL_3$ and the capacitor's resistance $rC_3$ is $$P_{L_3C_3} = \frac{r_{L_3}+r_{C_3}}{R_L}P_o \qquad (102)$$

The turn-ON switching power loss of the switch is assumed to be zero if the ZVS condition is achieved. The turn-OFF switching power loss can be estimated as follows (according to M. K. Kazimierczuk, RF Power Amplifiers, 2nd ed. Chichester, UK: John Wiley & Sons Ltd, 2015.). The switch current during turn-OFF tf can be assumed to decrease linearly. Using Eq. 29 the switch's current can be represented as $$\frac{i_S}{I_{IN}}(\omega t) = \frac{i_S}{I_{IN}}(2\pi D)\left(1 - \frac{\omega t - 2\pi D}{\omega t_f}\right) \qquad (103)$$

for $2\pi D < \omega t \leq 2\pi D + \omega t_f$ and the current in the shunt capacitor $C_1$ can be approximated by $$\frac{i_{C_1}}{I_{IN}}(\omega t) \approx \frac{i_S}{I_{IN}}(2\pi D)\left(\frac{\omega t - 2\pi D}{\omega t_f}\right) \qquad (104)$$

for $2\pi D < \omega t \leq 2\pi D + \omega t_f$.

The voltage, across the switch is $$v_{DS}(\omega t) = \frac{I_{IN}}{\omega C_1}\frac{i_S}{I_{IN}}(2\pi D)\int_{2\pi D}^{\omega t}\frac{i_{C_1}}{I_{IN}}(\tau)d\tau \qquad (105)$$

$$= \frac{I_{IN}}{\omega C_1}\frac{i_S}{I_{IN}}(2\pi D)\frac{(\omega t - 2\pi D)^2}{\omega t_f}$$

and using Eqs. 26 & 27 the voltage across switch can be represented as $$\frac{v_{DS}}{V_{IN}}(\omega t) = \frac{2\pi}{\int_{2\pi D}^{2\pi}\beta(\omega t)d\omega t}\frac{i_S}{I_{IN}}(2\pi D)\frac{(\omega t - 2\pi D)^2}{\omega t_f}. \qquad (106)$$

The average power dissipated in the switch is $$P_{t_f} = \frac{V_{IN}I_{IN}}{2\pi}\int_{2\pi D}^{2\pi D+\omega t_f}\frac{i_S}{I_{IN}}(\omega t)\frac{v_{DS}}{V_{IN}}(\omega t)d\omega t \qquad (107)$$

$$\approx P_o\frac{\frac{i_S}{I_{IN}}(2\pi D)}{\int_{2\pi D}^{2\pi}\beta(\omega t)d\omega t}\int_{2\pi D}^{2\pi D+\omega t_f}\left(1 - \frac{\omega t - 2\pi D}{\omega t_f}\right)\frac{(\omega t - 2\pi D)^2}{\omega t_f}d\omega t$$

$$= P_o\frac{\frac{i_S}{I_{IN}}^2(2\pi D)}{\int_{2\pi D}^{2\pi}\beta(\omega t)d\omega t}\frac{\omega t_f^2}{24} = P_o\frac{(\omega t_f^2)^2}{12}.$$

The efficiency of the inverter is $$\eta = \frac{1}{1 + P_{L_1} + P_{DS} + P_{C_1} + P_{L_2C_2} + P_{L_3C_3} + P_{t_f}}. \qquad (108)$$

Table 1 lists the numerical evaluations for all the power loss equations for the special cases described in the previous section. FIG. 29 compares the efficiencies of all special cases of the Class EF2 with the Class E as the load resistance varies. All of the special case Class EF2 inverters and the Class E have the same loss resistances of their components. It can be seen that the Class EF2 inverter at special cases I and II have the highest efficiencies especially at low load resistance values.

TABLE 1

Numerically calculated powers

| Normalised Power | Class EF$_2$ Case I (max $c_p$) | Class EF$_2$ Case II k > 20 | Class EF$_2$ Case III (max f) | Class E D = 0.5 |
|---|---|---|---|---|
| $P_{L_1}$ | 0.155 59 | 0.610 54 | 0.351 08 | 0.576 66 |
| $P_{DS}$ | 0.454 21 | 1.8298 | 1.0876 | 1.3648 |
| $P_{C_1}$ | 0.231 59 | 0.072 434 | 0.173 94 | 0.211 88 |
| $P_{L_2C_2}$ | 0.354 97 | 0.291 70 | 0.244 49 | — |
| $P_{t_f}$ | $\approx \frac{\omega t_f}{12}$ | $\approx \frac{\omega t_f}{12}$ | $\approx \frac{\omega t_f}{12}$ | $\approx \frac{\omega t_f}{12}$ |

[Summary of Design Equations and Parameters for all Special Cases of the Class EF2 Inverter]

Table 2 summarises all the design equations and parameters for all the special cases of the Class EF2 inverter in comparison with the Class E inverter.

TABLE 2

Summary of all design equations and performance parameters

| Power | Class EF$_2$ Case I (max $c_p$) | Class EF$_2$ Case II k ≥ 20 | Class EF$_2$ Case III (max f) | Class E D = 0.5 |
|---|---|---|---|---|
| D | 0.3750 | 0.4000 | 0.3718 | 0.5000 |
| k | 0.867 | ≥ 20 | 1.567 | — |
| $q_2$ | 2.9349 | ≈ 2 | — | — |
| $\frac{1}{(\omega R)_L C_1}$ | 7.5851 | 7.7993 | 5.6857 | 5.4466 |

TABLE 2-continued

Summary of all design equations and performance parameters

| Power | Class EF$_2$ Case I (max c$_p$) | Class EF$_2$ Case II k ≥ 20 | Class EF$_2$ Case III (max f) | Class E D = 0.5 |
|---|---|---|---|---|
| $\dfrac{1}{(\omega R)_L C_2}$ | 6.5762 | — | 8.9095 | — |
| $\dfrac{\omega L_x}{R_L}$ | 2.0339 | 0.5649 | 1.1167 | 1.1525 |
| $\dfrac{fL_{1min}}{R_L}$ | 24.1024 | 6.5516 | 10.5952 | 8.6685 |
| $\dfrac{R_{DC}}{R_L}$ | 6.4273 | 1.6379 | 2.8497 | 1.7337 |
| $c_p$ | 0.1323 | 0.1152 | 0.1199 | 0.0981 |
| $\dfrac{1}{f_{max} R_L C_o}$ | 47.6644 | 48.9956 | 35.7270 | 19.7394 |
| $\dfrac{P_o R_L}{V_{IN}^2}$ | 0.1556 | 0.6105 | 0.3509 | 0.5768 |
| $\dfrac{v_{DS}}{V_{IN}}$ max | 2.3162 | 2.2964 | 2.2433 | 3.5620 |
| $\dfrac{i_S}{I_{IN}}$ max | 2.3562 | 3.7790 | 4.8561 | 2.8620 |

[Semi-Resonant Operation (Impedance Transformation)]

The reflected load of the secondary side in an inductive power transfer system tends to be low, generally between 1-10Ω. Referring to FIG. 29 the efficiency of the inverter is below 90% due to the increased current stresses. Power efficiency is important in an inductive power transfer system and therefore it should be maximised as much as possible.

FIG. 30 depicts an impedance transformation network which is referred to as semi-resonant operation and increases the power efficiency of the inverter 101. A capacitor $C_{res}$ is connected in parallel with inductance $L_3$ (which could represent the inductance of the transmitting coil in an inductive power transfer system) and the load resistance $R_L$ (which could represent the reflected load in an inductive power transfer system). Capacitor $C_{Eq}$ will increase the load resistance seen by the inverter as long as its reactance at the switching frequency is below the reactance of inductor $L_3$. It will also decrease the reactance of $L_3$ as seen by the inverter. Although semi-resonant operation may increase the load resistance seen by the inverter, the reduction of the reactance of $L_3$ as seen by the inverter will result in a lower loaded Q which may lead to an increase in harmonics.

The impedance of the equivalent resistance ($R_{Eq}$) and the equivalent inductance ($L_{Eq}$) due to the addition of $C_{res}$ is $$Z_{Eq} = R_{Eq} + jX_{L_{Eq}} \quad (109)$$
$$= \frac{-jX_{C_{res}}(R_L + jX_{L_3})}{R_L + jX_{L_3} - jX_{C_{res}}}$$
$$= \frac{X_{C_{res}}^2 R_L - j(X_{L_3}^2 X_{C_{res}} - X_{L_3} X_{C_{res}}^2 + X_{C_{res}} R_L^2)}{R_L^2 + (X_{L_3} - X_{C_{res}})^2}.$$

Therefore the equivalent resistance is $$R_{Eq} = \frac{X_{C_{res}}^2 R_L}{R_L^2 + (X_{L_3} - X_{C_{res}})^2}, \quad (110)$$

the equivalent inductance is $$L_{Eq} = \frac{1}{\omega} \frac{X_{L_3}^2 X_{C_{res}} - X_{L_3} X_{C_{res}}^2 + X_{C_{res}} R_L^2}{R_L^2 + (X_{L_3} - X_{C_{res}})^2} \quad (111)$$

where $X_{C_{res}} < X_{L_3}$, and the equivalent loaded quality factor is $$Q_{Eq} = \frac{\omega L_{Eq}}{R_{Eq}}. \quad (112)$$

Eqs. 110-112 can be incorporated in the design equations for each special case of the Class EF$_2$ inverter above without changing the results.

FIG. 31 shows how the equivalent resistance and the equivalent inductance change according to $C_{res}$ in a hypothetical inductive power transfer system which has a primary coil inductance of 4 μH and an optimum reflected load of 2Ω operating at 6.78 MHz.

[Experimental Verification and Results]

Experimental verification for all of the defined special cases of the Class EF$_2$ inverter have been carried out on a 23 W prototype with a switching frequency of 6.78 MHz was chosen for Cases I and II, and II a 8.60 MHz switching frequency was chosen for Case III to demonstrate its capability to operate at higher frequencies. In order to ensure a fair comparison, the same MOSFET, load resistance and inductance $L_3$ were used when verifying all of the special cases.

[Experimental Set-Up]

The inductance of the MOSFET's package should be as small as possible to allow for the megahertz switching frequencies to be achieved and to allow for 'clean' voltage waveforms to be recorded. In addition, the MOSFET's total gate charge should be reasonably low to reduce gate drive losses. Finally, the MOSFET's output capacitance should be as low as possible, ideally below 500 pF at a certain input voltage. This is important to firstly prevent the MOSFET's output capacitance from achieving the desired switching frequencies and secondly, to reduce the effect of the non-linearity of the MOSFET's output capacitance on the performance of the inverter. The MOSFET SiS892ADN 100V, 28 A from Vishay which is available in a surface mount 1212 package was found to be suitable. It's maximum ON resistance is 0.047Ω and has a maximum input capacitance of approximately 850 pF. Its output capacitance is below 400 pF for DC drain voltages above 16V. The gate driver UCC$_2$7321 from Texas Instruments was used and a maximum gate drive voltage of 7.0V was set for all cases.

All the capacitors used were multilayer ceramic capacitors from AVX Corporation. The capacitors belong to the manufacturer's 'Hi-Q' series and are designed for RF and microwave applications. Their ESR is below 0.04Ω for frequencies below 30 MHz. Inductance $L_3$ had to be an air-core inductor to avoid the excessive power losses and saturation that are associated with using magnetic cores at high frequencies. It was formed using a coil that consisted of two turns with a diameter of approximately 15 cm and using 4 AWG copper wire. It's inductance was measured to be approximately 1.25 µH and its ESR is approximately 0.215. The load consisted of three paralleled 15Ω 35 W thick film resistors from Bourns. Each resistor had a maximum inductance of 0.1 µH. The current probe N2783A from Keysight Technologies was used to record the output current. The total inductance of the current probe and the load resistors was assumed to be 0.1 µH according to their datasheets and was added to the inductance of $L_3$. The output power was calculated using the reading of the current probe which had accuracy of about 2%.

[Maximum Power Capability Case (Case I)]

For Case I, the values of capacitors $C_1$, $C_2$ and $C_3$, in addition to all other parameters, were calculated for a switching frequency of 6.78 MHz using the design equations given in Table 2 and their values are all listed in Table 3 below. The input voltage was calculated to be 30.25V and the MOSFET's output capacitance at this voltage was deducted for the calculated value of $C_1$. Capacitors $C_2$ and $C_3$ each consisted of four parallel capacitors. The difference between the used total capacitance value of $C_2$ and the theoretical value is due to the parasitic capacitance of the PCB. The value of inductor $L_2$ was calculated to be 202.61 nH. This inductor was formed by using two paralleled 430 nH air-core inductors from Coilcraft (2929SQ series). The shape of the parallel coils were slightly altered to achieve the desired inductance. According to Eq. 50 the current in inductor $L_2$ contains several frequency components (1st, 2nd and 3rd), therefore the inductor's ESR will be different for each one of these components. For simplification, the ESRs at 6.78 MHz, 13.56 MHz and 20.34 MHz were calculated according to the manufacturer's datasheet and their average was considered as a constant ESR for the entire switching period which was equal to 0.18Ω. Adding the DC resistance of the paralleled coils and the ESR of capacitor $C_2$ makes the total ESR in the $L_2C_2$ branch approximately 0.20Ω.

Figure 32A:
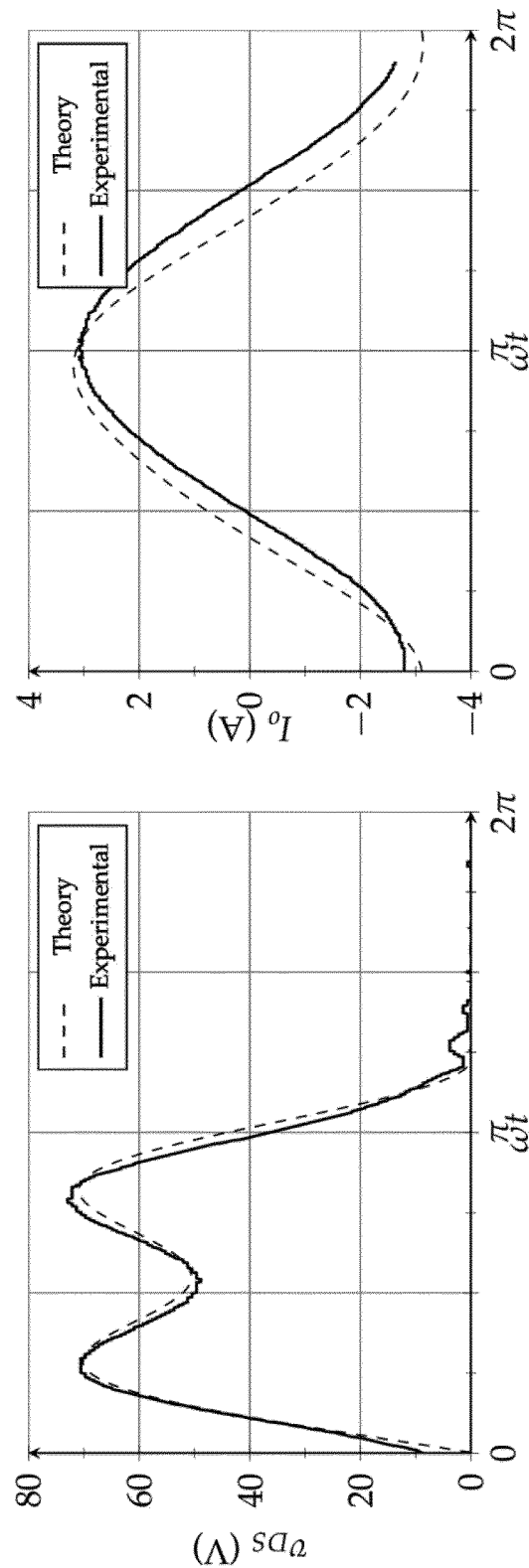

The measured input and output powers, input current and maximum MOSFET voltage are listed in Table 3 and are compared with their theoretical values. It can be noticed that error between measurements and theory is low. The recorded waveforms of the MOSFET's drain voltage and output current are shown in FIG. 32a and the theoretical waveforms are shown in comparison. It can be noticed that recorded and theoretical waveforms are a close match. The phase shift in the recorded current waveform is due to the response behaviour of the current probe. The measured efficiency for this case was 91.1±2%.

[Maximum Frequency Case (Case III)]

The verification and design process for Case III was similar to that of Case I. The switching frequency was increased to 8.60 MHz to show that this case can be operated at higher frequencies. Also, this specific frequency was chosen in order to keep the same parallel coils for inductor $L_2$ that were used in Case I. The average ESR for inductor $L_2$ was now approximately 0.25Ω.

Figure 32B:
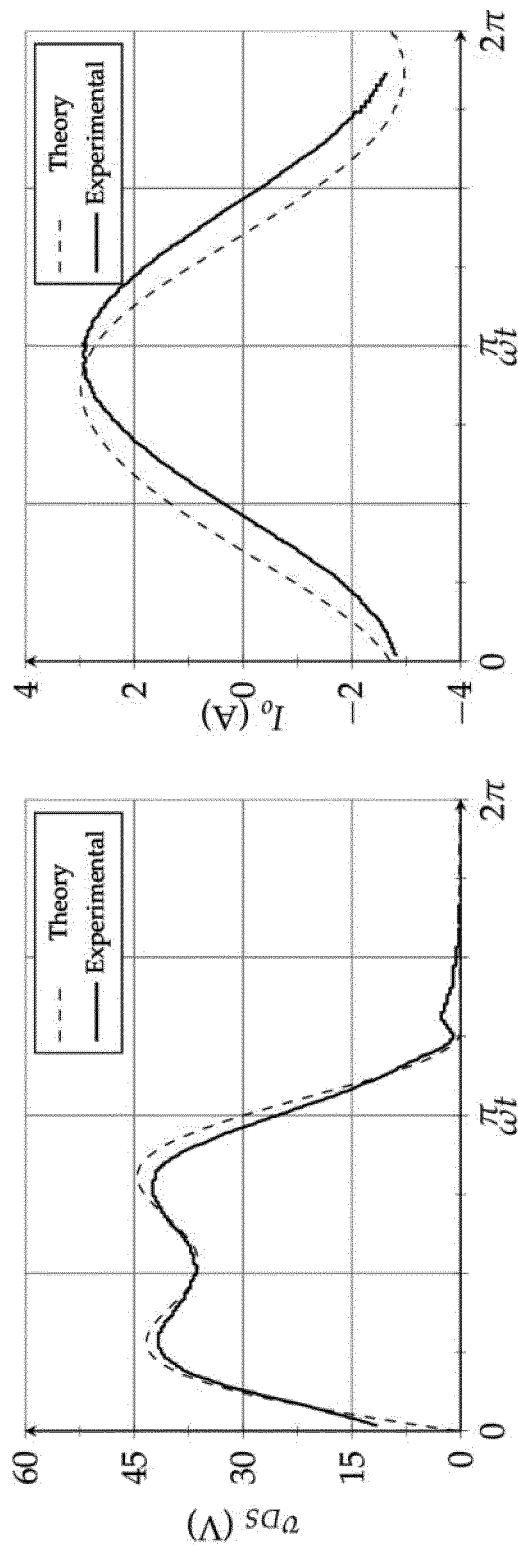

The measured input and output powers, input current and maximum MOSFET voltage for this case are listed in Table 3. The error between measurements and theory for this case are minor. The recorded waveforms of the MOSFET's drain voltage and output current are shown in FIG. 32b. and the theoretical waveforms are shown in comparison. The recorded and theoretical waveforms are a close match as well. The measured efficiency for this case was 88.6±2%.

[k=20 Case (Case II)]

Figure 32C:
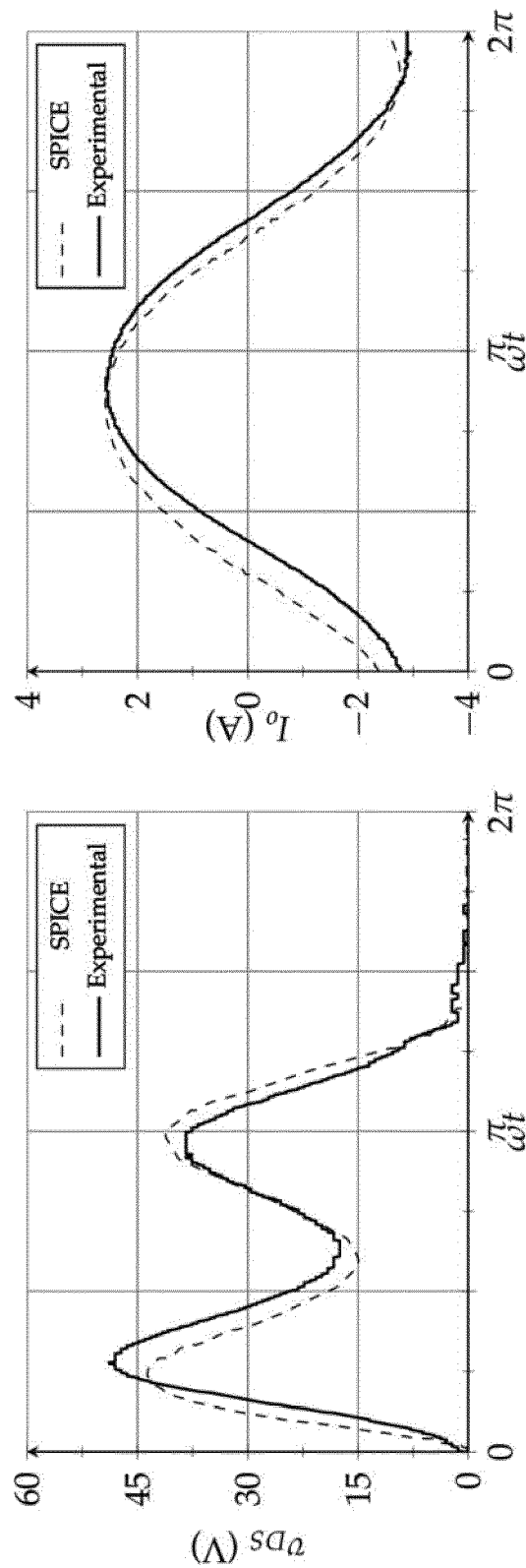
Figure 32D:
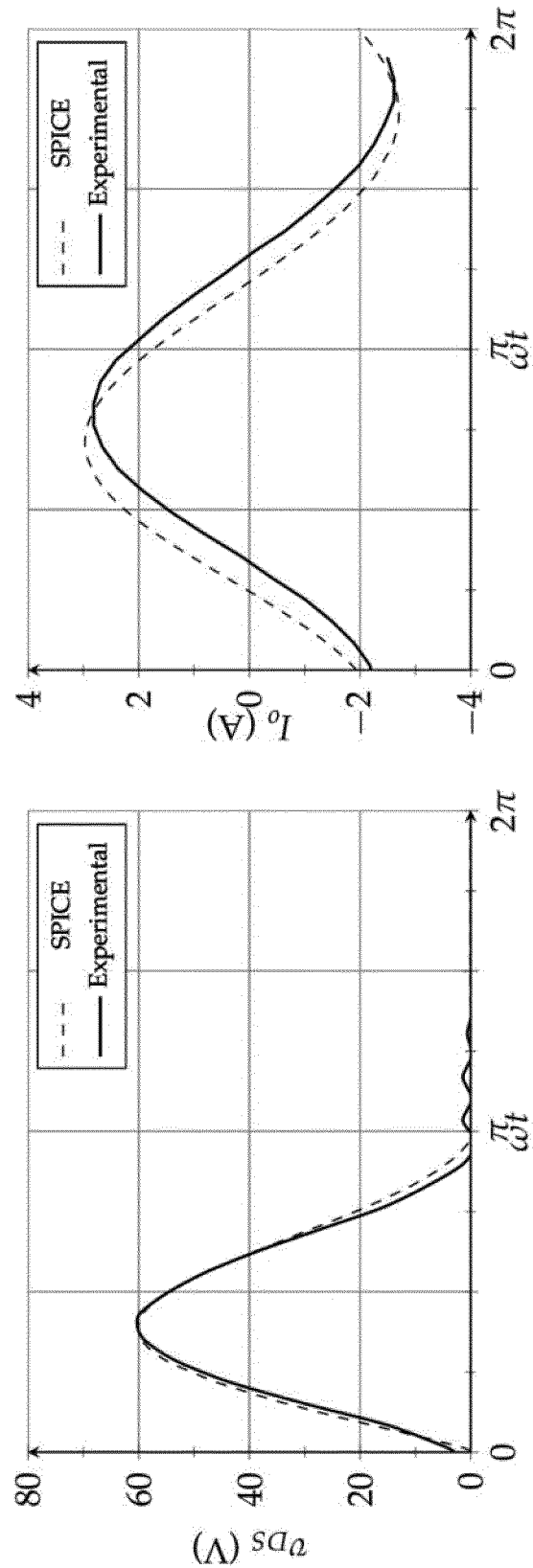
Figure 33A:
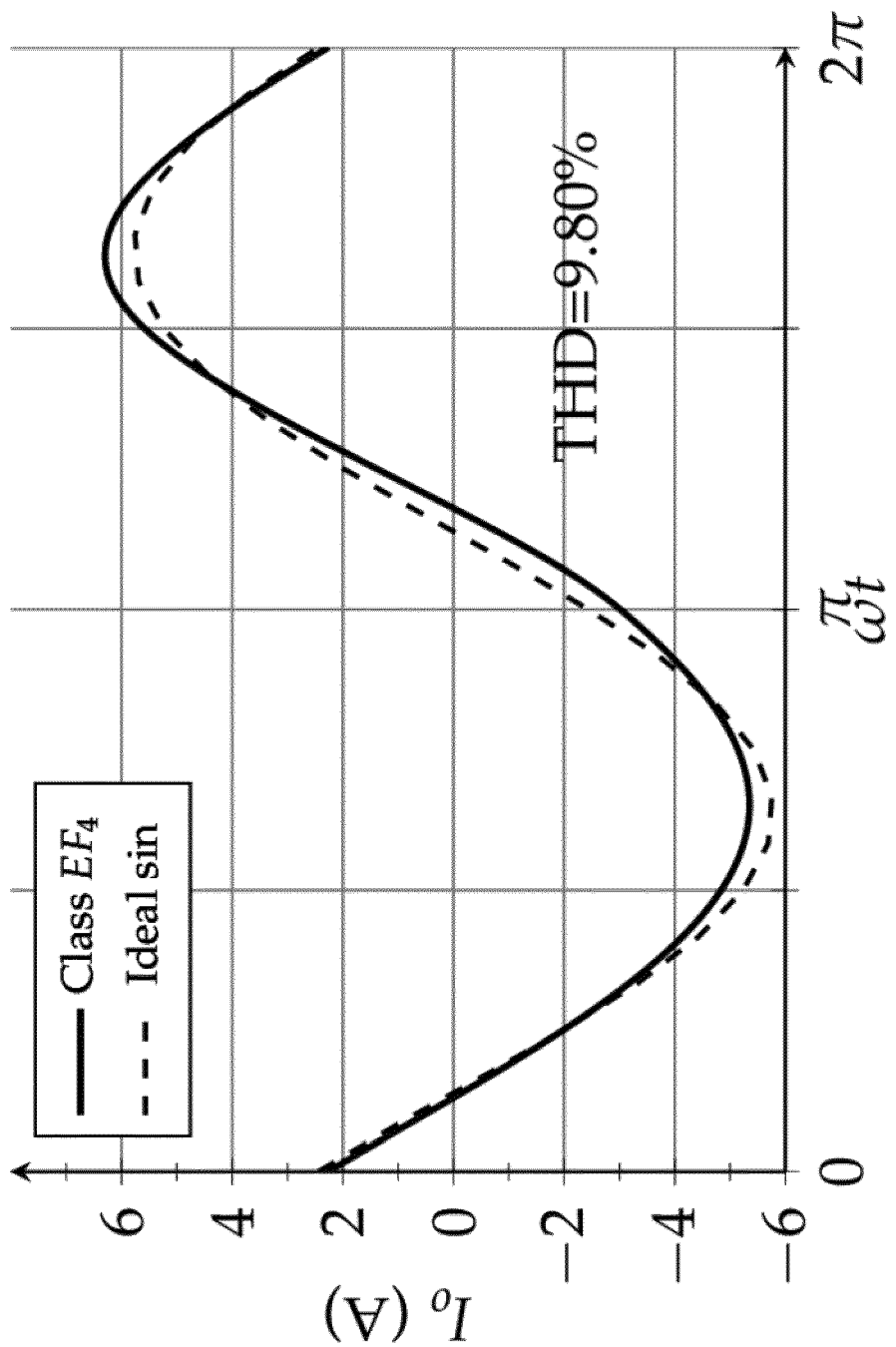
Figure 33B:
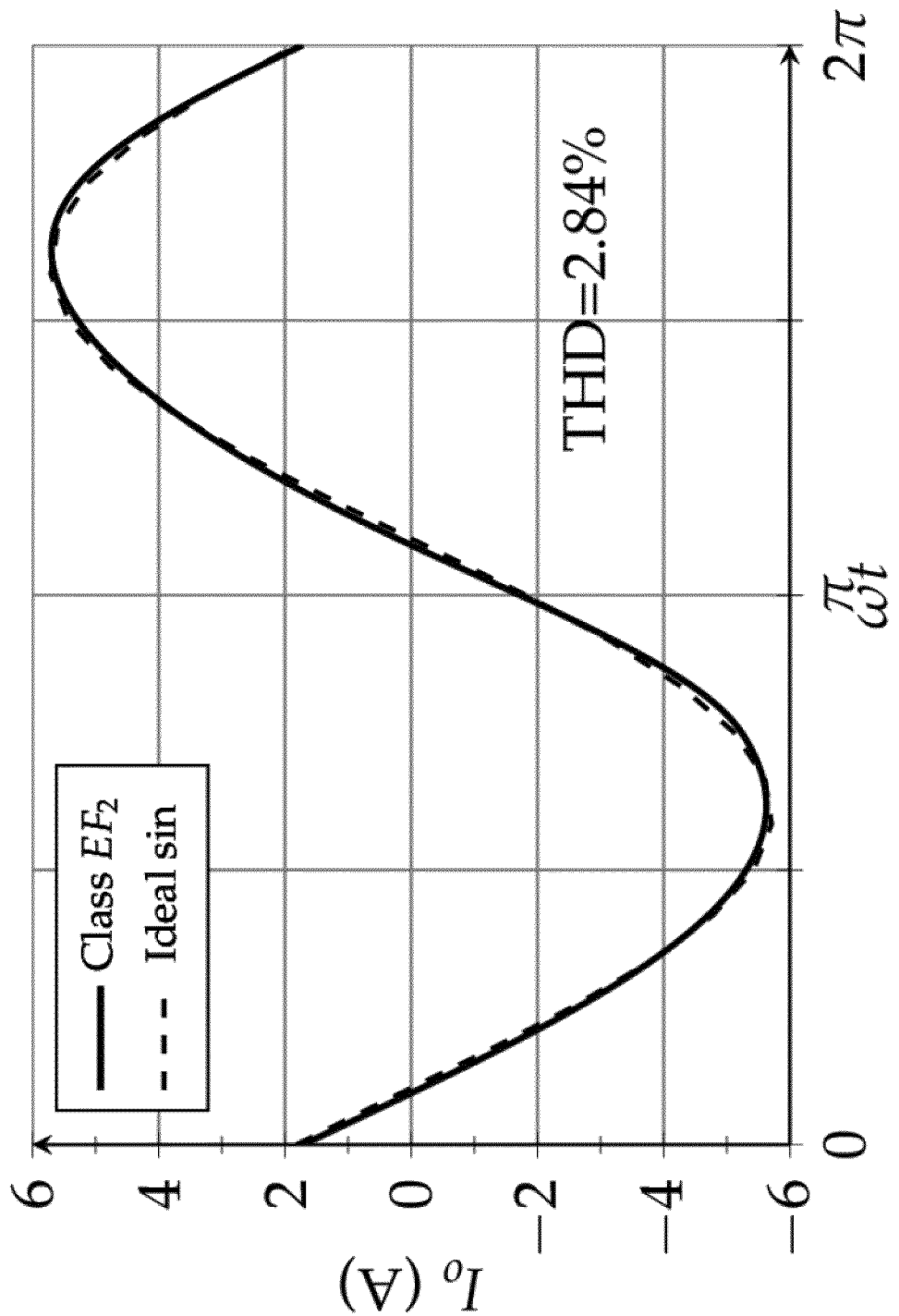
Figure 33C:
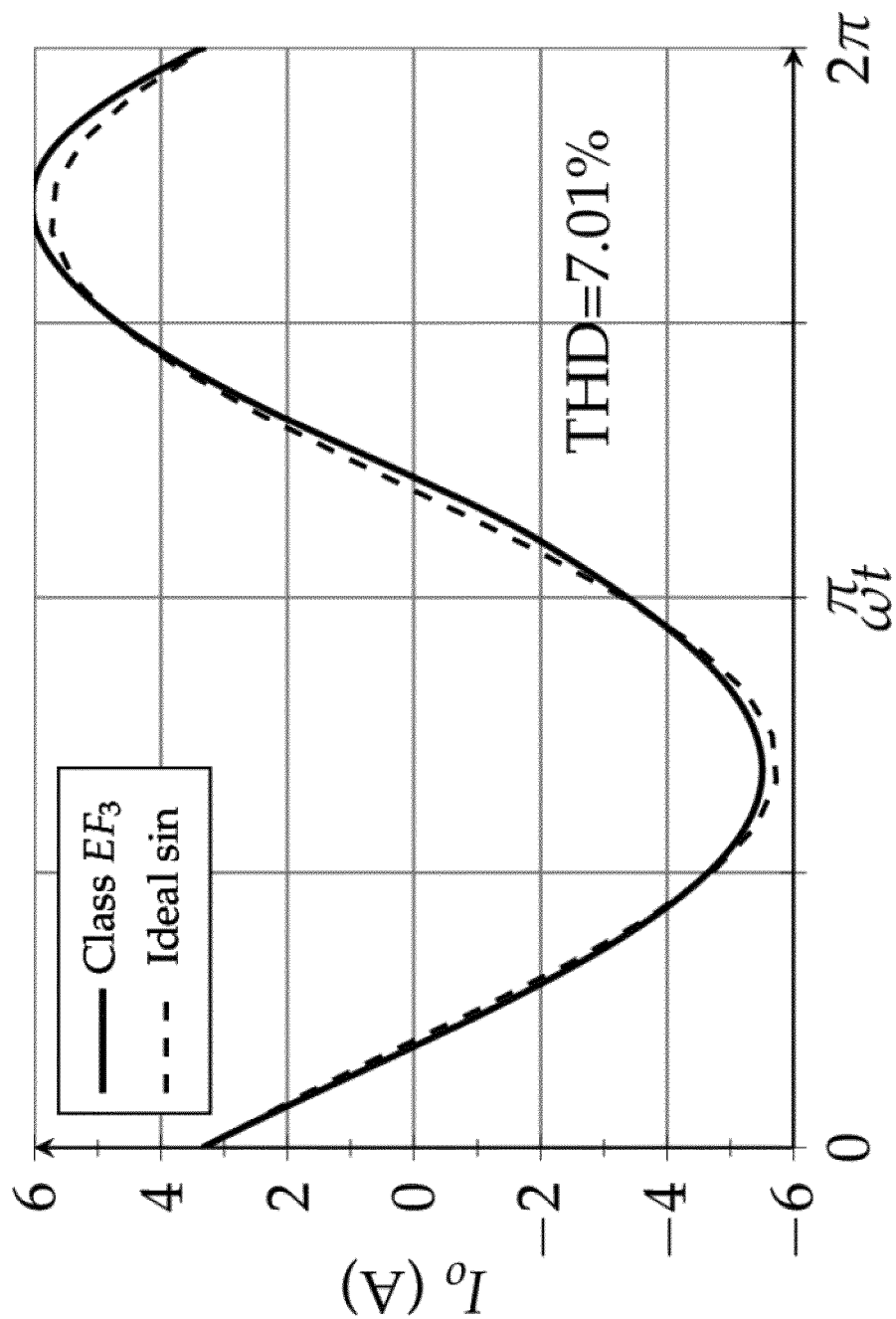
Figure 33D:
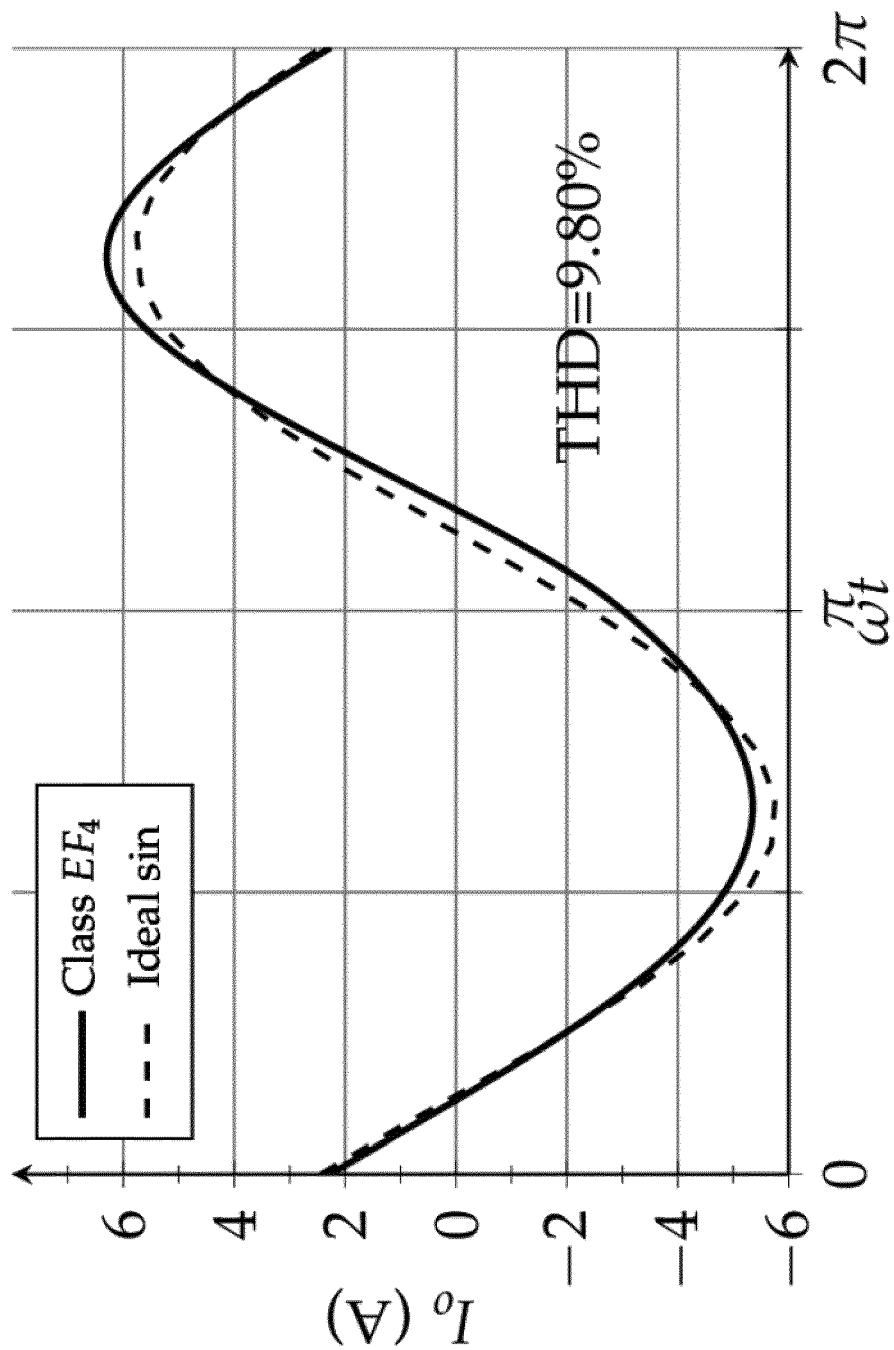

For Case II, the switching frequency was decreased back to 6.78 MHz. A k value of 20 was chosen in order to obtain the lowest inductance value for $L_2$ which was calculated to be 4.81 µH. The magnetic core T106-2 from Mircometals had to be used to achieve this inductance. The input voltage for a 23 W output power was calculated to be approximately 15.5V. Although the MOSFET's output capacitance at this voltage was below the required $C_1$ capacitance, it's non-linearity in addition to the losses and saturation of the magnetic core of inductor $L_2$ were quite significant and had an impact on inverter's performance. Therefore the SPICE model was used to verify the performance of the inverter in this case by simulating the experimental results. Table 2 compares the values of all components and the measured input and output powers, input current and maximum MOSFET voltage in comparison with those of the SPICE simulation. FIG. 32c compares between the recorded MOSFET's drain voltage and output current waveforms with the SPICE simulation. It can be noticed that the recorded waveforms are in good agreement with the SPICE simulation. The calculated efficiency was 76±2%, the low efficiency is due to the excessive losses and possible saturation in the magnetic core used for inductor $L_2$.

[Comparison with Class E Operation]

The designed Class EF inverter was then compared with a Class E inverter in order to prove that Case I and III can be more efficient. For the Class E inverter, the switching frequency was kept at 6.78 MHz. The component values, input and output powers, input current and maximum MOSFET voltage were calculated from the design equations in M. K. Kazimierczuk, RF Power Amplifiers, 2nd ed. Chichester, UK: John Wiley & Sons Ltd, 2015. The calculated input voltage was 16V and it was also found that the non-linearity of the MOSFET's output capacitance affected the performance of the inverter, therefore the SPICE model was used for verification.

The component values and measured parameters are listed in Table 3. The recorded MOSFET's drain voltage and output current waveforms shown in FIG. 32d and an excellent agreement can be seen with the SPICE simulation. The calculated efficiency was 88.7±2% which is lower than what had been achieved with Case I and is similar to what had been achieved with Case III as predicted by the theory.

TABLE 3

Theoretical and measured parameters

| Power | Class EF$_2$ Case I (max c$_p$) | | Class EF$_2$ Case II (k = 20) | | Class EF$_2$ Case III (max f) | | Class E D = 0.5 | |
|---|---|---|---|---|---|---|---|---|
| | Exp. | Theory | Exp. | SPICE | Exp. | Theory | Exp. | SPICE |
| $C_1$ (pF) | 257 + C$_o$ | 589.48 | 47 + C$_o$ | 50 + C$_o$ | 257 + C$_o$ | 619.98 | 330 + C$_o$ | 220 + C$_o$ |
| $C_2$ (pF) | 667 | 679.92 | 29.30 | 28.66 | 392 | 395.65 | — | — |
| $C_3$ (pF) | 500 | 501.24 | 419.20 | 430.37 | 268 | 275.86 | 447 | 463 |

TABLE 3-continued

Theoretical and measured parameters

| | Class $EF_2$ Case I (max $c_p$) | | Class $EF_2$ Case II (k = 20) | | Class $EF_2$ Case III (max f) | | Class E D = 0.5 | |
|---|---|---|---|---|---|---|---|---|
| Power | Exp. | Theory | Exp. | SPICE | Exp. | Theory | Exp. | SPICE |
| $L_1$ (µH) | 47 | 18.66 | 47 | | 47 | 6.47 | 47 | 47 |
| $L_2$ (nH) | 215 | 202.61 | 4800 | 4810 | 215 | 216.41 | — | — |
| $L_3$ (µH) | 1.35 | 1.35 | 1.35 | 1.35 | 1.35 | 1.35 | 1.35 | 1.35 |
| $R_L$ (Ω) | 5.00 | 5.00 | 5.00 | 5.00 | 5.00 | 5.00 | 5.00 | 5.00 |
| f (MHz) | 6.78 | 6.78 | 6.78 | 6.78 | 8.60 | 8.60 | 6.78 | 6.78 |
| D | — | 0.375 | — | 0.400 | — | 0.37 | — | 0.500 |
| $V_{IN}$ (V) | 30.0 | 30.25 | 17.49 | 17.50 | 20 | 20.38 | 16.0 | 16.0 |
| $I_{IN}$ (A) | 0.83 | 0.83 | 1.49 | 1.40 | 1.20 | 1.24 | 1.31 | 1.38 |
| $P_{IN}$ (W) | 24.9 | 24.97 | 26.06 | 24.55 | 24.0 | 25.15 | 20.96 | 22.08 |
| $P_o$ (W) | 22.67 | 23.00 | 19.92 | 18.70 | 21.26 | 23.00 | 18.59 | 20.00 |
| η (%) | 91.1 ± 2 | 92.11 | 76.44 ± 2 | 76.17 | 88.6 ± 2 | 91.03 | 88.7 ± 2 | 90.6 |
| $v_{DS\,max}$ | 72 | 70.06 | 48.80 | 42.26 | 42.90 | 44.87 | 60.1 | 60.1 |

CONCLUSION

The analysis above shows that the following conclusions can be made regarding the Class EF2 inverter:
1. The peak voltage across the MOSFET is about 2.2-2.3 times the input DC voltage compared to about 3.56 times the input DC voltage for the Class E inverter.
2. Class EF2 inverters in all special cases have a higher power output capability than Class E and Class D inverters. Their optimum duty cycle range is between 0.35-0.40 compared to a single optimum value of 0.50 for the Class E inverter.
3. It was shown that Class EF2 inverters can operate more efficiently with a low energy storage, or low Q, series resonant LC network especially at high frequencies. This is because air-core inductors can be used which can be easily designed to have low losses compared to a magnetic-core based inductor.
4. The maximum frequency of operation of the Class EF2 inverter, as defined in Case III, is slightly less than that of Class E inverters.
5. The power dissipation in the MOSFET's resistance is lower than that of the Class E inverter. This makes special Cases I and III of the Class EF2 inverter more efficient than Class E inverters especially for MOSFETs with ON resistances above 0.04Ω. The efficiency improvement becomes less significant for MOSFETs with very low ON resistances where the Class E inverter might be a better design choice because of its lower number of components.
6. For a given load resistance and required output power, the input voltage required for Cases I and III of the Class EF2 is higher than that of the Class E inverter. A higher input voltage might be beneficial because the input DC current and ripple will be lower, and the MOSFET's non-linear output capacitance will have a lower impact of the inverter's performance as observed in the experimental results section.
7. Special Case II, the Class EF2 can deliver more power to a load compared to the Class E, however the efficiency will be lower due to the increased losses in the added resonant network.

The foregoing description of embodiments of the invention has been presented for the purpose of illustration and description. It is not intended to be exhaustive or to limit the invention to the precise form disclosed. Alternations, modifications and variations can be made without departing from the spirit and scope of the present invention.

The invention claimed is:

1. An inverter for inductive power transfer, the inverter comprising:
   a first inductor and a switching element in series between power supply terminals, the switching element being operable to be switched at a first frequency;
   a first capacitance in parallel with the switching element between the first inductor and a power supply terminal;
   a first tank circuit in parallel with the first capacitance, the first tank circuit comprising a second inductor and a second capacitance, wherein the second capacitance is arranged in series with the second inductor;
   a second tank circuit in parallel with the first capacitance; and
   a third capacitance in series with the first inductor between the first tank circuit and the second tank circuit,
   wherein the second tank circuit comprises a transmitter coil and a fourth capacitance, the fourth capacitance being arranged in parallel or series with the transmitter coil;
   wherein the fourth capacitance is selected such that the resonant frequency of the second tank circuit is not equal to the first frequency, and
   wherein the second inductor and the second capacitance are selected such that the resonant frequency of the first tank circuit is an integer multiple, greater than one, of the first frequency.

2. The inverter according to claim 1, wherein the second inductor and the second capacitance are selected such that the resonant frequency of the first tank circuit is double or triple the first frequency.

3. The inverter according to claim 1, wherein the fourth capacitance is arranged in parallel with the transmitter coil, and wherein the fourth capacitance is selected such that the resonant frequency of the second tank circuit is greater than the first frequency.

4. The inverter according to claim 1, wherein the fourth capacitance is arranged in series with the transmitter coil, and wherein the fourth capacitance is selected such that the resonant frequency of the second tank circuit is less than the first frequency.

5. The inverter according to any of claim 1, wherein the first capacitance is part of the output capacitance of the switching element.

6. An inductive power transfer transmitter comprising:
an inverter according to claim 1; and
a controller operable to switch the switching element of the inverter at the first frequency.

7. The inductive power transfer transmitter according to claim 6, wherein:
the second inductor and the second capacitance are selected such that the resonant frequency of the first tank circuit is double the first frequency,
the ratio of the first capacitance to the second capacitance is greater than or equal to 0.7 and less than or equal to 1, and
the controller is arranged to switch the switching element with a duty cycle greater than or equal to 0.35 and less than or equal to 0.40.

8. The inductive power transfer transmitter according to claim 7, wherein:
the ratio of the first capacitance to the second capacitance is greater than or equal to 0.8 and less than or equal to 1, and
the controller is arranged to switch the switching element with a duty cycle greater than or equal to 0.35 and less than or equal to 0.40.

9. The inductive power transfer transmitter according to claim 6, wherein:
the second inductor and the second capacitance are selected such that the resonant frequency of the first tank circuit is double the first frequency,
the ratio of the first capacitance to the second capacitance is greater than or equal to 1 and less than or equal to 5, and
the controller is arranged to switch the switching element with a duty cycle greater than or equal to 0.35 and less than or equal to 0.40.

10. The inductive power transfer transmitter according to claim 9, wherein:
the ratio of the first capacitance to the second capacitance is greater than 1.2 and less than 3.7,
the controller is arranged to switch the switching element with a duty cycle greater than or equal to 0.35 and less than or equal to 0.40.

11. The inductive power transfer transmitter according to claim 6, wherein:
the second inductor and the second capacitance are selected such that the resonant frequency of the first tank circuit is double the first frequency,
the ratio of the first capacitance to the second capacitance is greater than or equal to 20, and
the controller is arranged to switch the switching element with a duty cycle greater than or equal to 0.35 and less than or equal to 0.40.

12. An inductive power transfer system comprising:
an inductive power transfer transmitter according to claim 6; and
an inductive power transfer receiver comprising a receiver coil spaced apart from the transmitter coil of the inductive power transfer transmitter.

13. A method for inductive power transfer, comprising:
providing an inverter comprising a first inductor and a switching element in series between power supply terminals, the switching element being operable to be switched at a first frequency; a first capacitance in parallel with the switching element between the first inductor and a power supply terminal; a first tank circuit in parallel with the first capacitance, the first tank circuit comprising a second inductor and a second capacitance, wherein the second capacitance is arranged in series with the second inductor; a second tank circuit in parallel with the first capacitance; and a third capacitance in series with the first inductor between the first tank circuit and the second tank circuit, wherein the second tank circuit comprises a transmitter coil and a fourth capacitance, the fourth capacitance being arranged in parallel or series with the transmitter coil; wherein the fourth capacitance is selected such that the resonant frequency of the second tank circuit is not equal to the first frequency; and wherein the second inductor and the second capacitance are selected such that the resonant frequency of the first tank circuit is double the first frequency; and wherein the ratio of the first capacitance to the second capacitance is greater than or equal to 0.7 and less than or equal to 1; and
switching the switching element at the first frequency with a duty cycle greater than or equal to 0.35 and less than or equal to 0.40.

14. The method according to claim 13, wherein:
the ratio of the first capacitance to the second capacitance is greater than or equal to 0.8 and less than or equal to 1.0, and
the switching element is switched with a duty cycle greater than or equal to 0.35 and less than or equal to 0.40.

15. The method according to claim 14, wherein:
the ratio of the first capacitance to the second capacitance is greater than or equal to 0.767 and less than or equal to 0.967, and
the switching element is switched with a duty cycle greater than or equal to 0.365 and less than or equal to 0.385.

16. The method according to claim 15, wherein the ratio of the first capacitance to the second capacitance is 0.867, and the switching element is switched with a duty cycle of 0.375.

17. A method for inductive power transfer, comprising:
providing an inverter comprising a first inductor and a switching element in series between power supply terminals, the switching element being operable to be switched at a first frequency; a first capacitance in parallel with the switching element between the first inductor and a power supply terminal; a first tank circuit in parallel with the first capacitance, the first tank circuit comprising a second inductor and a second capacitance, wherein the second capacitance is arranged in series with the second inductor; a second tank circuit in parallel with the first capacitance; and a third capacitance in series with the first inductor between the first tank circuit and the second tank circuit, wherein the second tank circuit comprises a transmitter coil and a fourth capacitance, the fourth capacitance being arranged in parallel or series with the transmitter coil; wherein the fourth capacitance is selected such that the resonant frequency of the second tank circuit is not equal to the first frequency; and wherein the second inductor and the second capacitance are selected such that the resonant frequency of the first tank circuit is double the first frequency; and wherein the ratio of the first capacitance to the second capacitance is greater than 1 and less than 5; and
switching the switching element at the first frequency with a duty cycle greater than 0.35 and less than 0.40.

18. The method according to claim 17, wherein:
the ratio of the first capacitance to the second capacitance is greater than 1.2 and less than 3.7, and the switching element is switched with a duty cycle greater than 0.35 and less than 0.40.

19. The method according to claim 18, wherein the ratio of the first capacitance to the second capacitance is 1.567, and the switching element is switched with a duty cycle of 0.3718.

20. A method for inductive power transfer, comprising:
providing an inverter comprising a first inductor and a switching element in series between power supply terminals, the switching element being operable to be switched at a first frequency; a first capacitance in parallel with the switching element between the first inductor and a power supply terminal; a first tank circuit in parallel with the first capacitance, inductor and a the first tank circuit comprising a second second capacitance, wherein the second capacitance is arranged in series with the second inductor; a second tank circuit in parallel with the first capacitance; and a third capacitance in series with the first inductor between the first tank circuit and the second tank circuit, wherein the second tank circuit comprises a transmitter coil and a fourth capacitance, the fourth capacitance being arranged in parallel or series with the transmitter coil; wherein the fourth capacitance is selected such that the resonant frequency of the second tank circuit is not equal to the first frequency; and wherein the second inductor and the second capacitance are selected such that the resonant frequency of the first tank circuit is double the first frequency; and wherein the ratio of the first capacitance to the second capacitance is greater than or equal to 20;
switching the switching element at the first frequency with a duty cycle greater than or equal to 0.35 and less than or equal to 0.40.

* * * * *